United States Patent
Kawada et al.

(10) Patent No.: US 6,407,508 B1
(45) Date of Patent: Jun. 18, 2002

(54) DRIVER IC PACKAGING MODULE AND FLAT DISPLAY DEVICE USING THE SAME

(75) Inventors: Toyoshi Kawada, Kanagawa; Masami Aoki, Tokyo; Norio Matsumoto, Kanagawa; Morimitsu Iwai, Miyazaki, all of (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/552,156

(22) Filed: Apr. 14, 2000

(30) Foreign Application Priority Data

Jun. 30, 1999 (JP) ............................................ 11-186373

(51) Int. Cl.[7] ................................................ G09G 3/10
(52) U.S. Cl. ...................... 315/169.3; 257/668; 345/205
(58) Field of Search ........................... 315/169.3, 169.2; 345/45, 205, 60, 76, 80; 257/503, 668; 438/26, 121

(56) References Cited

U.S. PATENT DOCUMENTS

| 5,661,343 A | * | 8/1997 | Takahashi et al. | ........... 257/668 |
| 5,754,171 A | * | 5/1998 | Stoller | ......................... 345/205 |
| 5,763,940 A | * | 6/1998 | Shibusawa et al. | .......... 257/668 |
| 5,936,850 A | * | 8/1999 | Takahashi et al. | ........... 361/784 |

FOREIGN PATENT DOCUMENTS

JP 10-260641 9/1998

* cited by examiner

Primary Examiner—Don Wong
Assistant Examiner—Thuy Vinh Tran
(74) Attorney, Agent, or Firm—Staas & Halsey LLP

(57) ABSTRACT

The present invention relates to a driver IC packaging module and a parallel plate type display device incorporating the same, and a chassis structure for an IC module having a high heat radiation effect or a flat display device having a high heat radiation efficiency can be achieved. There is provided a driver IC packaging module which comprises a driver IC chip 10 for driving a display electrode 5a of the flat display panel 5, a substrate 11 on which the driver IC chip 10 is mounted, a flexible substrate 12 having output wirings on one end of which connection terminals are provided and on the other end of which output terminals are provided so as to connect electrically at least the display electrode 5a and output pads 10a of the driver IC chip 10, and a structure in which the output pads 10a of the driver IC chip 10 and the connection terminals of the flexible substrate 12 are connected directly and also a direction of exposed surfaces of the output terminals of the flexible substrate 12 connected to the display electrode 5a and a direction of a driver IC chip 10 mounting surface on the substrate 11 are directed oppositely.

32 Claims, 43 Drawing Sheets

COB Structure

COM Structure

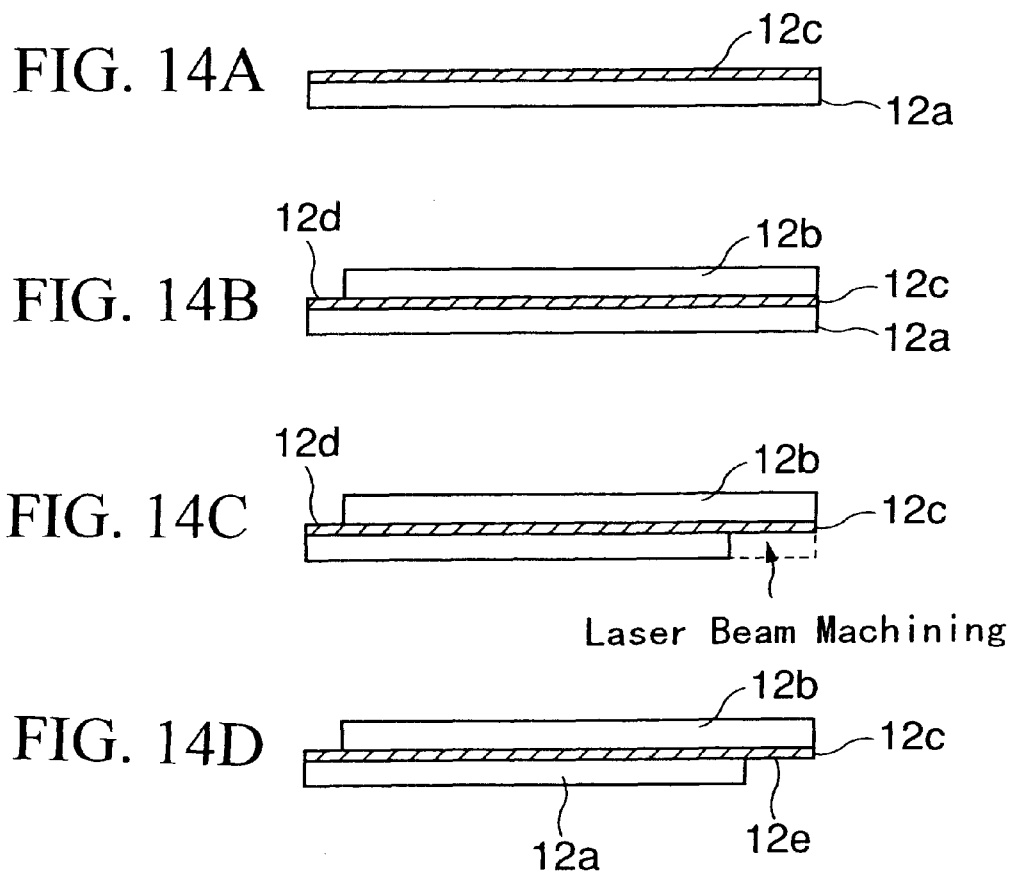

DRIVER IC PACKAGING MODULE AND FLAT DISPLAY DEVICE USING THE SAME

BACKGROUND OF THE INVENTION

1. Field of the Invention

The present invention relates to a driver IC packaging module and a flat display device using the same.

2. Description of the Prior Art

The progress in development of the display device using the flat display panel has been notable, in recent years. In particular, since the AC PDP (Plasma Display Panel) device with the triple-electrode surface discharge structure can easily fabricated as the large-area color display panel, practical implementation and application of the AC PDP make progress in the field of the large size television, etc.

FIG. 1 is a schematic plan view showing the AC PDP device with the triple-electrode surface discharge structure and a block diagram showing a driver circuit therein. FIG. 2 is a sectional view showing display cells in the AC PDP device.

In the AC PDP panel, a front glass substrate 101 and a rear glass substrate 102 are arranged at a distance to oppose to each other.

A plurality of display sustaining electrodes made of transparent conductive material are formed in parallel on an opposing surface of the front glass substrate 101 opposing to the rear glass substrate 102. The sustaining electrodes consist of X electrodes $x_n$ (n is an integer) and Y electrodes $y_n$ (n is an integer), which are arranged alternatively. The sustaining voltage is applied to the X electrode $x_n$ and the Y electrode $y_n$ which partition one luminous displayed cell area 103.

Also, a plurality of address electrodes $a_m$ (m is integer) are arranged on an opposing surface of the rear glass substrate 102 opposing to the front glass substrate 101 so as to intersect orthogonally with the sustaining electrodes $x_n$, $y_n$. A space in which one address electrode am is intersected with a set of sustaining electrodes $x_n$, $y_n$ constitutes a single display cell 103. Depending upon whether or not the address voltage is applied selectively to these address electrodes $a_m$, either display or non-display of the display cell 103 can be selected.

The sustaining electrodes $x_n$, $y_n$ are covered with a protection film 104, and the address electrodes $a_m$ is covered with a dielectric film 105. Insulating partitions 106 are formed on respective areas of the dielectric film 105 on both sides of the address electrodes $a_m$. Red, green, or blue fluorescent material 107 is coated on a surface of the dielectric film 105 between the partitions 106.

In this case, an inter-opposing electrode capacitance Cg is present between the address electrode am and the sustaining electrodes $x_n$, $y_n$, and an inter-neighboring electrode capacitance Ca is present between the address electrodes $a_m$.

As shown in FIG. 1, principal portions of the AC PDP driver circuit comprises an address driver circuit 111 for driving the address electrodes $a_m$, a scanning driver circuit 112 for driving and scanning the Y electrodes $y_n$ independently, a Y common driver circuit 113 for applying the sustaining voltage to the Y electrodes $y_n$ via the scanning driver circuit 112, an X common driver circuit 114 for applying the sustaining voltage to the X electrodes $x_n$ and, a controller circuit 115 for controlling these driver circuits 111 to 114.

The controller circuit 115 comprises a display data controller 116 for driving the address driver circuit 111 based on a clock signal CLK an d display data D supplied from external devices, a scanning driver controller 117 for driving the scanning driver circuit 112 in accordance with the horizontal synchronizing signal $H_{sync}$ and the vertical synchronizing signal $V_{sync}$ supplied from external devices and, a common driver controller 118 for driving the X common driver circuit 114 and the Y common driver circuit 113 in accordance with the horizontal synchronizing signal $H_{sync}$ and the vertical synchronizing signal $V_{sync}$ being input from external devices. The display data controller 116 has a frame memory 119 for storing display data.

In the above circuit configuration, the scanning driver circuit 112 and the address driver circuit 111 need circuits which apply selectively a driving pulse to a plurality of Y electrodes $y_n$ and a plurality of address electrodes $a_m$. Normally, IC semiconductor devices are employed as principal circuit parts in such circuits.

For example, in the 42-inch PDP device, 480 Y electrodes $y_n$ are provided on the scanning side, and 2556 (852 pixel×3 (RGB)) address electrodes $a_m$ are provided on the address side. Thus, the drivers (driving circuits) which have output pads connected to these electrodes on a one-by-one correspondence are required.

Normally, a driver IC chip in which 64 driver elements for driving 64 electrodes are integrated is employed as such drivers.

Therefore, in most cases, 8 driver ICs are prepared for the 480 Y electrodes on the Y electrode side, and 40 driver ICs are prepared for the 2556 address electrodes on the address electrode side.

In order to incorporate a number of driver ICs into the PDP device as the driver circuits, the high density packaging technology which can provide electrical connection to a number of electrodes without fail with high reliability and can mount these small and thin driver circuits on the rear side of the display panel is requested.

For example, as shown in FIG. 3, the conventional PDP device has such a structure that a display panel 123 is stuck on one surface of a chassis 122 which is constructed by intersecting a plurality of beam members 120, 121 mutually and a plurality of driver IC chips are mounted on the other surface of the chassis 122. Each of the beam members 120, 121 is formed as a metal rod body which has a sectional shape like a hat.

As the driver IC chip packaging structure, an approach of integrating a plurality of driver IC chips on one substrate as a module and then incorporating this module into the PDP device is adopted. As such driver IC packaging module, there are the COB (Chip On Board) structure shown in FIGS. 4A and 4B or the COM (Chip On Multiple Board) structure shown in FIGS. 5A and 5B.

As shown in FIGS. 4A and 4B, the COB structure comprises a printed substrate 131, a flexible flat cable (abbreviated simply as "FFC" hereinafter) 132 which is thermocompression-bonded to one side portion of the printed substrate 131, and a flexible substrate 133 which is thermocompression-bonded to the other side portion of the printed substrate 131. Also, the COB structure has such a structure that a plurality of bare-chip driver ICs 130 are directly mounted on the printed substrate 131 and various pads (not shown) on the driver ICs 130 are connected to wirings 134, 135 on the printed substrate 131 via the wire bonding. As the pads on the driver ICs 130, there are power supply pads, input signal pads, output pads, etc.

A plurality of wirings 135 on the output side on the printed substrate 131 are connected to a plurality of wirings 136 on the flexible substrate 133 one by one by the thermocompression bonding respectively. Also, a plurality of wirings 134 on the input side on the printed substrate 131 are connected to a plurality of wirings 137 on the FFC 132 one by one by the solder respectively.

In FIG. 4B, a reference 138a denotes input signal and power supply wiring patterns of formed on a back surface of the printed substrate 131 on the input side. The wiring patterns 138a have a three-dimensional wiring structure which can distribute various wirings being input from the FFC 132 to a plurality of driver ICs 130 by utilizing through-holes or wiring patterns on the back surface of the substrate. In FIG. 4B, a reference 138b denotes a high voltage power supply pattern formed on the back surface on the output side, 138c denotes an earth pattern formed below the driver ICs 130 on the back surface, and 139 denotes a voltage power supply pattern formed on an upper surface of the printed substrate 131.

On the contrary, as shown in FIGS. 5A and 5B, the COM structure comprises a printed substrate 141, an FFC 142 which is adhered to one side portion of the printed substrate 141 by the solder, and a flexible substrate 143 which is adhered to the other side portion of the printed substrate 141. A plurality of pads on the bare chip driver ICs 140 on the output side are connected to a plurality of wirings 146 on the flexible substrate 143 one by one via the wire bonding. The input signal and power supply wiring patterns 145 on the printed substrate 141 have a three-dimensional wiring structure which can distribute various wirings being input from the FFC 142 to a plurality of driver ICs 140 by utilizing through-holes in the substrate or wiring patterns on the back surface of the substrate. One ends of these wirings 145 are connected one by one to input signal and power supply pads of respective driver ICs 140 by the wire bonding.

In FIG. 5B, a reference 148a denotes input signal an power supply wiring patterns formed on the back surface of the printed substrate 141 on the input side, 148b denotes an earth pattern formed on the back surface below the driver ICs 140, and 148c denotes high voltage power supply patterns formed on the output side of the surface of the printed substrate 141.

According to the driver IC packaging module having the COM structure, since the connection of wirings on the output side of the driver ICs via the thermocompression bonding is not needed, the COM structure can achieve the higher reliability and the higher density than the COB structure.

As described above, because of difference in the packaging configuration between the COB structure and the COM structure, the output sides of the wirings on the flexible substrates 134, 144 are exposed in the opposite direction to the upper surfaces of the printed substrates 131, 141 (fitting surfaces of the driver ICs 130, 140) in the COB structure and the COM structure.

In other words, the mounting surface of the driver ICs 130 and the exposed surface of output ends of the wirings 136 on the flexible substrate are directed in the opposite direction to each other in the COB structure, whereas the mounting surface of the driver ICs 140 and the exposed surface of output ends of the wirings 146 on the flexible substrate 143 are directed in the same direction in the COM structure.

Next, fitting of the driver IC packaging module onto a chassis 122 of the surface discharge AC PDP device will be explained hereunder.

The driver IC packaging module M1 having the COB structure shown in FIGS. 4A and 4B are secured onto the beam elements 121 of the chassis 122 by driving screws 127 via an insulating sheet 126 and the printed substrate 131 into the beam elements 121, as shown in FIG. 6, for example. In this case, since the IC chip mounting surface of the printed substrate 131 and the output terminal surfaces on the flexible substrate 133 are present oppositely, the module M1 can be fitted to be secured such that the back side of the IC chip mounting surface is directed to the panel 123. Here the printed substrate 131 may be fixed to the chassis 122 by the screws while using cylindrical bosses in place of the insulating sheet 126.

In contrast, the driver IC packaging module M2 having the COM structure shown in FIG. 5 can be fitted to secure the printed substrate 141 to top surfaces of the cylindrical bosses 124, which are fitted onto the beam member 121 of the chassis 122, as shown in FIG. 7, for example, by using screws 125. In this case, since the IC chip mounting surface of the printed substrate 141 and the exposed surfaces of the wirings 146 on the flexible substrate 143 are directed to the same direction, the IC chip mounting surface of the printed substrate 141 can be secured to direct to the panel 123.

Next, the overall circuit of the driver IC packaging module employed in the address driver circuit 111 shown in FIG. 1 will be explained simply hereunder.

As shown in FIG. 8A, the driver IC packaging module has a plurality of driver ICs 130, 140 described above, and then a high voltage power supply line $V_H$, a low voltage power supply line $V_L$, a signal line SG, and a ground voltage line GND are connected to respective input pads of the driver ICs 130, 140.

A high voltage bypass capacitor $C_H$ is connected between the high voltage power supply line $V_H$ and the ground voltage line GND, and a low voltage bypass capacitor $C_H$ is connected between the low voltage power supply line $V_L$ and the ground voltage line GND. The high voltage power supply line $V_H$, the low voltage power supply line $V_L$, the signal line SG, and the ground voltage line GND are input from wirings of the flexible flat cable (FFC), then divided into plural lines via input wirings on the substrate side, and then input into the driver ICs 130, 140 in parallel.

The signal line SG has a plurality of wirings to transmit a clock signal CLK, data D, a latch signal LATCH, and a strobe signal STB.

As shown in FIG. 8B, for example, the driver ICs 130, 140 has such a structure that a 64-bit shift register SR, a 64-bit latch L, and a 64-bit gate G are connected in series. A data signal D and a clock signal CLK are input into the 64-bit shift register SR via a signal line, and also a low voltage is applied to the 64-bit shift register SR from the low voltage power supply line $V_L$. Also, the latch signal LACH is input into the 64-bit latch L, and the strobe signal STB is input into the 64-bit gate G. Further, the ground voltage line GND is connected to the 64-bit shift register SR, the 64-bit latch L, and the 64-bit gate G respectively.

Meanwhile, output buffers $BF_1$ to $BF_{64}$ are connected to 64 output terminals of the 64-bit gate G individually. The high voltage power supply line $V_H$ and the ground voltage line GND are connected to power supply ends of these connection buffers $BF_1$ to $BF_{64}$ to supply a high voltage. A low voltage signal is input into signal input ends of the connection buffers $BF_1$ to $BF_{64}$ such that a high voltage signal is output from their output ends in response to the signal. The signal output from the output ends is sent to the address electrodes $a_m$.

In this event, in order to assure a stable operation of the driver IC packaging module shown in FIGS. 4A, 4B and 5A, 5B for a long term, a structure for suppressing heat generation of the driver IC is needed.

More particularly, in the emissive display panel such as the AC PDP device, the EL display device, etc., not only the supply of the luminescence energy to pixels but also the supply of the charge and discharge current to capacitor components of the panel is needed based on the principle operation characteristic. Therefore, there is such a tendency that the current flowing through the inside of the driver IC is increased to enhance an amount of heat generation in the driver IC itself and thus power loss in the inside is increased up to an unnegligible level.

Especially, in the 42-inch large size panel, since the number of pixels per electrode of the display panel is large, the power consumption in each driver IC is increased to enhance an amount of heat generation more and more. Hence, an appropriate configuration which can radiate effectively the generated heat to the outside to suppress the temperature rise of the driver IC per se is indispensable for the panel.

However, in the driver IC packaging module having the COM structure shown in FIGS. 5A, 5B and 7 and the fitting structure in the prior art, the heat generated in the driver IC 130 has no escape except the printed substrate 131 and thus such heat is kept between the printed substrate 131 and the frame 122. Therefore, there is a possibility that, since the temperature of the driver IC 130 itself is increased, the long-term reliability cannot be assured.

On the contrary, in the driver IC packaging module having the COB structure shown in FIGS. 4A, 4B and 6 and the fitting structure in the prior art, a part of the chassis 122 is utilized as a radiation board. It is preferable that the heat should be radiated from the driver IC 130 by providing a convex tool to the chassis 122 or bringing the back surface of the printed substrate 131 into contact to the chassis 122 directly.

However, in the driver IC packaging module having the COB structure in the prior art, since the high voltage power supply wiring and the signal line are formed on the back surface side of the printed substrate 131, it is impossible to bring the back surface of the printed substrate 131 into contact to the tool or the chassis directly and thus the insulating sheet 126 cannot be omitted.

As a result, the heat radiation from the printed substrate 131 to the chassis 122 is carried out via the insulating sheet 126. Therefore, it is the existing state that the heat radiation effect has the limit and does not come up to a level which can assure the reliability.

Further, as described above, the configuration for connecting the output side wirings on the printed substrate 131 and the wirings on the flexible substrate 133 mutually by the thermocompression bonding is indispensable for the COB structure. However, since pitches of the wirings which are arranged in great numbers on the printed substrate 131 and the flexible substrate 133 are fine, short-circuit occurs between the wirings when alignment of the opposing wirings is displaced, or defective contact due to mixture of foreign matters occurs easily. In particular, as the wiring pitch become higher definition and the wiring length becomes longer, it becomes difficult to assure the connection quality and the reliability.

SUMMARY OF THE INVENTION

It is an object of the present invention to provide a driver IC packaging module which includes an IC module having a high heat radiating effect or a chassis structure having a high heat radiating efficiency, and a flat display device using the same.

According to an aspect of the present invention, in the driver IC packaging module fitted to the flat display device, one end portion, which are connected to the display panel electrodes, of the wirings which are passed through the flexible substrate fitted to an area located in the neighborhood of one end of the driver IC chip mounting surface is exposed in the opposite direction to the driver IC chip mounting surface.

Therefore, it is possible to direct the driver IC chip mounting surface to the rear surface side and connect one end portion of the electrodes of the flexible substrate to electrodes on a front surface of the display panel by bending the flexible substrate. As a result, a structure which brings the back surface (surface opposite to the driver IC chip mounting surface) of the module substrate into contact to the surface of the chassis can be achieved easily, the chassis per se can be ready to be. utilized as the heat radiation plate for the heat generated by the substrate, and thus a structure of the flat display device which can improve the thermal characteristic of the module and can be installed compactly can be achieved.

Also, according to another aspect of the present invention, the mechanical strength can be maintained by attaching the beam-like structure to the chassis on the rear surface of the display panel or forming a part of the chassis itself as the beam-like structure, and also the substrate surface of the driver IC packaging module can come into contact into the flat plate surface of this beam-like structure. Therefore, the heat generated from the driver IC chip can be diffused to the chassis via the beam.

That is, the thermal characteristic can be improved by causing the chassis per se to have the function of radiating the heat generated by the driver IC chip, and also the built-in packaging structure whose thickness is small and whose thermal characteristic can be improved as a whole can be achieved while holding the original mechanical strength of the chassis as it is.

Especially, according to the structure in which the chassis is formed of the flat metal plate having a size to cover substantially the overall rear surface side of the panel, because the chassis is formed to have a wide area, such chassis can have the effect as the heat radiation and thermal diffusion plate for not only the heat generated by the driver IC chip but also the heat generated by the display panel and other driver circuit substrates. Therefore, the thermal characteristic of the overall device can be improved and the mechanical strength can be still maintained by attaching the beam. As a result, the thin flat display device having the sufficient mechanical strength can be achieved.

BRIEF DESCRIPTION OF THE DRAWINGS

FIGS. 14A to 14D are sectional views showing first steps of forming a flexible substrate employed in the driver IC packaging module according to the first embodiment of the present invention;

DESCRIPTION OF THE PREFERRED EMBODIMENTS

Therefore, embodiments of the present invention will be explained in detail with reference to the accompanying drawings hereinafter.

First Embodiment

Figure 9A:
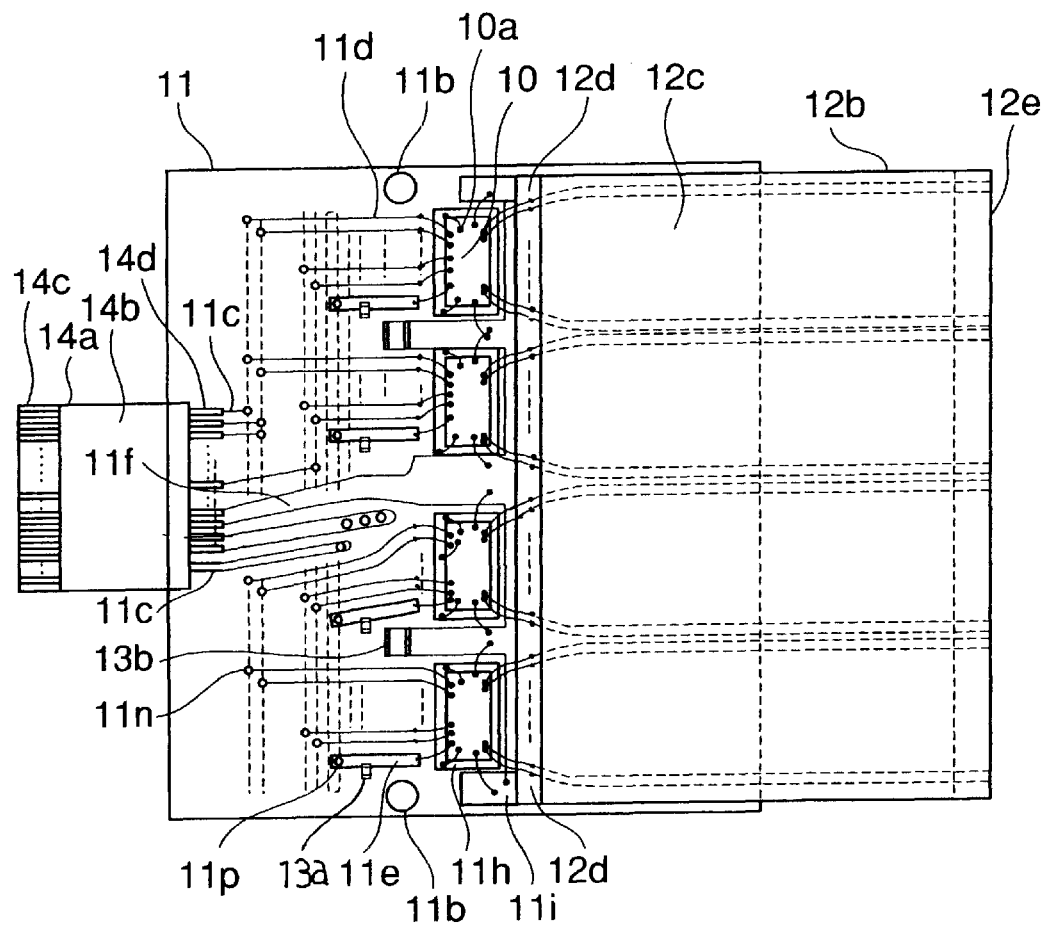
FIG. 9A is a plan view showing a first driver IC packaging module according to a first embodiment of the present invention.
Figure 9B:
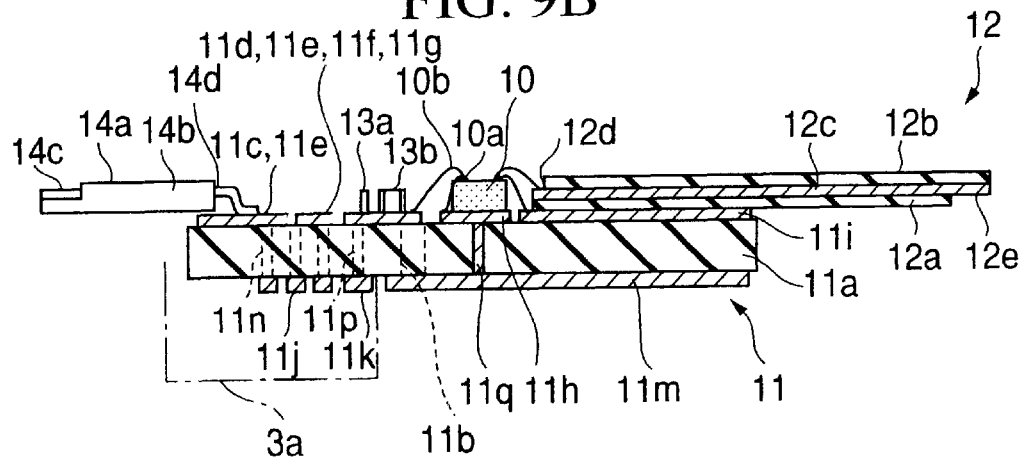
FIG. 9B is a sectional view showing the same.
Figure 10A:
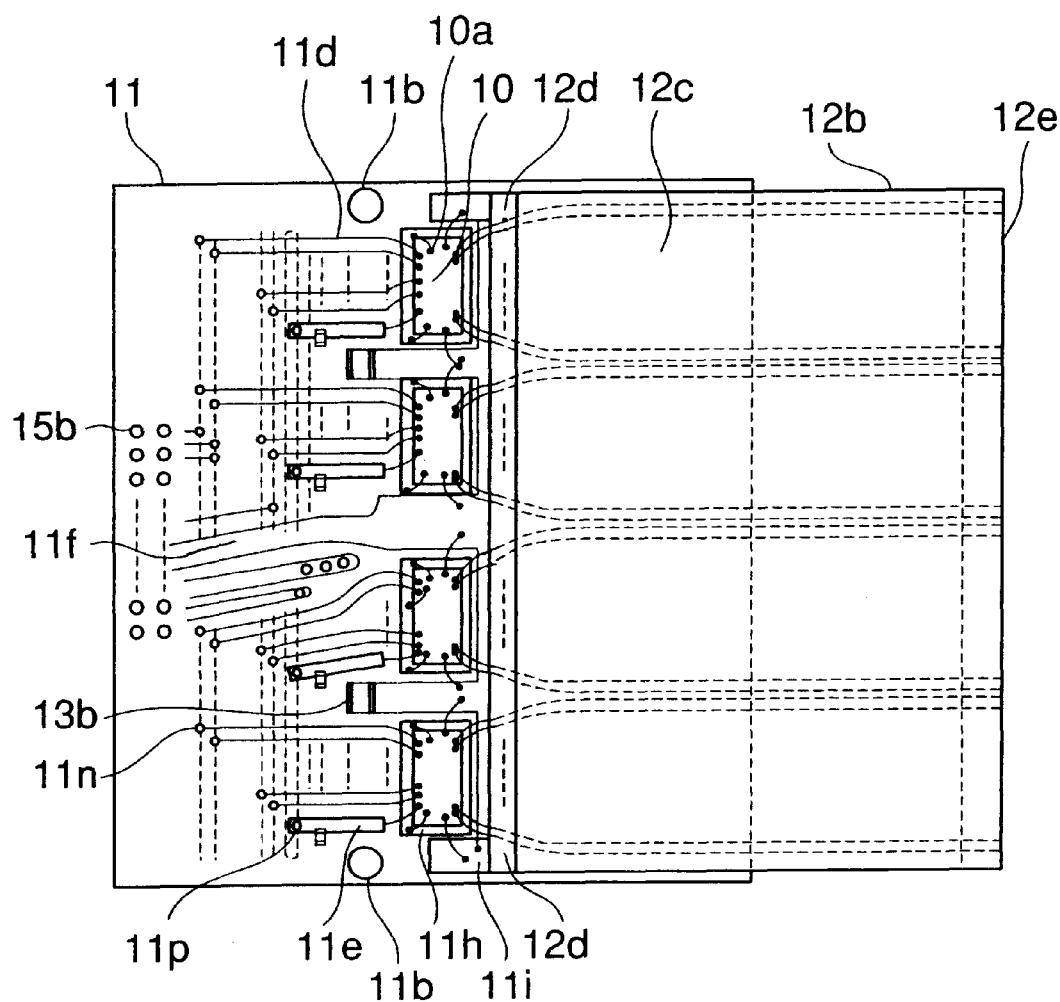
FIG. 10A is a plan view showing a second driver IC packaging module according to the first embodiment of the present invention.

FIG. 9A is a plan view showing a first driver IC packaging module according to a first embodiment of the present invention, and FIG. 9B is a sectional view showing the same. FIG. 10A is a plan view showing a second driver IC packaging module according to the first embodiment of the present invention, and FIG. 9B is a sectional view showing the same. In the driver IC packaging module described in the following, explanation will be made under the assumption that the side of the module connected to the display panel is the output side and the side connected to the device on the chassis is the input side. But these terms of the "input side" of the "output side" should not be interpreted to restrict the propagation direction of the actual signal.

First, in the module shown in FIGS. 9A and 9B, a plurality of die bonding patterns (earth patterns) 11h on which driver IC chips 10 are mounted are formed in a central area of an upper surface of the printed substrate 11 which is formed of insulating material such as glass epoxy, bakelite, etc. Also, a plurality of input terminals 11c connected to external circuits, and control input signal wirings 11d, low voltage power supply wirings 11e, high voltage power supply wirings 11f, and earth wirings 11g all being connected to the input terminals 11c are formed in an input side area of an upper surface of the printed substrate 11. In an area in the neighborhood of the input side of the driver IC chips 10, the input signal wirings 11d are formed at a pitch of several hundreds μm and the low voltage power supply wirings 11e are formed. In an area in the neighborhood of the output side, a high voltage power supply plane 11i which is connected to the high voltage power supply wirings 11f and is formed solidly.

The back surface of the driver IC chip 10 is secured to the die bonding pattern 11h, which is set to an earth potential, by conductive adhesive. Pads 10a on the driver IC chip 10 are wire-bonded to the die bonding pattern 11h, the input signal wirings 11d, the low voltage power supply wirings 11e, the high voltage power supply plane 11i, etc. via conductive lines 10b.

The die bonding pattern 11h, the input signal wirings 11d, the low voltage power supply wirings 11e, the high voltage power supply plane 11i, etc. are formed by patterning a copper foil of about 18 to 35 μm thickness respectively by virtue of the photolithography.

Cross wirings which distribute the input signal wirings 11d and the low voltage power supply wirings 11e, which are input from the input terminals 11c, to four driver IC chips 10 are formed in the input area of the printed substrate 11. The cross wirings are formed to intersect a plurality of through holes 11n, 11p and a plurality of wirings 11j, 11k formed on the lower surface and re-arrange them in the neighborhood of the input side of the driver IC chips 10 on the upper surface. An earth plane 11m is formed solidly in a wide area from a center of the lower surface of the printed substrate 11 to the output side. This earth plane 11m is connected electrically to the die bonding pattern 11h via through holes 11q which also functions as a thermal via.

On the high voltage power supply plane 11i which is formed solidly on the upper surface of the printed substrate 11, a flexible substrate 12 having a plurality of copper wirings 12c which are put between base films 12a and covering films 12b formed of insulating material such as polyester, polyimide, etc. is fitted. Output end areas 12e of the copper wirings 12c are exposed downward and input end areas 12d are exposed upward. That is, exposed surfaces of the output end areas 12e and exposed surfaces of the input end areas 12d of the wirings 12c on the flexible substrate 12 are directed oppositely mutually.

The input end areas 12d of the wirings 12c on the flexible substrate 12 and the bonding pads 10a of the driver IC chips 10 are connected mutually via the conductive lines 10b by virtue of the wire bonding method.

Chip capacitors 13a, 13b which act as bypass capacitors between the low voltage power supply wirings 11e, the high voltage power supply wirings 11f and the earth wirings 11g respectively are surface-mounted on the above input side area of the upper surface of the printed substrate 11.

Also, a plurality of output terminals of the FFC 14 are connected to the input terminals 11c of the printed substrate 11 by the soldering. The FFC 14 has an insulating covering film 14a formed of polyester, polyimide, etc. to cover the conductive lines 14b.

Fixing holes 11b are opened in the input side areas of the printed substrate 11 near both ends respectively. The printed substrate 11 can be fixed to the chassis of the display device by passing screws etc. through these fixing holes 11b.

Figure 10B:
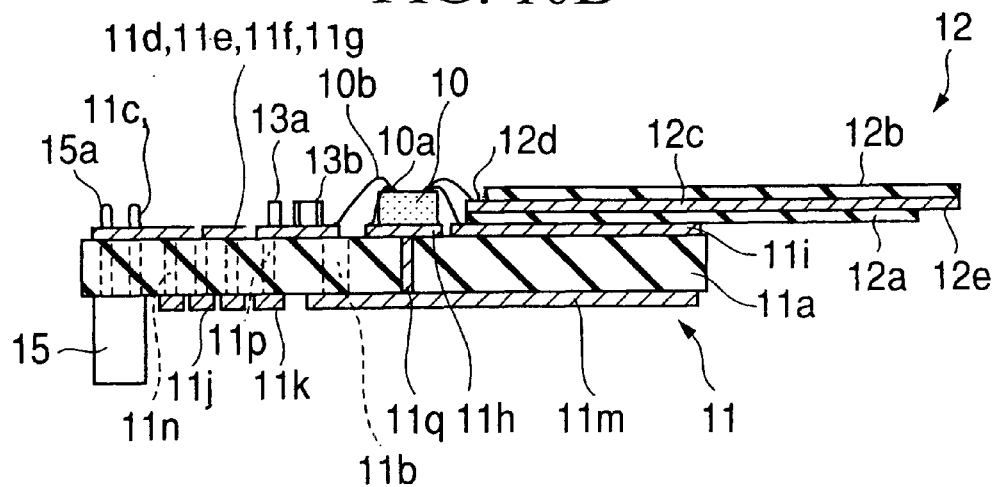
FIG. 10B is a sectional view showing the same.

Although the driver IC packaging module shown in FIG. 9 shows an example in which the FFC 14 is employed in the input portion, the connector may be employed. The case where the connectors 15 are mounted on the lower surface side of the input portion of the printed substrate 11 is shown in FIG. 10. That is, the connectors 15 are soldered to the through holes and the land portions on the upper surface side of the input area of the printed substrate 11 to project the pins 15a. Remaining configurations are similar to those in FIG. 9 and their redundant explanation will be omitted in this disclosure.

Figure 11:
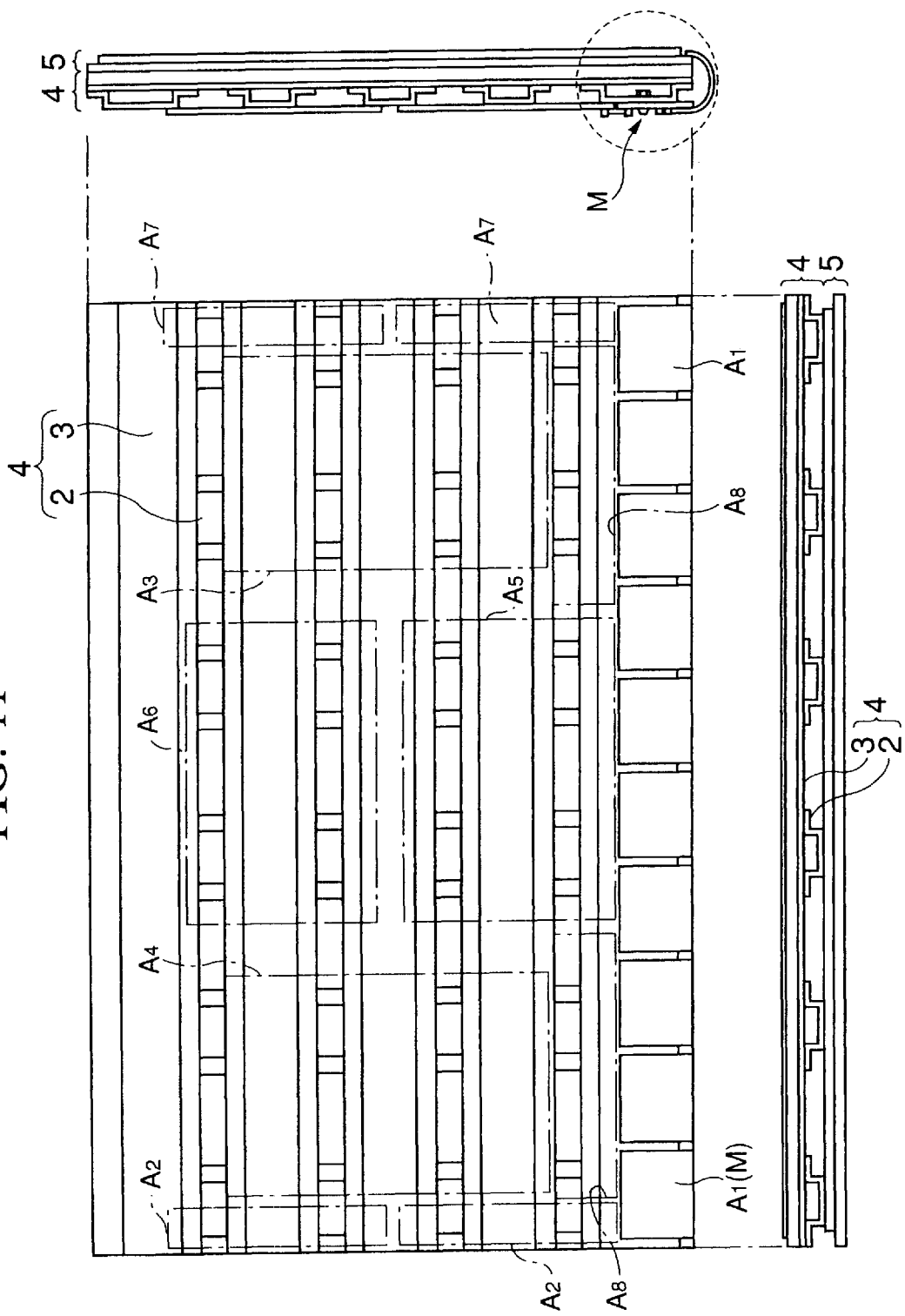
FIG. 11 is a rear view and a side view showing a display device to which the driver IC packaging module according to the first embodiment of the present invention is fitted.

The above driver IC packaging modules shown in FIGS. 9 and 10 are incorporated into the flat display device such as the PDP device shown in FIG. 11, for example.

The PDP device shown in FIG. 11 has such a structure that the back surface of the display panel 5 is stuck onto a surface of the chassis 4 which is constructed by intersecting a plurality of first beam members 2 and a plurality of second beam members 3 mutually and a plurality of driver IC packaging modules M are mounted onto the other surface of the chassis 4.

Each of the first beam members 2 and the second beam members 3 is formed of a metal rod body which has a hat-like sectional shape. Their intersecting portions are fixed by the caulking using TOX, HENROBRIVETS, etc.

Figure 1:
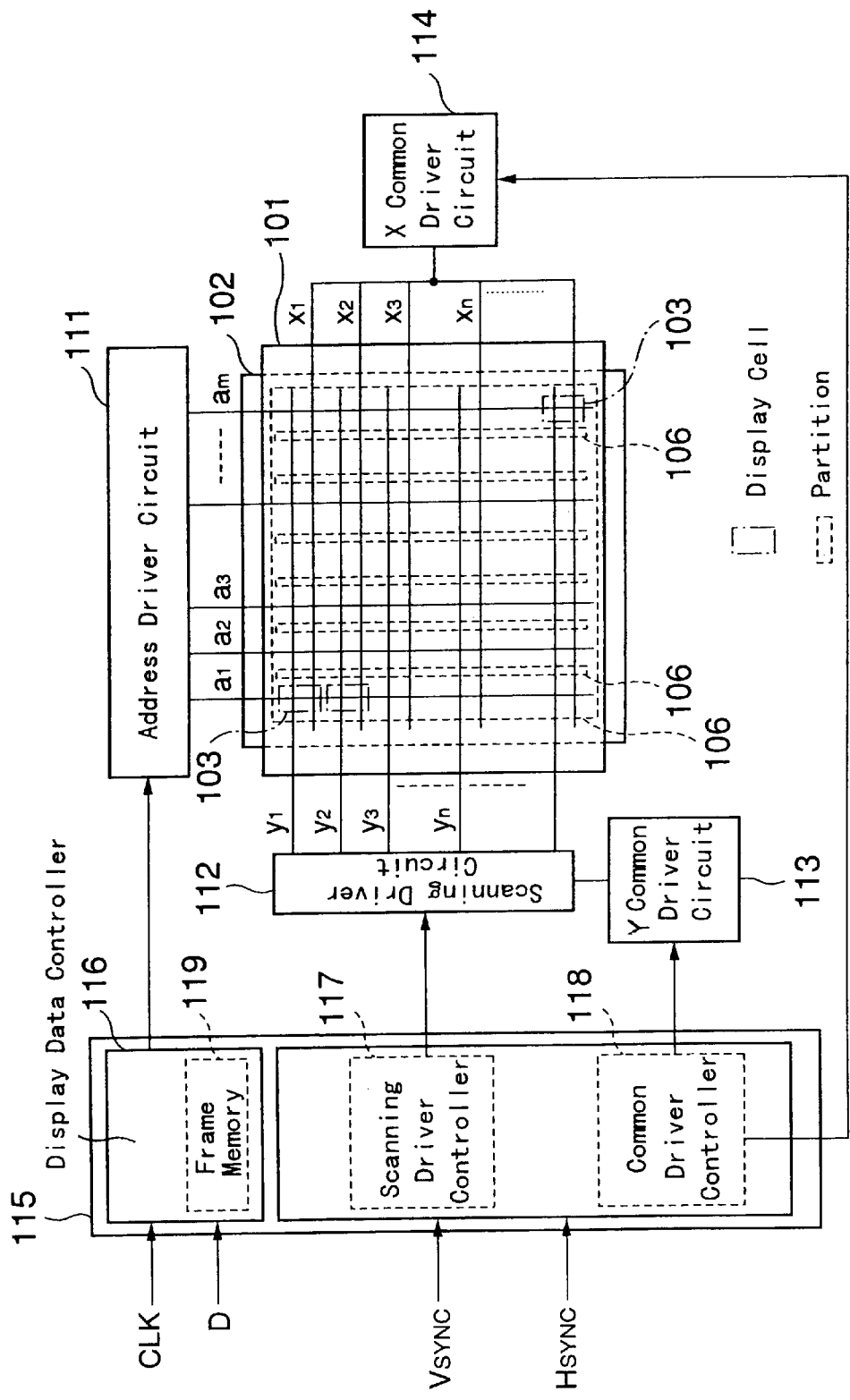
FIG. 1 is a schematic plan view showing a normal AC PDP device and a block diagram showing a driver circuit therein.
Figure 2:
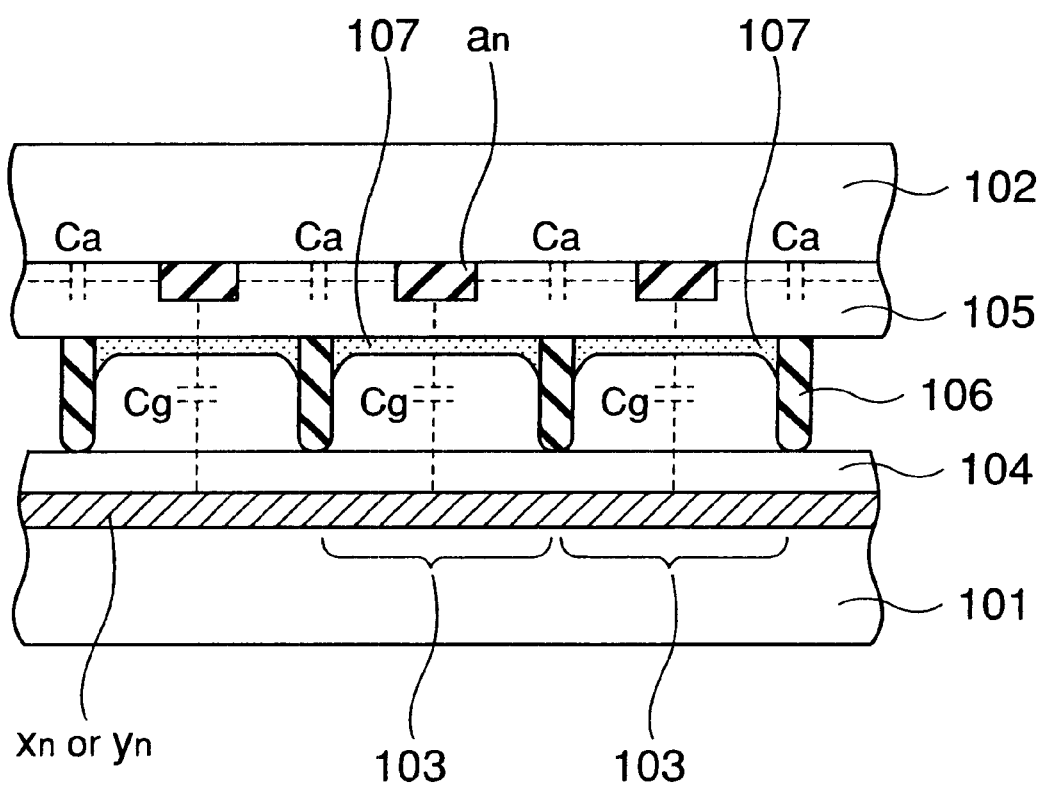
FIG. 2 is a sectional view showing cells in the normal AC PDP device.
Figure 3:
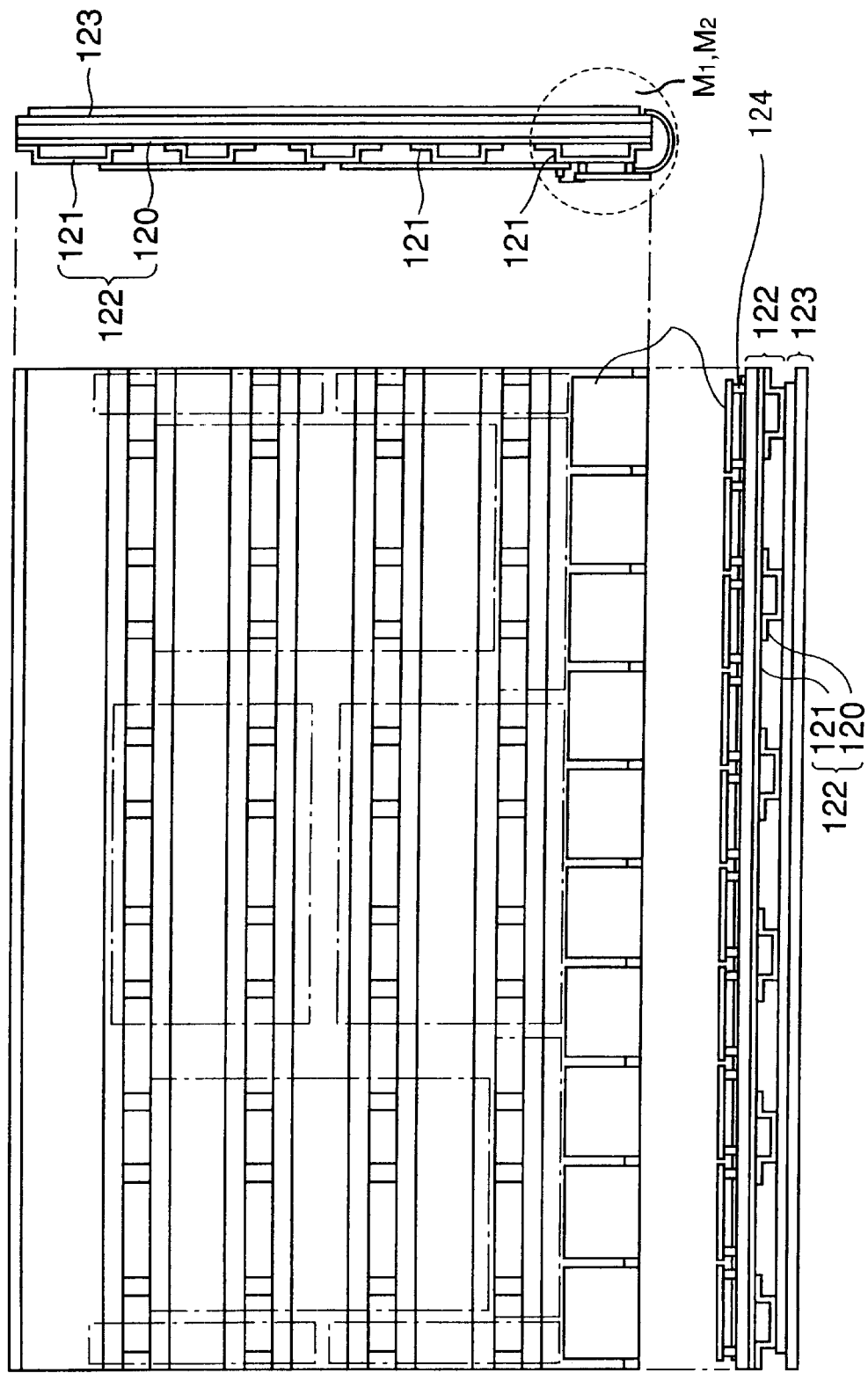
FIG. 3 is a rear view and a side view showing an example of a flat display panel in the prior art.
Figure 4A:
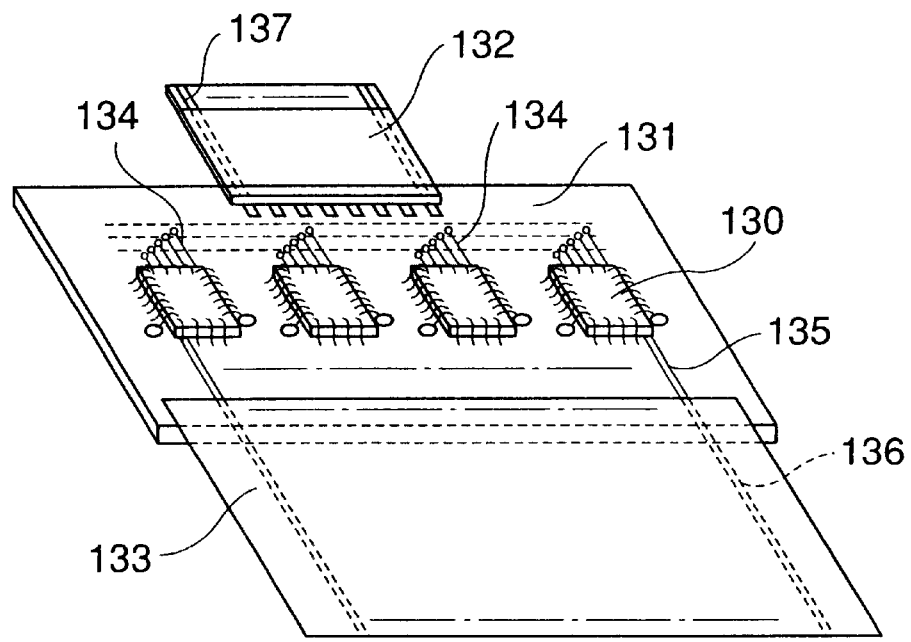
FIG. 4A is a perspective view showing a driver IC packaging module having a COB structure in the prior art.
Figure 4B:
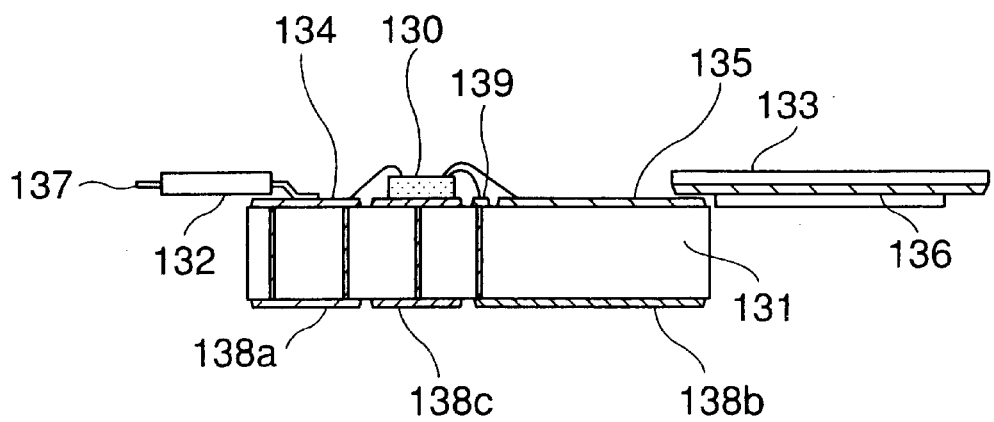
FIG. 4B is a sectional view showing the same.

The display panel 5 consists of the front and rear glass substrates 101, 102 on which electrodes, fluorescent material, etc. shown in FIGS. 1 and 2 are formed.

Figure 12:
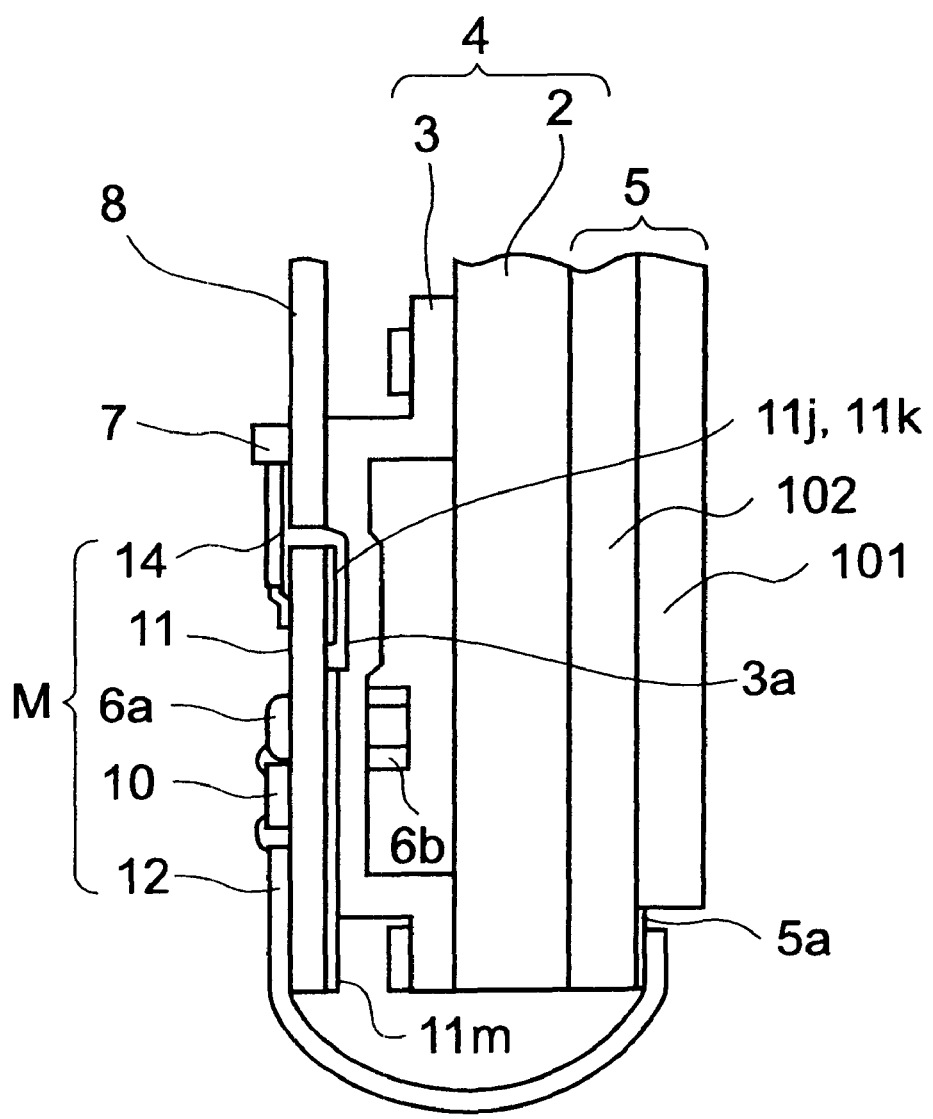
FIG. 12 is a sectional view showing the fitting state of the first driver IC packaging module according to the first embodiment of the present invention into the display device.

An address driver arrange area A1, a scanning driver arrange area A2, an X common driver arrange area A3, a Y common driver arrange area A4, a control circuit substrate arrange area A5, a power supply arrange area A6, an X side distribution wiring substrate arrange area A7, and an address bus substrate arrange area A8 are prepared on the other surface of the chassis 4. As shown in FIG. 12, the driver IC packaging module M is fitted in the address driver arrange area A1 on the chassis 4. FIG. 12 is an enlarged view of a portion indicated by a broken line shown in FIG. 11.

In FIG. 12, the printed substrate 11 of the driver IC packaging module M is secured onto the chassis 4 by screws 6a such that the lower earth plane 11m comes into contact to the second beam member 3. That is, press nuts 6b are press-fitted from the back side of the beam member 3, then the press nuts 6b and fitting holes 11b of the printed substrate 11 are superposed, and then the printed substrate 11 is fixed onto the beam member 3 by the screws 6a. Accordingly, the earth plane 11m is held at an earth potential via not only the earth wirings from the FFC 14 but also the second beam member 3.

Also, concave portions 3a are formed in areas of the second beam member 3, in which the low voltage power supply wirings 11k and the input signal wirings 11j on the lower surface side of the printed substrate 11 are positioned. Accordingly, as indicated by a chain double-dashed line shown in FIG. 9B, the low voltage power supply wirings 11k and the input signal wirings 11j are positioned not to come into contact to the second beam member 3.

The flexible substrate 12 is curved to the display panel 5 side, and then the output ends 12e of the wirings 12c of the flexible substrate 12 are connected electrically to front electrodes 5a of the rear glass substrate 102 by the thermo-compression bonding.

In the driver IC packaging module shown in FIGS. 9A and 9B, the input ends 14c of the wirings 14b of the FCC 14 are connected to the bus substrates 8 or control circuit substrates (not shown) on the panel 4 via the connectors 7. These bus substrates 8 are fitted onto the beam member 3 in the address bus substrate arrange area A8, and the control circuit substrates are fitted onto the beam member 3 in the control circuit substrate arrange area A5.

Figure 13:
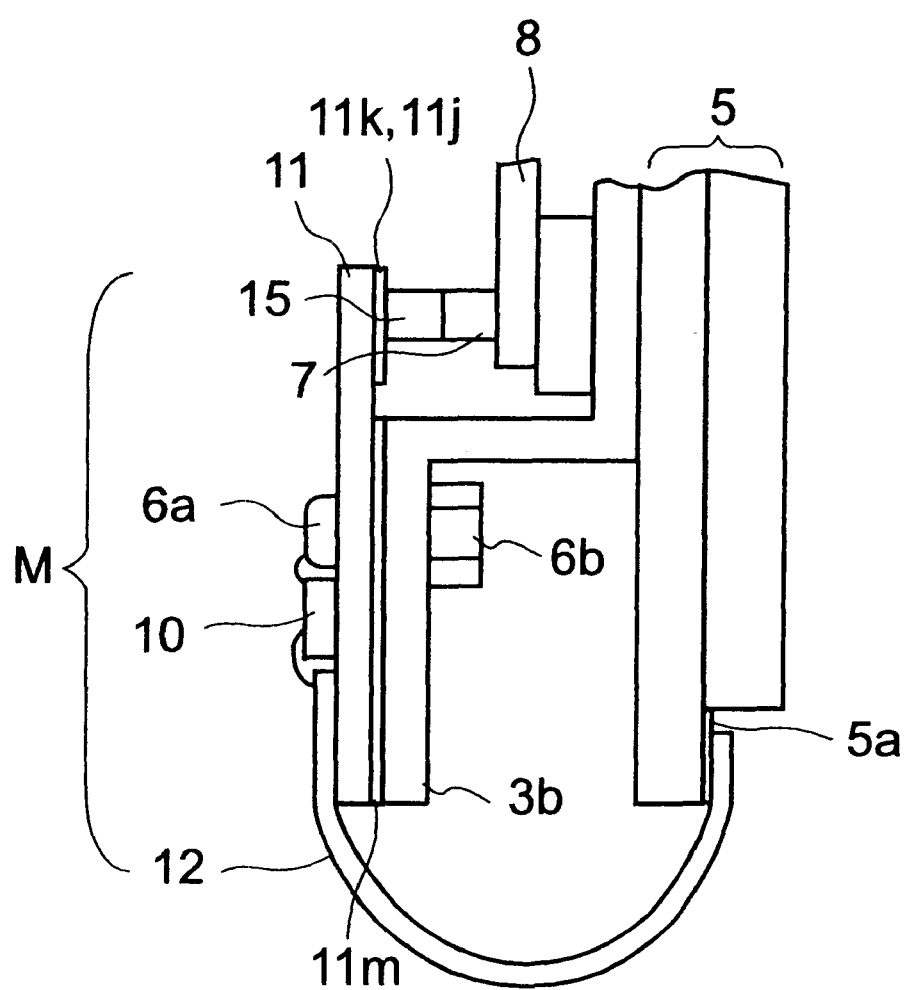
FIG. 13 is a sectional view showing the fitting state of the second driver IC packaging module according to the first embodiment of the present invention into the display device.

FIG. 13 shows the state that the driver IC packaging module is fitted onto the uppermost surface of the beam member 3b having a Z-type sectional shape and then the connectors 15 of the driver IC packaging module are connected to the connectors 7 of the bus substrates 8. In this case, the printed substrate 11 is secured onto the uppermost surface of the beam member 3b by using the screws 6a and the press nuts 6b under the condition that the earth planes 11m are connected to the beam member 3b. The low voltage power supply wirings 11k and the input signal wirings 11j on the lower surface (back surface) side of the printed substrate 11 are positioned over the bus substrates 8 or the control circuit substrates (not shown) via the connectors 7, 15.

The driver IC packaging module which is fitted onto the chassis 4 in the above state can radiate effectively the heat of the driver IC chip 10 to the outside since the printed substrate 11 comes into contact to the chassis 4 via the copper earth planes 11m. In this case, the chassis 4 is used as a heat sink.

Also, since the concave portions 3a are formed in the portions of the beam member 3 of the chassis 4, which oppose to the low voltage power supply wirings 11k and the input signal wirings 11j, short-circuit between the wirings can be avoided.

Next, a method of forming the above flexible substrate 12 will be explained by taking two examples hereunder.

A method of using the laser beam machining, as shown in FIGS. 14A to 14D, will be explained as the first method of forming the flexible substrate 12.

First, as shown in FIG. 14A, the copper foil is pasted on the base film 12a which is formed of insulating resin such as polyimide, polyester, etc., and then a plurality of wirings 12c are formed in parallel by patterning the copper foil by means of the photolithography method. Then, as shown in FIG. 14B, a covering film 12b formed of insulating resin is stuck onto the wirings 12c by the thermocompression bonding. In this case, one end of the base film 12a is displaced with one end of the covering film 12b to expose the input side area 12d of the wiring 12c, to which the wire bonding can be applied. Then, the base film 12a is removed partially by irradiating the excimer laser to the other end of the base film 12a and its neighboring area to expose the output end area 12e of the wiring 12c. Thus, the input end area 12d and the output end area 12e of the wiring 12c are exposed in the opposite direction respectively. Accordingly, the flexible substrate 12 can be completed.

Figure 15A:
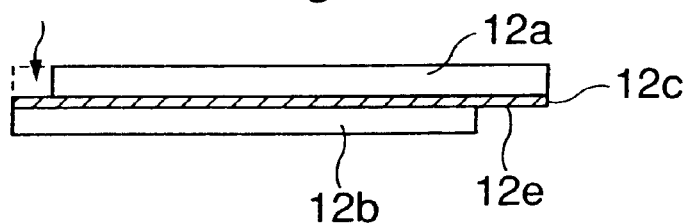
FIGS. 15A and 15B are sectional views showing second steps of forming the flexible substrate employed in the driver IC packaging module according to the first embodiment of the present invention.
Figure 15B:
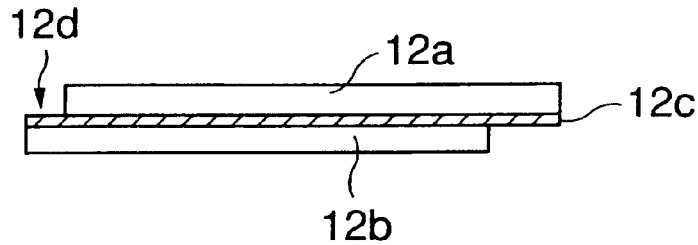

In FIGS. 14A to 14D, the input end area 12d of the wiring 12c is exposed to paste the covering film 12b onto the base film 12a. However, as shown in FIGS. 15A and 15B, the arrangement of the base film 12a and the covering film 12b may be reversed, and then the output end area 12e of the wiring 12c may be exposed to paste the covering film 12b onto the base film 12a. In this case, the input end area 12d of the base film 12a is removed partially by the laser irradiation.

A method of using the prepunch method, as shown in FIGS. 16A to 16F, will be explained as the second method of forming the flexible substrate 12.

Figure 16A:
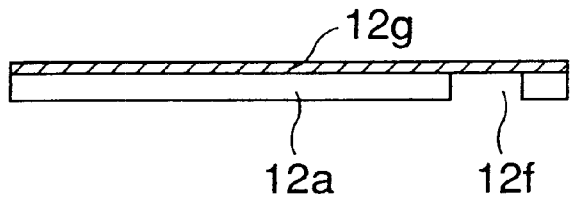
FIGS. 16A to 16F are sectional views showing third steps of forming the flexible substrate employed in the driver IC packaging module according to the first embodiment of the present invention.
Figure 16B:
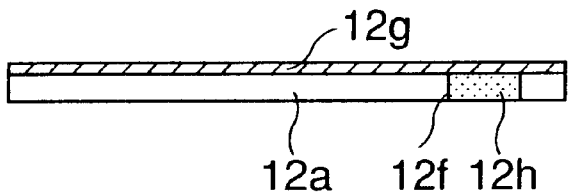
Figure 16C:
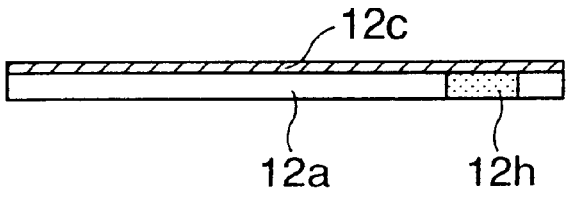
Figure 16D:
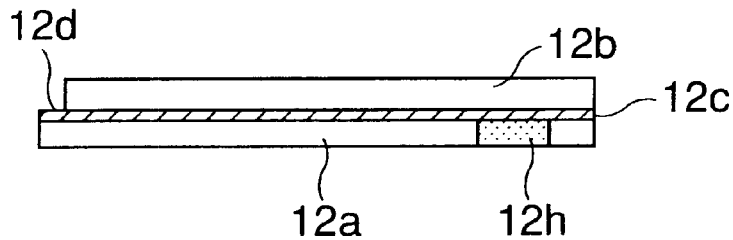
Figure 16E:
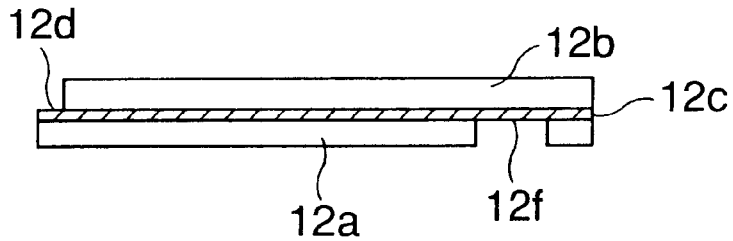
Figure 16F:
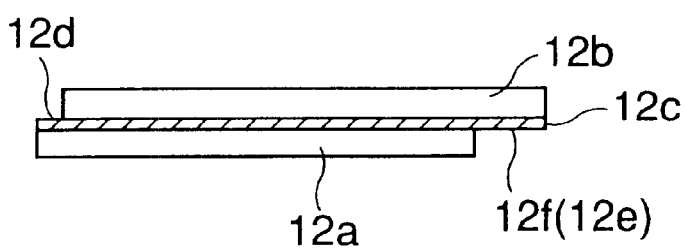

First, as shown in FIG. 16A, a window 12f is formed in an area near one end of the base film 12a, and then the copper foil 12g is pasted on the base film 12a. Then, as shown in FIG. 16B, an implementing agent 12h formed of predetermined agent used for the copper foil etching is coated in the window 12f. Then, as shown in FIG. 16C, a plurality of wirings 12c are formed by patterning the copper foil 12g by virtue of the photolithography method. Then, as shown in FIG. 16D, the covering film 12b formed of insulating resin is pasted onto the base film 12a by the thermocompression bonding. In this case, the other end of the base film 12a is displaced with the other end of the covering film 12b to expose the other end of the wiring 12c and its peripheral area in the opposite direction to the window 12f. Then, as shown in FIG. 16E, the implementing agent 12h is removed. Then, finally respective layers from the base film 12a to the covering film 12b located in an area which extends from the window 12f to one end are cut out to remove, whereby the steps of forming the flexible substrate 12 are completed.

Second Embodiment

In the driver IC packaging module shown in FIGS. 9A and 9B according to the first embodiment, the wirings 12c of the flexible substrate 12 and the pads 10a of the driver IC chip 10 are connected via the conductive line 10b, but the present invention is limited to such connection.

Figure 17A:
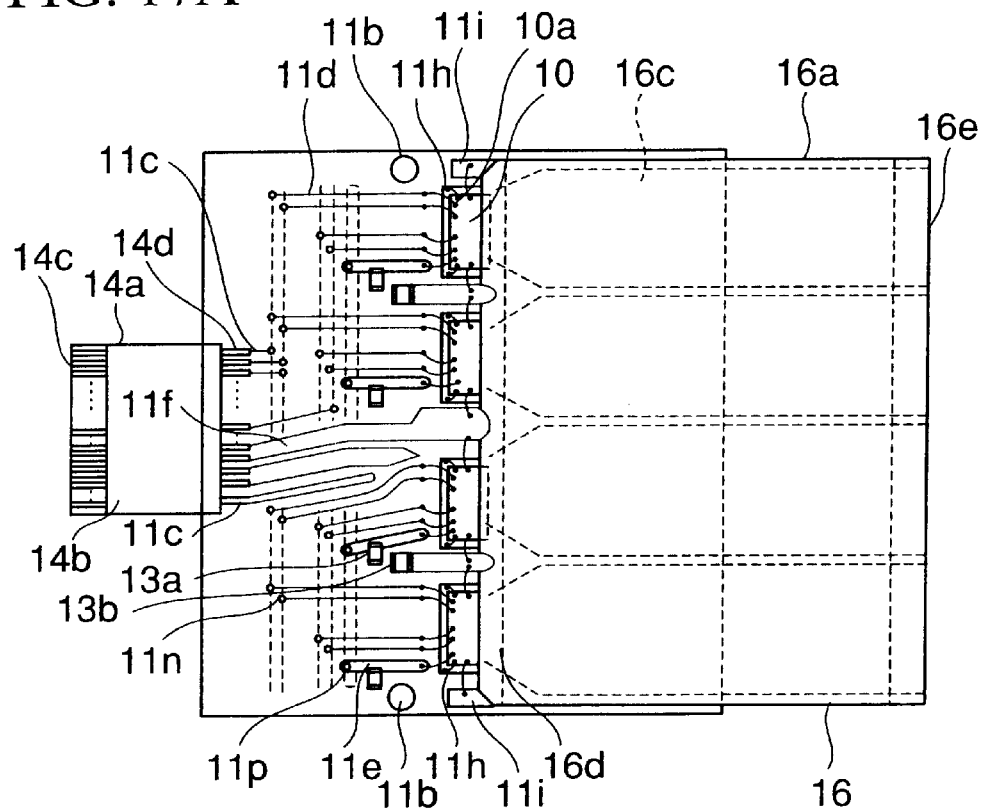
FIG. 17A is a plan view showing a display device in a first driver IC packaging module according to a second embodiment of the present invention.
Figure 17B:
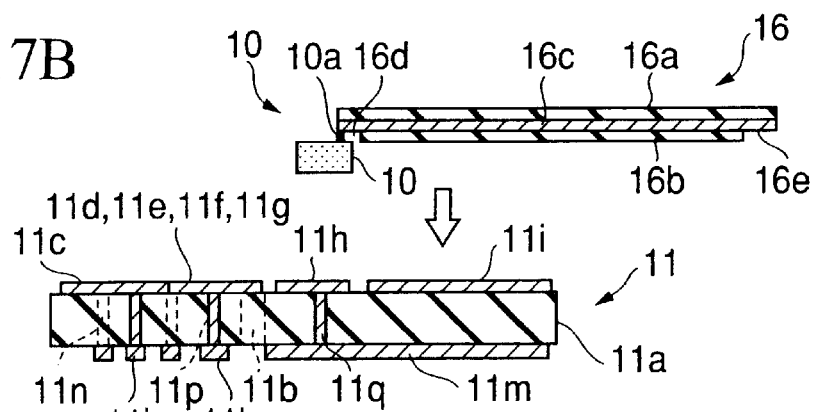
FIGS. 17B and 17C are sectional views showing the same.
Figure 17C:
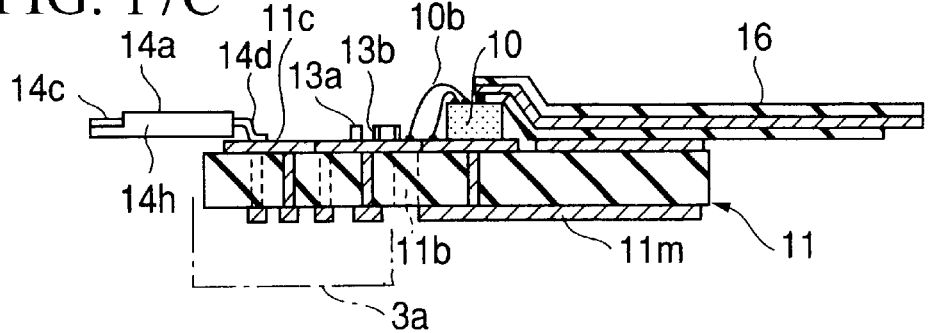

For example, as shown in FIGS. 17A to 17C, such a configuration may be adopted that input end areas 16d of wirings 16c of the flexible substrate 16 are directly bonded to the pads 10a of the driver IC chip 10 by using bumps, an anisotropic conductive film, or a conductive adhesive. In this case, the positional relationship between the base film 16a and the covering film 16b of the flexible substrate 16 is reversed in contrast to the first embodiment so as to bring the covering film 16b into contact to the printed substrate 11, and then the input end area 16d and the output end area 16e of the wiring 16c are not exposed from the base film 16a, but exposed from both end portions of the covering film 16b in the same direction. Accordingly, since the input end area 16d of the wiring 16c of the flexible substrate 16 and the pads 10a of the driver IC chip 10 can be collectively connected by the bonding, a time required for connection can be reduced and thus a lower cost can be achieved.

In the module assembling, as shown in FIG. 17B, the pads 10a of the driver IC chip 10 and the input end area 16d of the wiring 16c of the flexible substrate 16 are bonded collectively. Then, as shown in FIG. 17C, the driver IC chips 10 are die-bonded onto the. die bonding patterns 11h of the printed substrate 11, and also the flexible substrate 16 is pasted onto the surface of the printed substrate 11 by the adhesive. Then, the input signal wirings 11d, the low voltage power supply wirings 11e, the die bonding patterns 11h, and the high voltage power supply wirings 11i on the printed substrate 11 are connected to the corresponding pad terminals 10a of the driver IC chips 10 via the conductive lines 10b respectively by the wire bonding, whereby electrical connection can be completed.

Finally, assembling of the overall module can be completed by connecting the bypass capacitors 13a, 13b and the FFC 14 by virtue of reflow soldering.

Since the driver IC packaging module having such flexible substrate 16 can be fitted to the frame 4 in the same way as shown in FIGS. 12 and 13, a heat radiation efficiency from the module to the frame 4 can be enhanced.

Figure 18A:
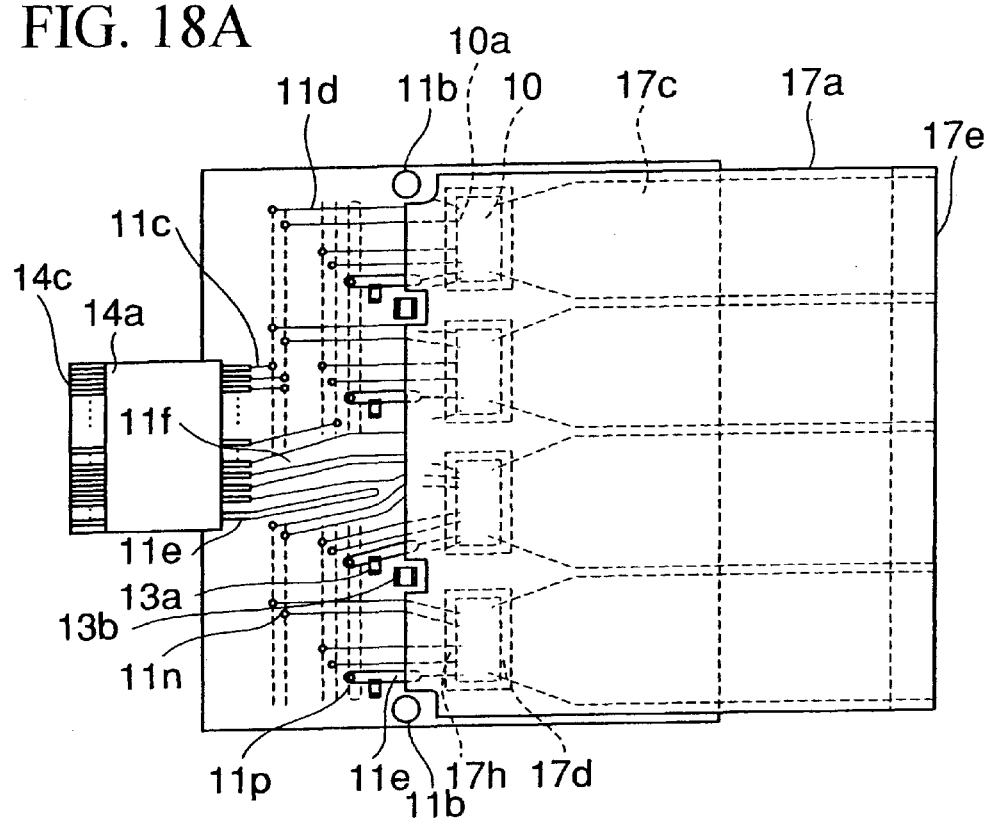
FIG. 18A is a plan view showing a display device in a second driver IC packaging module according to the second embodiment of the present invention.
Figure 18B:
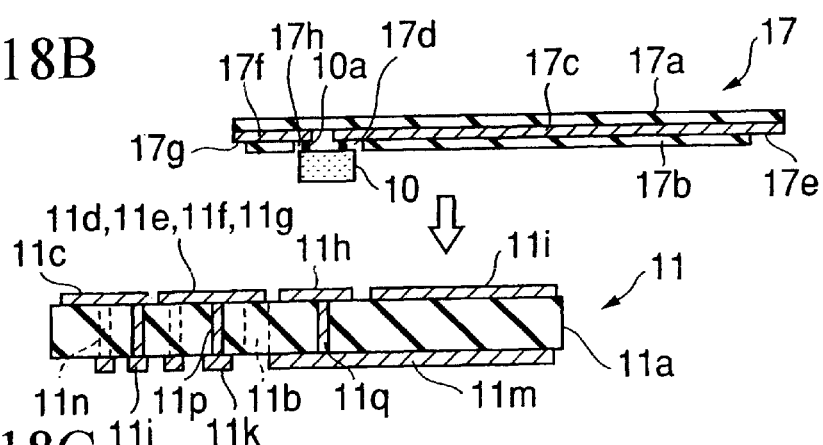
FIGS. 18B and 18C are sectional views showing the same.
Figure 18C:
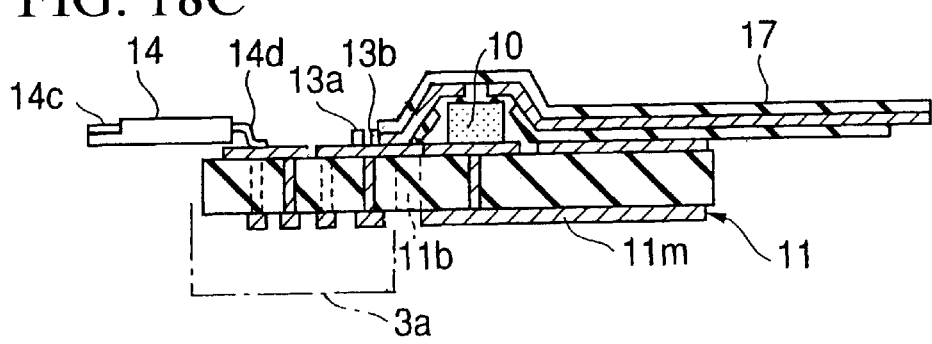

Meanwhile, connection of the input signal wirings 1id, the low voltage power supply wirings 11e, the earth wirings 11g (or the die bonding patterns 11h), and the high voltage power supply wirings 11f (or the high voltage power supply plane 11i) onto the pads 10a of the driver IC chip 10 can be conducted by using the flexible substrate 17 shown in FIGS. 18A to 18C.

In FIGS. 18A to 18C, the output side and the input side are formed by a sheet of flexible substrate 17 respectively, and the flexible substrate 17 comprises a common base film 17a and a common covering film 17b.

The output side of the flexible substrate 17 has a plurality of output side wirings 17c, and the input side of the flexible substrate 17 has a plurality of input side wirings 17f. The output side wirings 17c and the input side wirings 17f are separated mutually in the portion on the driver IC chip 10.

The input end areas 17d of the output side wirings 17c are directly bonded to the output side pads 10a of the driver IC chip 10 by using the bumps, the anisotropic conductive film, or the conductive adhesive. Also, the output end areas 17h of the input side wirings 17f are directly bonded to the input side pads 10a of the driver IC chip 10 by using the bumps, the anisotropic conductive film, or the conductive adhesive. The input end areas 17g are connected directly to the input signal wirings 11d, the low voltage power supply wirings 11e, the earth wirings 11g (or the die bonding patterns 11h), and the high voltage power supply wirings 11f (or the high voltage power supply plane 11i) on the printed substrate 11 via the reflow soldering, or the bumps, the anisotropic conductive film, or the conductive adhesive.

In this example, the input end areas 17d, 17g and the output end areas 17e, 17h of the wirings 17c, 17f on the flexible substrate 17 are not exposed from the base film 17a side, but exposed from the covering film 17b side in the same direction. Accordingly, since the driver IC packaging module having such flexible substrate 17 can be fitted to the beam members 3, 3b of the frame 4 in the same way as shown in FIGS. 12 and 13, a heat radiation efficiency from the driver IC packaging module to the frame 4 can be enhanced. In addition, since not only connection of the wirings 17c, 17f of the flexible substrate 17 to the pads 10a of the driver IC chip 10 but also connection of the input signal wirings 11d, the low voltage power supply wirings 11e, the earth wirings 11g (or the die bonding patterns 11h), and the high voltage power supply wirings 11f (or the high voltage power supply plane 11i) to the pads 10a of the driver IC chip 10 can be conducted collectively via the flexible substrate 16 by the bonding, a time required for connection can be reduced rather than the structure shown in FIG. 17 and thus a lower cost can be achieved.

Figure 8A:
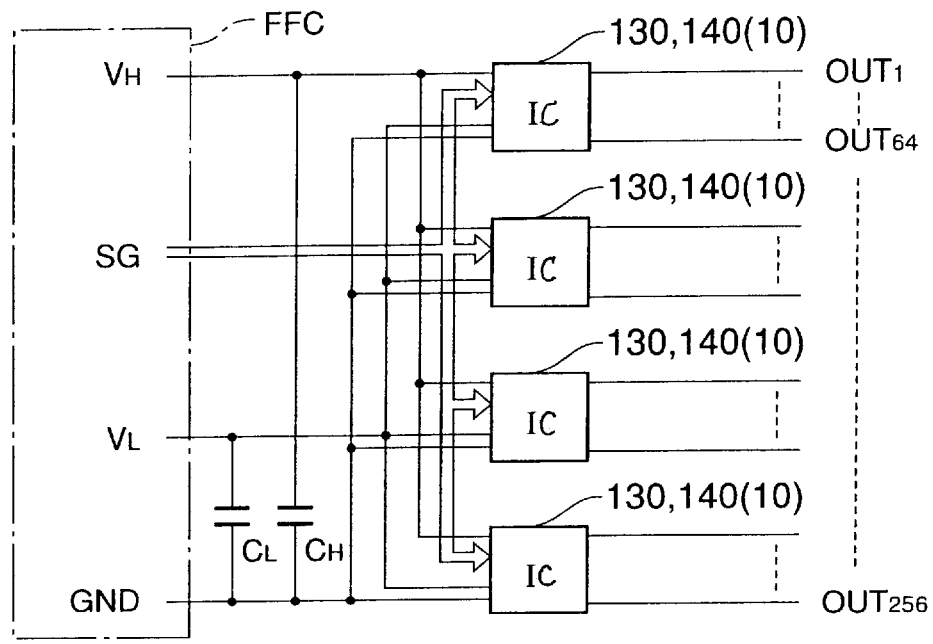
FIG. 8A is a block diagram showing a circuit configuration of the normal driver IC packaging module.
Figure 8B:
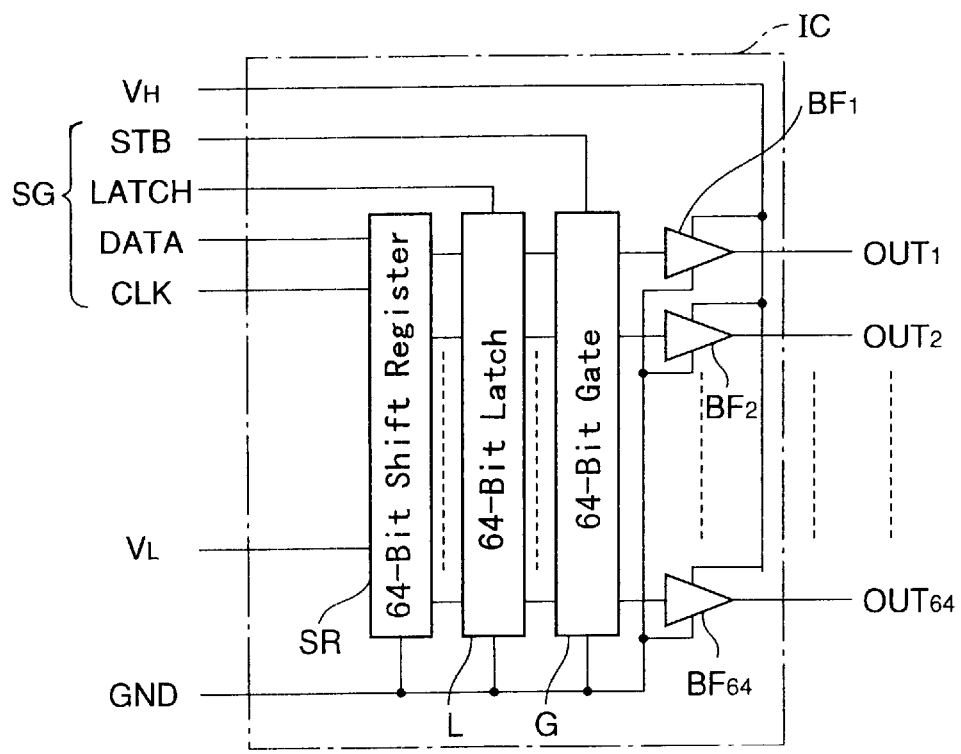
FIG. 8B is a block diagram showing a circuit configuration of the driver IC in the normal driver IC packaging module.

The driver IC packaging modules in the second embodiment and embodiments described in the following have a circuit configuration shown in FIGS. 8A and 8B.

Third Embodiment

In the first and second embodiments, the printed substrate is used as the substrate on which the driver IC chips are mounted and secured and electrical connection to the wirings containing the input signal wirings is applied, but the present invention is not limited to such printed substrate.

For example, a metal plate having a high thermal conductivity may be used as the substrate. Various examples will be explained hereunder.

Figure 19A:
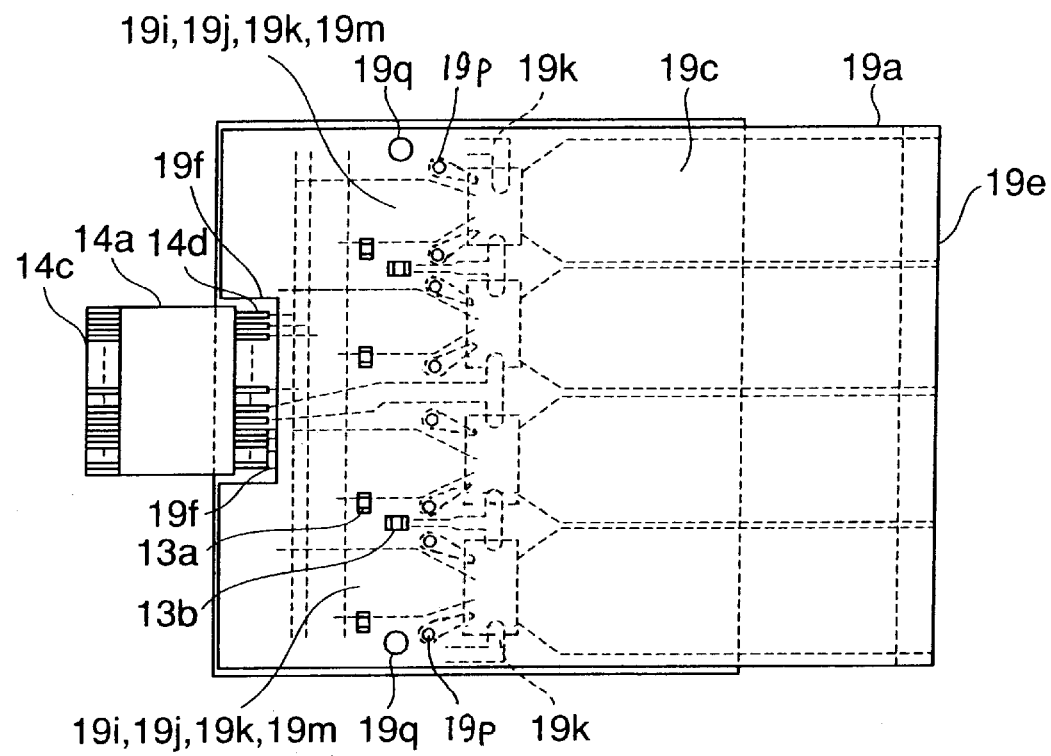
FIG. 19A is a plan view showing a display device in a first driver IC packaging module according to a third embodiment of the present invention.
Figure 19B:
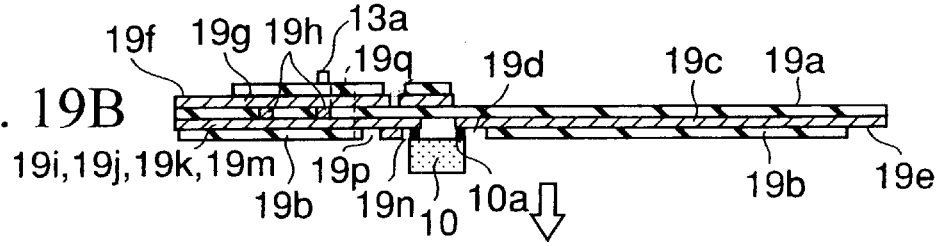
FIGS. 19B and 19C are sectional views showing the same.
Figure 19C:
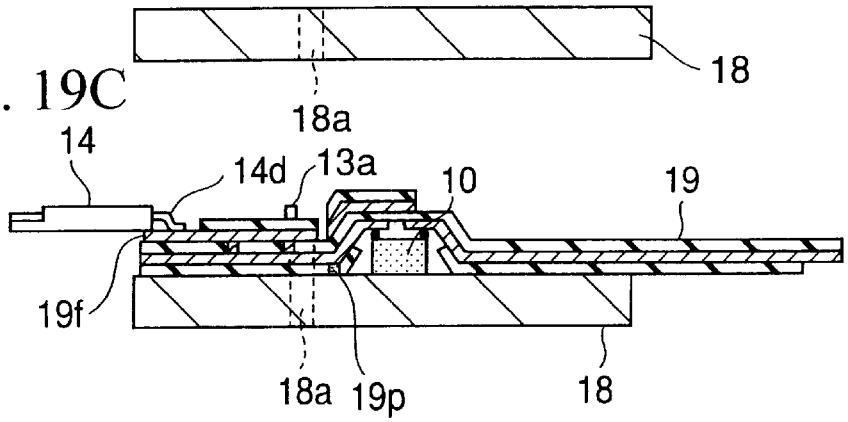

FIGS. 19A to 19C show the driver IC module in which an aluminum substrate is employed as the substrate on which the driver IC chips can be secured stably and which has a function as the earth wirings and a radiation operation.

In this driver IC packaging module, all wirings of the input portion and wirings of the output portion are formed by a sheet of flexible substrate 19, and the wirings of the input portion and the wirings of the output portion of the flexible substrate 19 are directly connected to a plurality of pad terminals 10a of the driver IC chip 10 by using the bumps, the anisotropic conductive film, or the conductive adhesive.

The flexible substrate 19 has a multi-layered wiring structure at its input portion, and a plurality of wirings 19g are formed on the upper layer portion of the base film 19a and cross-wired to the lower layer portion side via through holes 19h.

The wirings which are re-arranged on the lower layer portion side has a structure to contain input signal wirings 19i, low voltage power supply wirings 19j, high voltage power supply wirings 19k, and earth wirings 19m, respective wirings are input into four driver IC chips 10 in parallel.

Because the output portion does not need the cross wirings, the output wirings are formed in the form of a single layer wiring structure by using only the wirings 19c of the lower layer portion.

A covering film 19b is pasted on surfaces of the wirings 19g of the upper layer portion and the wirings 19i, 19j, 19k, 19m, 19c of the lower layer portion to insulate and protect them. Input terminals 19f are provided to the wirings 19g of the upper layer portion, and the FFC 14 connected to the external substrate is connected to the input terminals 19f by the soldering.

Respective terminals of the input signal wirings 19i, the low voltage power supply wirings 19j, the high voltage power supply wirings 19k, and the earth wirings 19m, which are the wirings of the lower layer portion on the input side, as described above, are directly connected to corresponding pads of the driver IC chips 10 by using the bumps, the anisotropic conductive film, or the conductive adhesive. These terminals together with the terminals of the input portion are connected at the same time by the batch bonding.

In addition, wirings and earth terminals 19p, which are connected to the aluminum substrate 18 to apply the earth potential, are provided to the wirings of the lower layer portion on the input side of the flexible substrate 19. The earth terminals 19p are provided by opening a part of the covering film 19b to a predetermined size, and connected to the surface of the aluminum substrate 18 by the method described later and also connected to the corresponding pads 10a of the driver IC chip 10 by the batch bonding described above.

Then, as shown in FIG. 19B, all electrical connections between various wirings of the flexible substrate 19 and the pads 10a of the driver IC chip 10 are applied as described above, and then a resin (not shown) is coated to protect the pad terminal connection portions from the moisture, etc.

However, since the back surface of the driver IC chip 10 are pasted tightly onto the surface of the aluminum surface as described above, such protection resin must be coated carefully not to stick to the back surface.

After above processes have been completed, as shown in FIG. 19C, the flexible substrate 19 and the aluminum substrate 18 are stuck to each other such that both fitting holes 19q, 18a coincide with each other. At this time, the back surface of the driver IC chip 10 may be tightly contacted by using the same adhesive as that employed to stick the flexible substrate 19. However, sticking to the back surface of the aluminum substrate 18 by the die bonding using the conductive adhesive, like the die bonding in the first embodiment, is superior in the electrical stability and is ideal. Also, since the conductive adhesive is filled in the openings which expose the earth terminals 19p on the lower surface side of the flexible substrate 19 if the conductive adhesive is employed, connection between the earth terminals 19p and the aluminum substrate 18 can be facilitated.

In this manner, if the back surface of the driver IC chip 10 is tightly adhered and secured to the aluminum substrate 18, radiation property from the driver IC chip 10 to the aluminum substrate 18 can be enhanced and the module with the good heat radiation property can be achieved.

Electrical connection between the earth terminals 19p of the input portion of the above flexible substrate 19 and the aluminum substrate 18 is conducted together with this adhesion. As the connecting method, in addition to the above conductive adhesive, the bumps, the anisotropic conductive film, or the like may be employed like the connection to the pad terminals 10a, or the soldering by using the dedicated solder material for aluminum material may be employed, or the pressure welding by using the high temperature and the high pressure may be employed.

Finally, the input portion terminals 19f of the flexible substrate 19 are connected to the terminals 14d of the FFC 14 by the soldering, and then bypass chip capacitors 13a, 13b are provided between the power supplies and the ground by the soldering, whereby all assembling steps are completed.

As described above, in the driver IC packaging module shown in FIGS. 19A and 19C, since the mounting surface of the driver IC chip 10 on the aluminum substrate 18 and the exposed surfaces 19e of the output terminals 19c on the flexible substrate 19 can be set oppositely, the module can be easily fitted to the frame 4 and the heat radiation efficiency is excellent, like the above-mentioned embodiments.

Figure 20A:
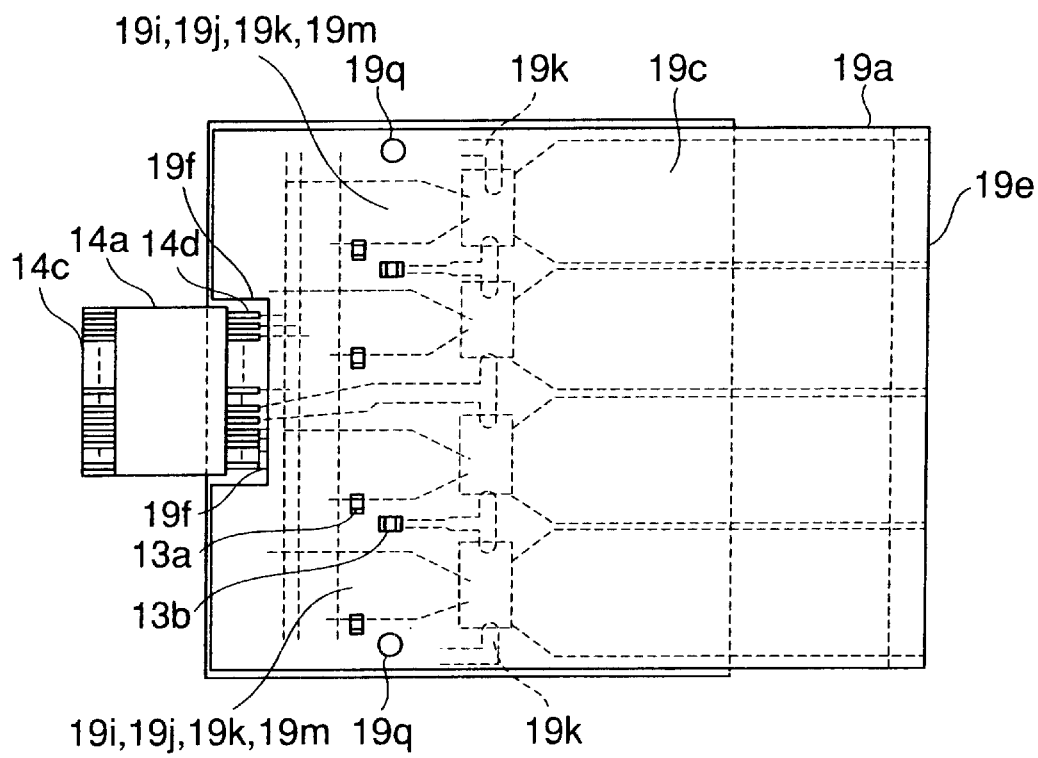
FIG. 20A is a plan view showing a display device in a second driver IC packaging module according to the third embodiment of the present invention.
Figure 20B:
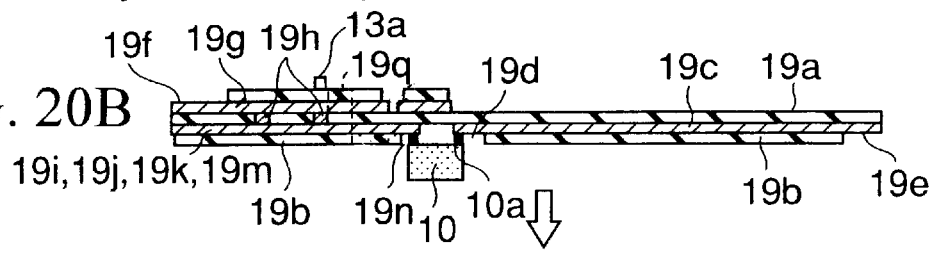
FIGS. 20B and 20C are sectional views showing the same.
Figure 20C:
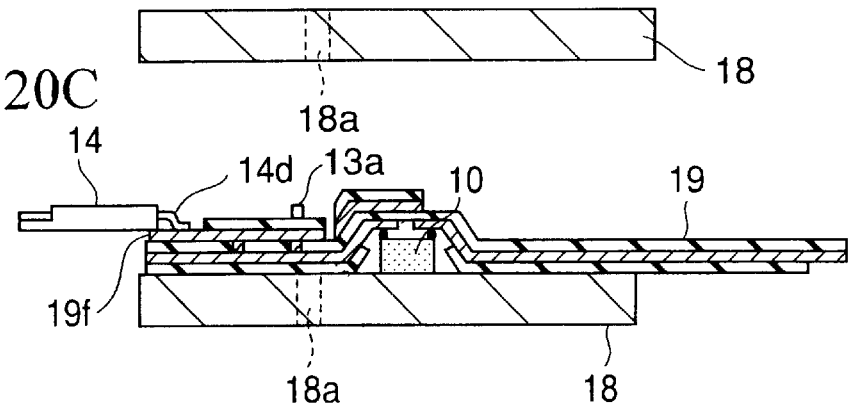

The method of connecting directly the aluminum substrate 18 to the earth pads of the driver IC chip 10 as the earth potential can be omitted according to the magnitude of the load of the display panel. That is, if the panel size is relatively small and the load current is small, the driver IC chip 10 is never affected by the bad influence such as noise, etc. Therefore, as shown in FIGS. 20A to 20C, the above earth terminals 19p may be omitted in fabrication to reduce the cost. Where, in FIGS. 20A to 20C, the same references as those shown in FIGS. 19A to 19C denote the same elements.

By the way, the structure using the flexible flat cable (FFC) 14 connected to the external circuits is shown in FIGS. 19A to 19C. However, as shown in FIG. 21, such a structure may be adopted that the upper layer portion wirings 19g, for example, of the input portion of the flexible substrate 10 are formed as the input terminals 19f by projecting outward from the input side end portion of the aluminum substrate 18, and thus also used as the input cables.

Figure 21:
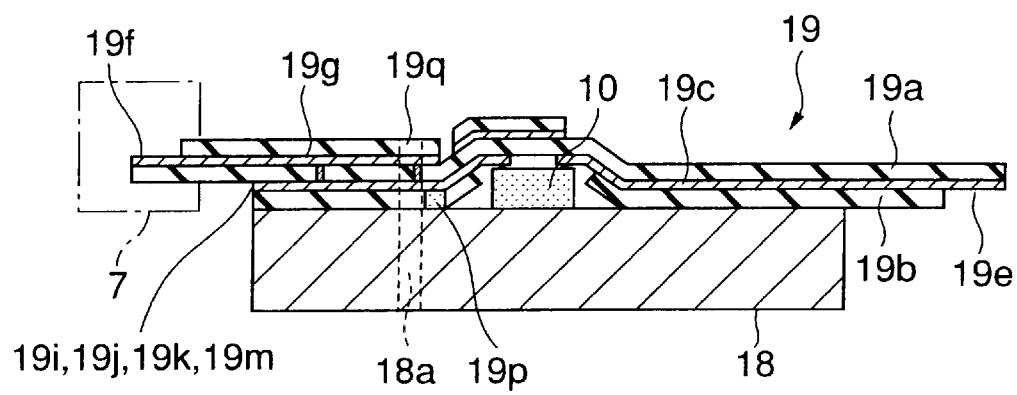
FIG. 21 is a sectional view showing a third driver IC packaging module according to the third embodiment of the present invention.

In the driver IC packaging module shown in FIG. 21, the input terminals 19f of the flexible substrate 19 are connected to the bus substrate 8 via the connectors 7 shown in FIG. 12.

Figure 22:
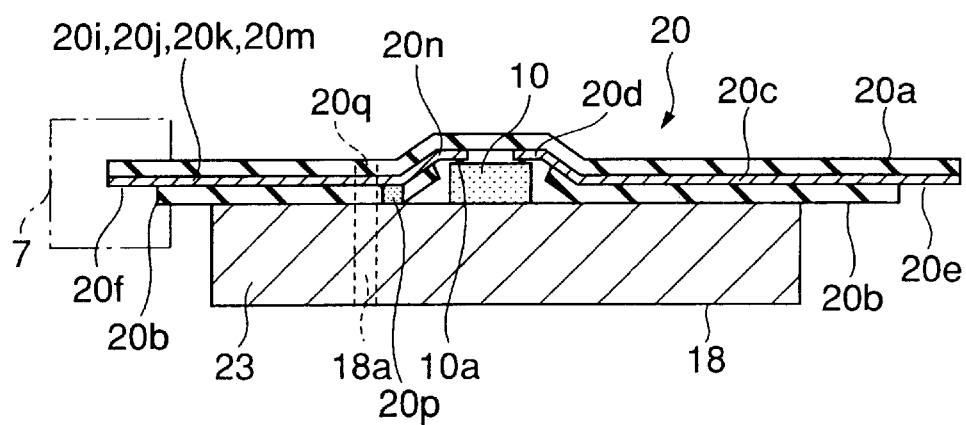
FIG. 22 is a sectional view showing a fourth driver IC packaging module according to the third embodiment of the present invention.

Further, as shown in FIG. 22, a flexible substrate 20 having all single layer wiring structure may be adopted in place of the flexible substrate 19 having the multi-layered wiring structure in the input portion shown in FIGS. 19 and 21.

The flexible substrate 20 is so constructed that all wirings are formed to be put between a base film 20a and a covering film 20b. The input portion wirings contain input signal wirings 20i, low voltage power supply wirings 20j, high voltage power supply wirings 20k, and earth wirings 20m, and input terminals 20f on the input end and connection terminals 20n on the. output end are exposed from the covering film 20b. Output portion wirings 20c have connection terminals 20d on the input end exposed from the covering film 20b side and output terminals 20e on the output end.

The connection terminals 20n, 20d on the output end and the input end are connected to the pads 10a of the driver IC chip 10 by the batch bonding respectively. In addition, earth terminals 20p to be earth-connected to an aluminum substrate 18 are provided in the neighborhood of the output terminals 20n of the input side and connected to the driver IC chips 10 via the aluminum substrate 18.

Like FIG. 21, the input terminals 20f of a flexible substrate 20 are used while being connected to the bus substrate 8 via the connectors 7.

The multi-layered wiring structure in the input portion and the single layer wiring structure in the output portion of the flexible substrate 19 shown in FIGS. 19 and 21 are fabricated separately on the separate flexible substrates, and then constructed by combining the separate flexible substrates together.

The driver IC packaging module having the above configuration is fitted onto the chassis 4 under the same situation as that shown in FIG. 12. That is, since the back surface of the aluminum substrate 18 is fixed to the second beam member 3 by the vires so as to directly contact to the second beam member 3, the heat generated by the driver IC chips 10 can be radiated to the chassis 4 via the aluminum substrate 18 having the high thermal conductivity. In this case, the chassis 4 functions as a heat sink. The aluminum substrate 18 has a role as the earth plane 11m in the first embodiment, and can be held at the earth potential via the chassis 4.

In FIGS. 21 and 22, in some cases the earth terminals 10p, 20p may be omitted like the case shown in FIG. 20C.

Fourth Embodiment

The driver IC packaging modules explained in FIG. 19, FIG. 20, FIG. 21 and FIG. 22 have the structure in which the electrical connection to the aluminum substrate 18 which also acts as the earth wirings is connected by using the earth terminals 19p, 20p provided in the flexible substrates 19, 20. However, as shown in FIGS. 23A to 23C, FIG. 24 and FIG. 25, a structure in which the earth pads 10c on the driver IC chip 10 and the aluminum substrate 18 are connected by the wire bonding may be employed.

Figure 23A:
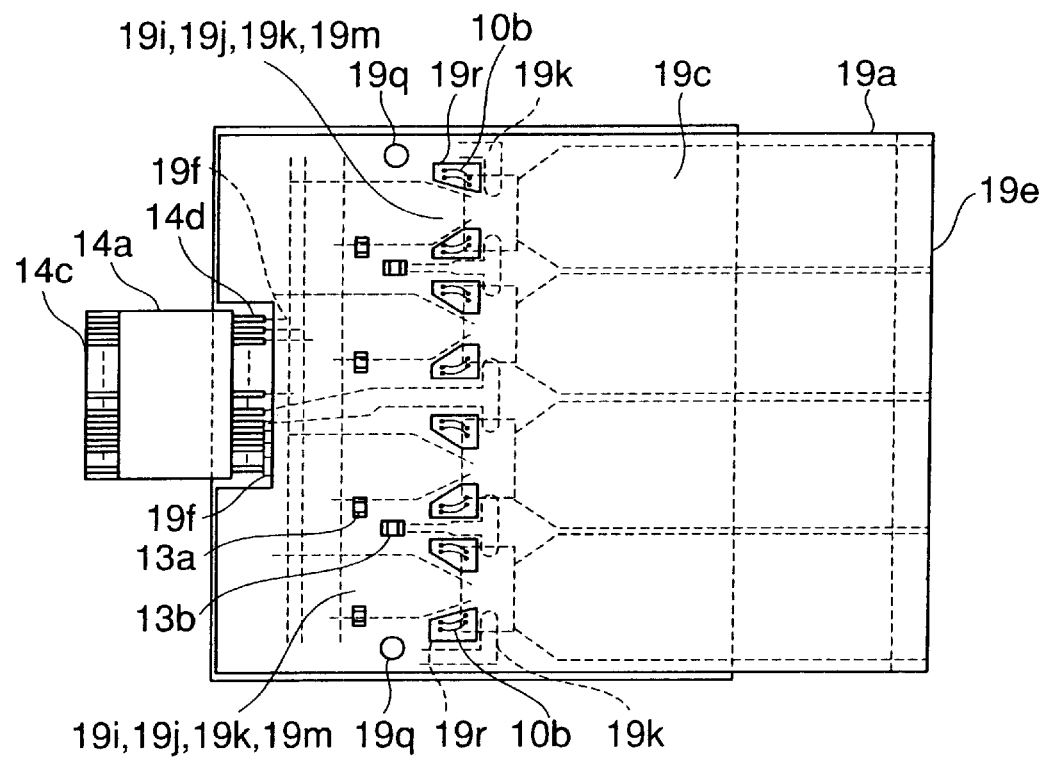
FIG. 23A is a plan view showing a first driver IC packaging module according to a fourth embodiment of the present invention.
Figure 23B:
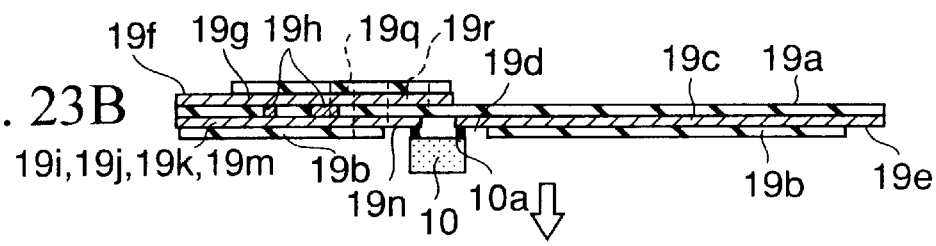
FIGS. 23B and 23C are sectional views showing the same.
Figure 23C:
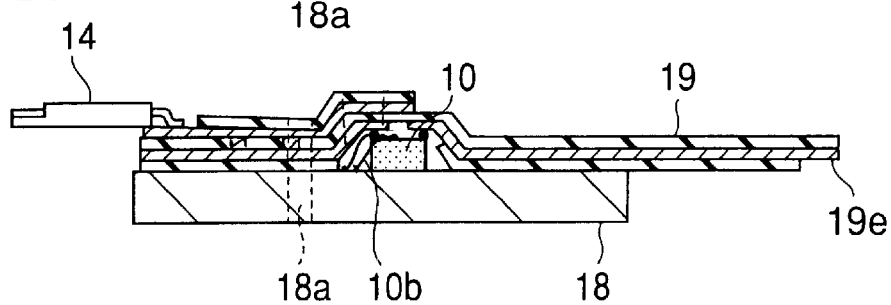

In FIGS. 23A to 23C, the electrical connection relationship between the flexible substrate 19 and the driver IC chips 10 and the input flat cable 14 is constructed substantially similarly to that in FIG. 19, and the similar aluminum substrate 18 is also equipped.

As shown in FIG. 23A, a large difference of this module from the module in FIG. 19 reside in that opening portions 19r for connecting the earth connection are provided in areas of the flexible substrate 19, which are located on both sides of the input portion of the driver IC chip 10.

The opening portions 19r are provided to assure the lowest minimum areas for connecting the earth pad terminals 10c, which are provided by two on both side locations of the input portion of the driver IC chip 10, and the surface of the aluminum substrate 18 via the wire bonding, and thus are provided at eight locations in total for four driver IC chips 10.

In the assembling steps, first of all, as shown in FIG. 23B, terminals of the flexible substrate 19 and the corresponding pad terminals of the driver IC chip 10 are connected by the batch bonding like FIG. 19, then the protection resin is coated on these connection portions to protect them, and then both are pasted onto the aluminum substrate 18, as shown in FIG. 23C.

Then, connection to the aluminum substrate 18 can be completed by connecting the earth pad terminals of the driver IC chip 10, which are exposed from the opening portions 19r of the flexible substrate 19, and the surface of the aluminum substrate 18 individually by the wire bonding.

Lastly, the assembling can be finished by soldering the chip capacitors 13a, 13b and the input flat cable 14.

Figure 24:
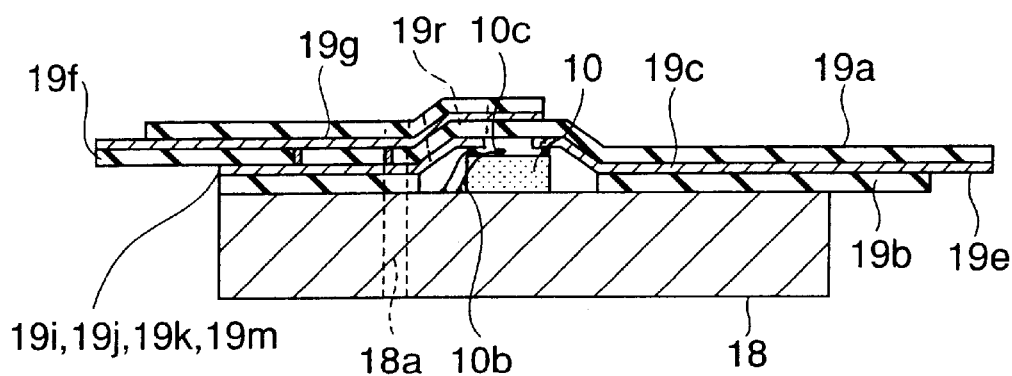
FIG. 24 is a sectional view showing a second driver IC packaging module according to the fourth embodiment of the present invention.
Figure 25:
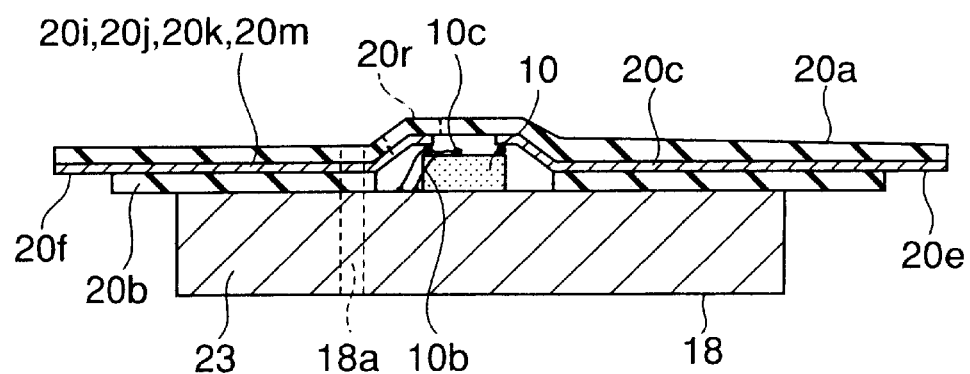
FIG. 25 is a sectional view showing a third driver IC packaging module according to the fourth embodiment of the present invention.

Similar structures shown in FIGS. 24 and 25 correspond to the foregoing structures shown in FIGS. 21 and 22 respectively, and show examples in which the wire bonding connection method similar to those in FIGS. 21 and 22 is applied.

According to the above-mentioned modules in FIGS. 23, 24 and 25, such features can be attained that connection to the aluminum substrate 18 serving as the earth wiring can be provided without fail and also the earth connection can be provided more firmly.

In the fourth embodiment, the number of wire bonding for connecting the earth pad terminals 10c of the driver IC chip 10 and the surface of the aluminum substrate 18, as mentioned above, may be reduced in the small size and light load display panel, and thus the lower cost can be achieved.

Fifth Embodiment

In a fifth embodiment, a driver IC packaging module will be explained in which the input portion wirings and the output portion wirings, which have the similar structure to those explained in the third embodiment and the fourth embodiment, are formed of the flexible substrate, and a part or all of the power supply wiring layers are provided on the printed substrate side.

Figure 26A:
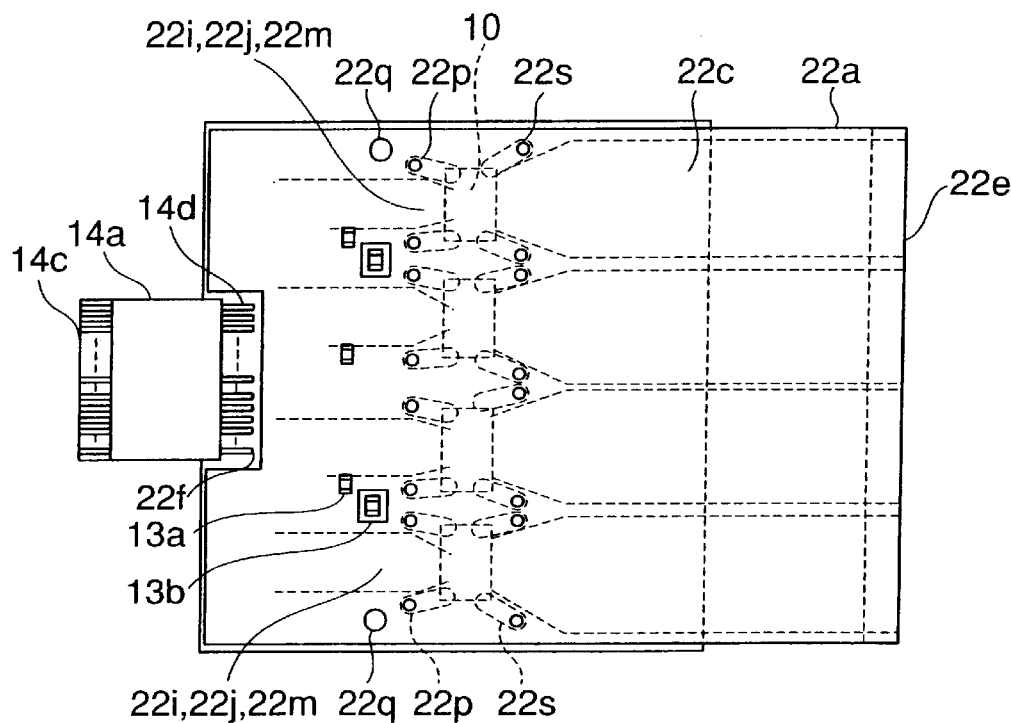
FIG. 26A is a plan view showing a first driver IC packaging module according to a fifth embodiment of the present invention.
Figure 26B:
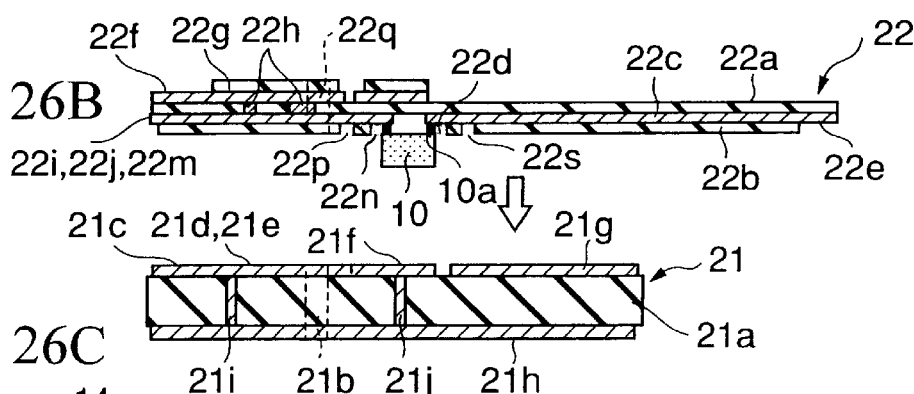
FIGS. 26B and 26C are sectional views showing the same.
Figure 26C:
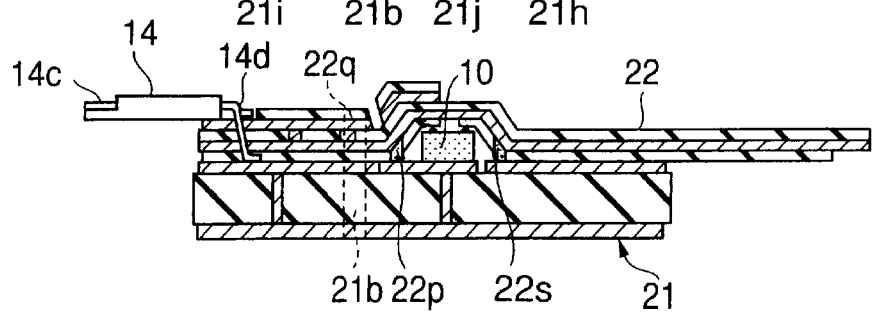

In FIGS. 26A to 26C, like the module described based on FIG. 19 in the third embodiment and FIG. 23 in the fourth embodiment, both the input portion wirings and the output portion wirings are formed of a sheet of flexible substrate 22, and respective wirings and corresponding pads 10a of the driver IC chip 10 are directly connected by using the bumps, the anisotropic conductive film, or the conductive adhesive.

However, a difference from these configurations is that the high voltage power supply wirings and a part or all of the earth wirings are provided on the printed substrate 21 side. In FIGS. 26A to 26C, such a structure is adopted that all the high voltage power supply wirings and most of the earth wirings are provided on the printed substrate 21 side and a part of the earth wirings is also provided on the flexible substrate 22 side.

Figure 27:
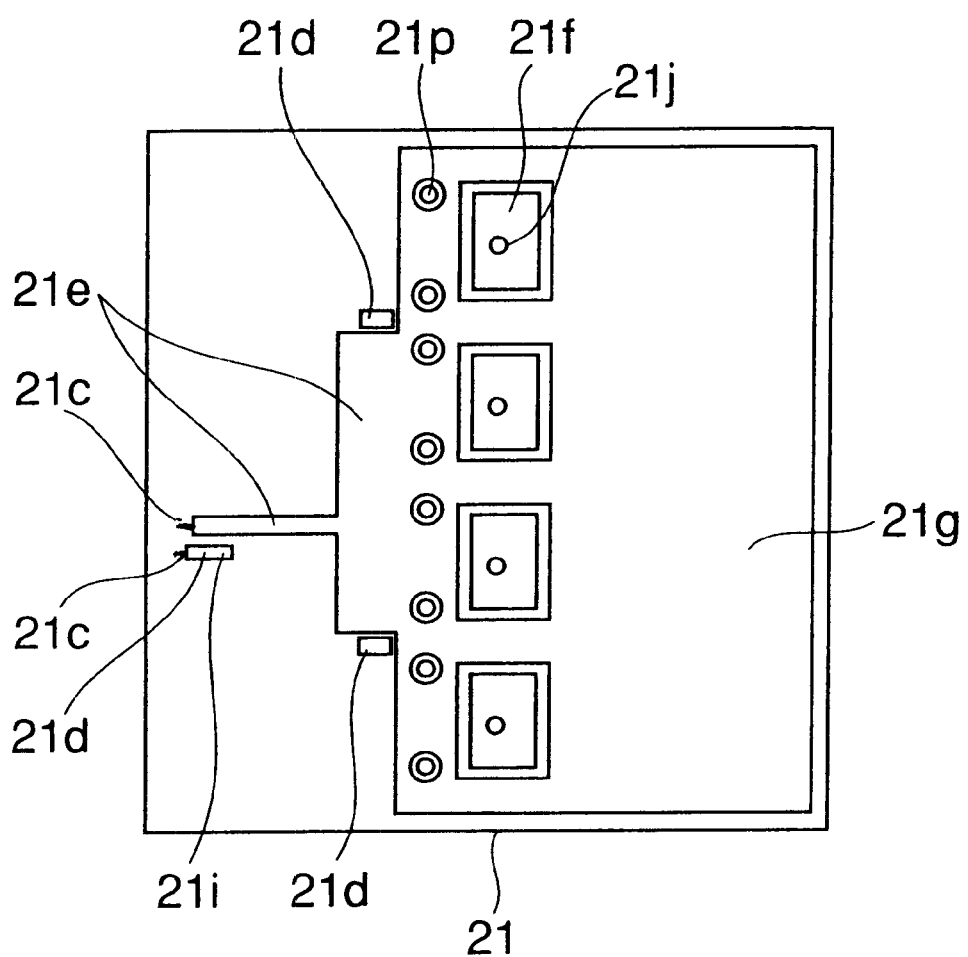
FIG. 27 is a plan view showing a printed substrate of the first driver IC packaging module according to the fifth embodiment of the present invention.

As shown in FIGS. 26B and 27, a structure of the printed substrate 21 is constructed by forming an earth plane 21h made of the copper foil on the lower surface (back surface) and then extending the earth plane 21h to input terminals 21c, which are arranged on the input terminal portions, via through holes 21*i* on the input portion side and via the earth wirings 21*d* on the upper surface (front surface). The earth plane 21*h* is also connected to the earth pattern 21f formed on the upper surface via the through hole 21*j* (thermal via) directly below the driver IC chip 10. This earth pattern 21f is also connected electrically to the earth wirings 21*d* and is directly coupled to the input terminal 21*c* side.

As shown in FIGS. 26B and 27, the high voltage power supply plane 21*g* is formed in areas of the upper surface of the printed substrate 21 on the output end side by patterning the copper foil. This high voltage power supply plane 21*g* is extended to the input end terminals 21*c* via the high voltage power supply wirings 21*e*.

In addition, lands (areas) in which the bypass capacitor 13*b* described later is mounted to connect the earth wirings 21*d* and the high voltage power supply wirings 21*e* are also provided in the input side area of the upper surface of the printed substrate. 21.

Next, the flexible substrate 22 has a multi-layered wiring structure at its input portion, and a plurality of wirings 19*g* are cross-wired by the upper layer portion wirings 22*g* and the lower layer portion wirings 22*c*, which sandwich the base film 22*a* therebetween, and input into four driver IC chips 10 in parallel respectively.

Also, because the output portion does not need the cross wirings, the output wirings are formed in the form of the single layer wiring structure by using only the wirings 22*c* of the lower layer portion.

The input terminals 22f to which the FFC 14 connected to the external devices is soldered are provided to the upper layer portion wirings 22*g* and, as previously described, respective wirings of the input signal wirings, the low voltage power supply wirings, and the earth wirings are input into the wirings 22*g*. These input wirings are cross-wired to the lower layer portion wiring side via the through holes 22*h* provided in the base film 22*a*.

The input signal wirings 22*i*, the low voltage power supply wirings 22*j*, and the earth wirings 22*m* are contained in the lower layer portion wirings. Respective terminals and the corresponding terminals of the driver IC chips 10 are directly connected by using the bumps, the anisotropic conductive film, or the conductive adhesive.

Also, the connection terminals 22*d* for the output wirings are provided on the output portion side of the lower layer portion wirings. Respective terminals and the corresponding terminals of the driver IC chips 10 are directly connected by using the bumps, the anisotropic conductive film, or the conductive adhesive. These terminals together with the terminals of the input portion are connected at the same time by the batch bonding.

In addition, wirings and the high voltage terminals 22*s*, which are connected to high voltage power supply wirings 21*e* or a high voltage power supply plane 21*g* provided on the printed substrate 21, are provided in the intermediate portion between the input portion wirings and the output portion wirings of the lower layer portion wirings of. the flexible substrate 22. Also, wirings and the earth terminals 22*p*, which are connected to earth wirings 21*d* or an earth plane 21*h* provided on the printed substrate 21, are provided therebetween.

The high voltage terminals 22*s* and the earth terminals 22*p* are exposed from the printed substrate 21 side by opening a part of the covering film 22*b* to a predetermined size. They are connected to respective wirings or the pattern on the surface of the printed substrate 21 by the later-described method, and connected at the. same time when the above batch bonding is applied to the corresponding pad terminals 10*a* of the driver IC chip 10.

After all electrical connections between various wirings of the flexible substrate 22 and the pad terminals of the driver IC chip 10 have been finished as described above, a resin is coated to protect the pad terminal connection portions from the moisture, etc. However, since the back surface of the driver IC chip 10 are pasted tightly onto the surface of the aluminum surface as described above, such protection resin must be coated carefully not to stick to the back surface.

After above processes have been completed, the flexible substrate 22 and the printed substrate 21 are stuck to each other such that both fitting holes 22*q*, 21*b* coincide with each other. At this time, the back surface of the driver IC chip 10 may be tightly contacted by using the same adhesive as that employed to stick the flexible substrate 22. However, sticking to the earth patterns 21f on the surface of the printed substrate 21 by the die bonding using the conductive adhesive, like the die bonding in the first embodiment, is superior in the electrical stability and is ideal.

In this manner, if the back surface of the driver IC chip 10 is tightly adhered and secured to the earth patterns 21f, radiation property from the driver IC chip 10 to the through holes 22*j* serving as the thermal via can be enhanced, and the module with the good heat radiation property can be achieved.

The electrical connection between the high voltage terminals 22*s* and the earth terminals 22*p* in the intermediate portion of the above flexible substrate 22 and the printed substrate 21 is conducted together with this adhesion. As the connecting method, in addition to the above conductive adhesive, the bumps, the anisotropic conductive film, or the like may be employed like the connection to the pad terminals 10*a*, otherwise the soldering by using the dedicated solder material for aluminum material may be employed, otherwise the pressure welding by using the high temperature and the high pressure may be employed.

After both substrates have been stuck as above, terminals of the flat cable 14 is soldered. The input signal wirings, the low voltage power supply wirings, and a part of earth wirings are connected to terminal portions of the input portion wirings 22f of the flexible substrate 22, then remaining part of the earth wirings are also connected to the earth terminals, which are connected to the earth wirings 21*d* on the printed substrate 21 side, as described above, and then the high voltage power supply wirings are directly connected to the high voltage power supply terminals which are connected to the high voltage power supply wirings 21*e* on the printed substrate 21 side.

Finally, the chip-like bypass capacitor 13*a* is soldered onto the lands which are provided to the low voltage power supply wirings 22*j* and the earth wirings 22*m* on the flexible substrate 22, and also the chip-like bypass capacitor 13*a* is soldered onto the lands which are formed on the high voltage power supply wirings 21*e* and the earth wirings 21*d* on the flexible substrate 21 and exposed from the opening portions of the flexible substrate 22, whereby all assembling steps can be completed.

As described above, in the driver IC packaging module shown in FIG. 26, since the mounting surface of the driver IC chip 10 on the aluminum substrate 18 and the exposed surfaces 22*e* of the output terminals on the flexible substrate can be set in the opposite direction, the module can be easily fitted to the frame 4 and thus the heat radiation efficiency is excellent, like the above-mentioned embodiments.

The flat cable 14 is connected to the bus substrate 8 via the connectors 7.

Figure 28A:
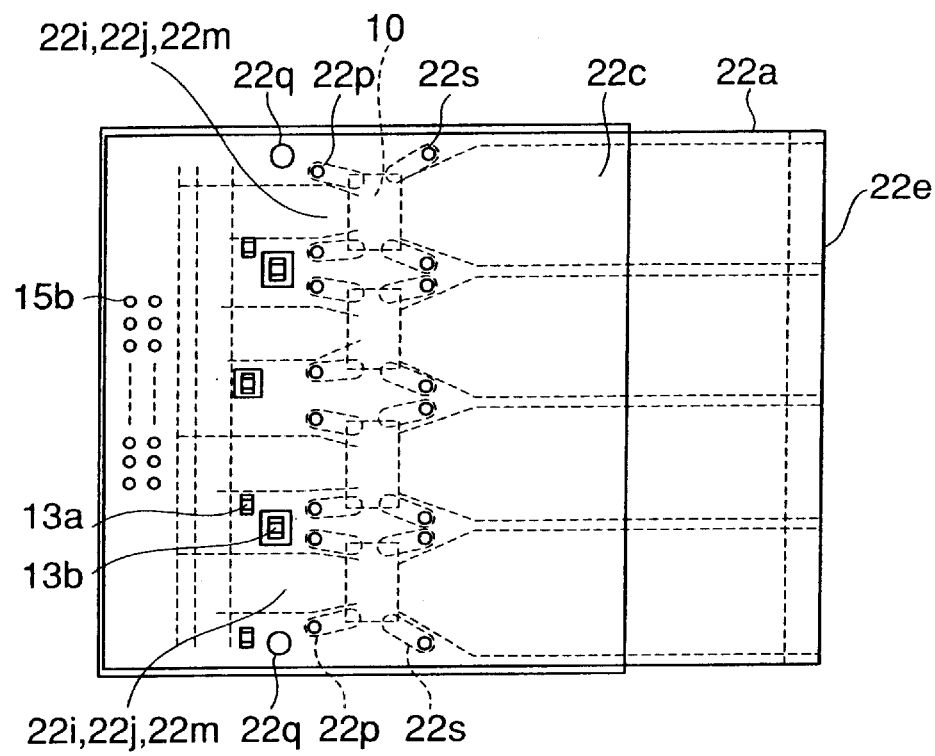
FIG. 28A is a plan view showing a second driver IC packaging module according to the fifth embodiment of the present invention.
Figure 28B:
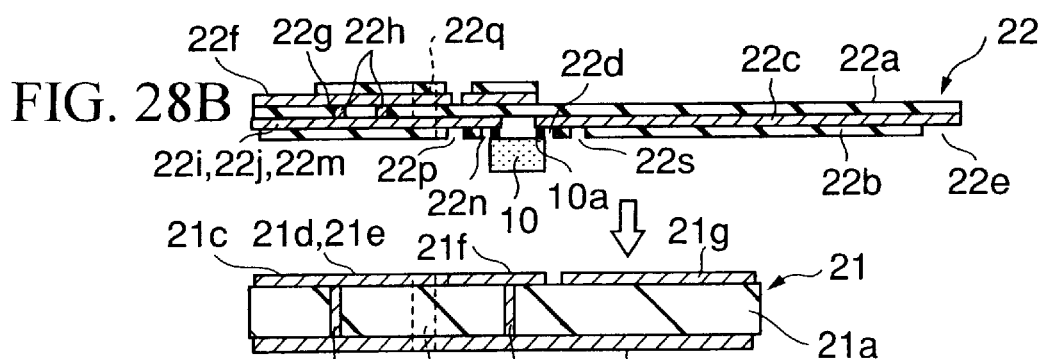
FIGS. 28B and 28C are sectional views showing the same.
Figure 28C:
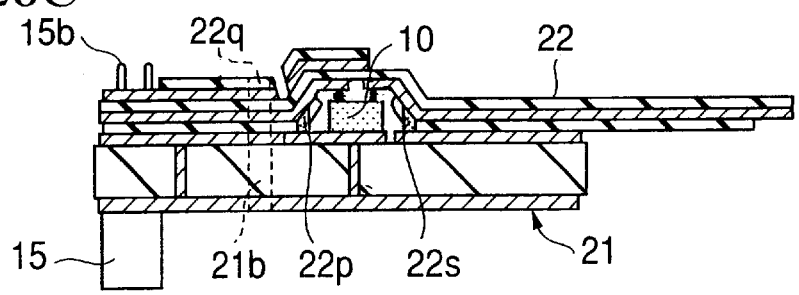

FIGS. 28A to 28C show a configuration in which a straight-type substrate-to-substrate connecting connector 15 is employed instead of the input flat cable 14. The connector 15 is mounted on the lower surface side of the printed substrate 21 and soldered such that connecting pins 15b are projected from the upper surface side of the printed substrate 21.

The connecting pins 15b for the input signal wirings, the low voltage power supply wirings, and a part of earth wirings are soldered to the terminals 22f of the flexible substrate 22, and the connecting pins 15b for the high voltage power supply wirings and the remaining part of the earth wirings are soldered to the terminals 21c on the printed substrate 21 side.

According to the driver IC packaging module shown in FIGS. 28A to 28C, the advantages similar to that in FIG. 26 can be achieved by connecting the module to the bus substrate 8 via the connector 15.

Although the flexible substrate having the multi-layered structure is adopted in the above driver IC packaging modules shown in FIGS. 26 and 28, the single layer structure may be used. Such single layer structure is shown in FIGS. 29A to 29C.

Figure 29A:
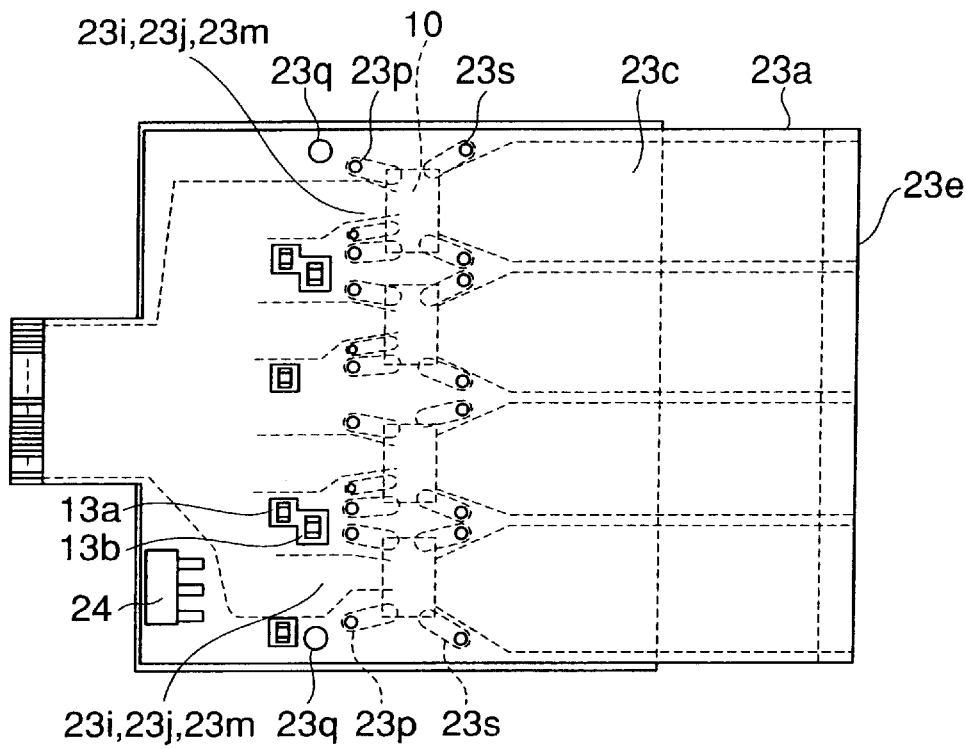
FIG. 29A is a plan view showing a third driver IC packaging module according to the fifth embodiment of the present invention.
Figure 29B:
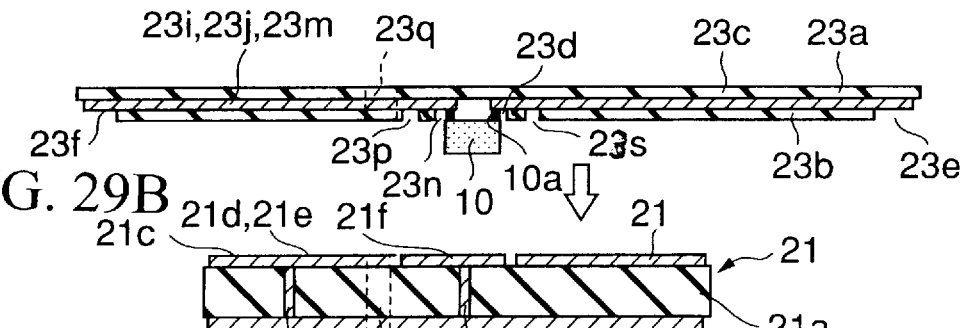
FIGS. 29B and 29C are sectional views showing the same.
Figure 29C:
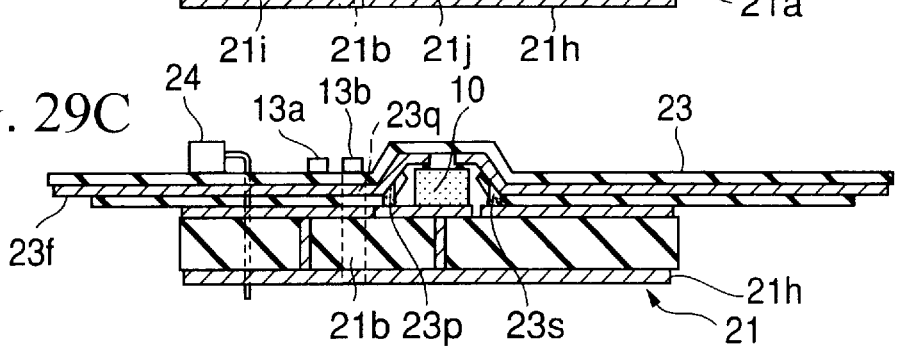

In FIGS. 29A to 29C, like FIG. 21, the input portion of the flexible substrate 23 is also used commonly as the input cable by such that such input portion of the flexible substrate 23, for example, the upper layer portion wirings 23i, 23j, 23m are projected outwardly from the input side end portion of the flexible substrate 23. Thus, top end portion terminals 23f are connected to the bus substrate 8 via the connector 15.

In this case, since only the limited number of the high voltage power supply wirings and the earth wirings can be provide by the input cable of the flexible substrate, another small size connector 24 is provided to the printed substrate 21 side and then the high voltage power supply wirings 21d and the earth wirings 21d of the printed substrate 21 are connected via the connector 24.

In FIG. 26, FIG. 28, and FIG. 29, the flexible substrates 22, 23 are shown to have such a structure that the input portion and the output portion are formed as a sheet of common substrate. However, the input portion and the output portion are formed as other separate substrates respectively, and then the flexible substrates 22, 23 can be constructed by combining the separate substrates together.

Sixth Embodiment

Figure 30A:
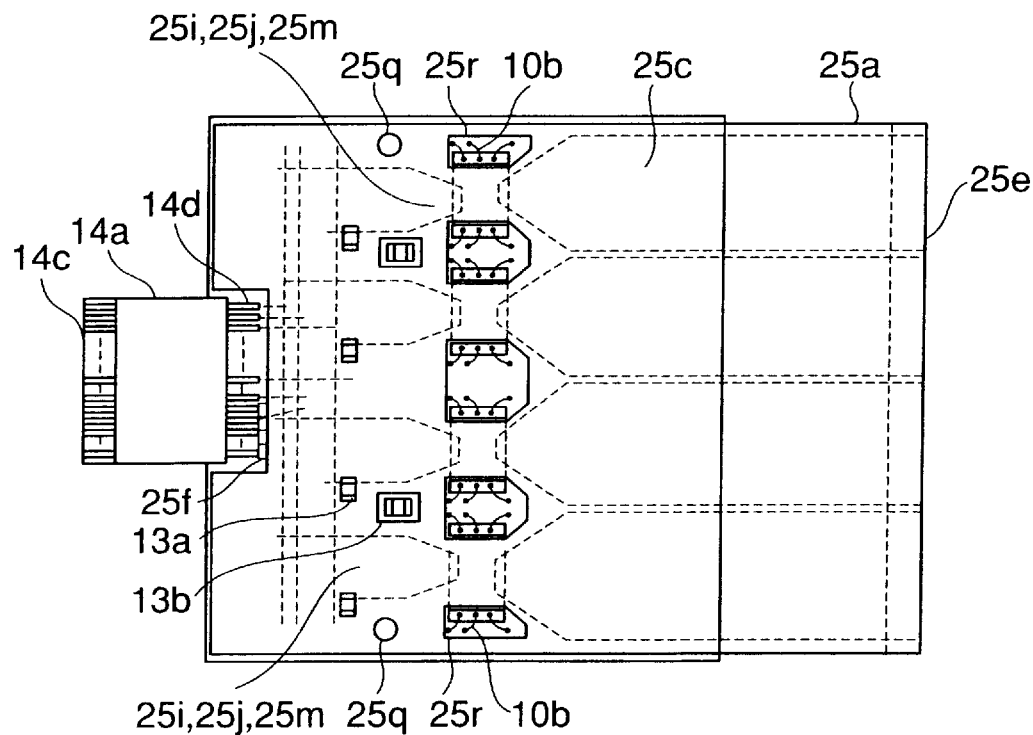
FIG. 30A is a plan view showing a driver IC packaging module according to a sixth embodiment of the present invention.
Figure 30B:
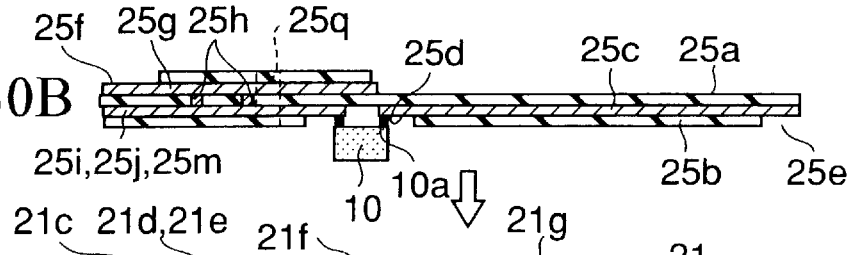
FIGS. 30B and 30C are sectional views showing the same.
Figure 30C:
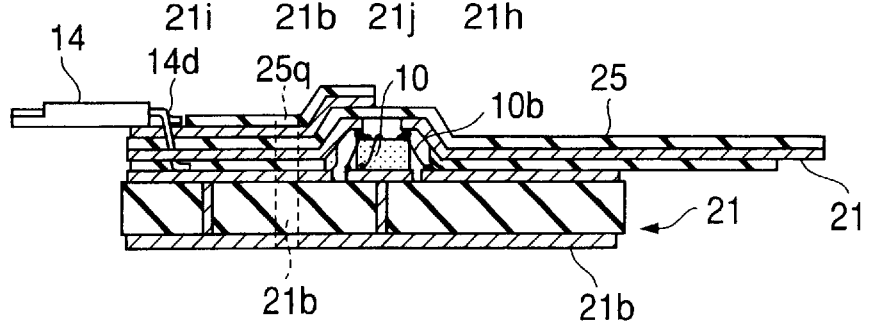

In the driver IC packaging module shown in FIG. 29 according to the fifth embodiment, the connection between the earth pattern 21f and the high voltage power supply pattern 21g on the printed substrate 21 and the corresponding pad terminals 10a of the driver IC chips 10 is accomplished by utilizing the earth terminals 23p and the high voltage terminals 23s provided on the flexible substrate 23 side. However, the present invention is not limited to such connection, the earth pattern 21f, etc. and the corresponding pad terminals 10a can be connected by using the wire bonding, as shown in FIGS. 30A to 30C, for example.

Since principal configurations of the printed substrate 21 and the flexible substrate 25 are the same as those of the fifth embodiment, their detail explanation will be omitted hereunder. In this case, references 25a, 25b, . . . , shown in FIGS. 30A to 30C denote identical elements which correspond to the references 22a, 22b, . . . , shown in FIGS. 26A to 26C.

A large difference resides in that opening portions 25r, which connect the earth pattern 21f and the high voltage power supply plane 21g on the printed substrate 21 and the corresponding pads 10a of the driver IC chip 10, are provided in areas of the flexible substrate 25, which are located on both side portions of the area, in which the driver IC chip 10 is arranged, of the flexible substrate 25.

After the flexible substrate 25 to which the driver IC chip 10 is connected has been stuck to the printed substrate 21, the wire bonding. between the earth pattern 21f and the high voltage power supply plane 21g on the printed substrate 21 and the corresponding pads 10a of the driver IC chip 10 can be carried out by providing the opening portions 25r.

The driver IC packaging module having the above configuration is. fitted onto the chassis 4 under the same situation as that shown in FIG. 12. That is, since the earth layer 21h on the back surface of the printed substrate 21 are secured to the second beam member 3 by the vires so as to directly contact to the second beam member 3, the heat generated by the driver IC chips 10 can be radiated to the chassis 4. In this case, the chassis 4 functions as the heat sink.

Seventh Embodiment

In the driver IC packaging modules shown in FIG. 9 according to the fifth embodiment, shown in FIGS. 17 and 18 according to the second embodiment, and shown in FIGS. 26 and 29 according to the fifth embodiment, if adhesiveness between lower surfaces of the earth planes 11m, 21h and the chassis 4 is degraded, the heat generated from the driver IC chip 10 cannot be radiated effectively to the outside.

Therefore, in the seventh embodiment, as shown in FIGS. 31A to 31E, a structure is adopted in which the lower surfaces of the earth planes 11m, 21h are lined with a metal plate 30 such as an aluminum plate having high thermal conductivity. The metal plate 30 is tightly contacted to the earth planes 11m, 21h by the thermal conductive adhesive, or the conductive adhesive.

Since such metal plate 30 is tightly adhered to the earth planes 11m, 21h by the adhesive, the heat generated from the driver IC chip 10 can be radiated effectively to the outside.

Figure 31A:
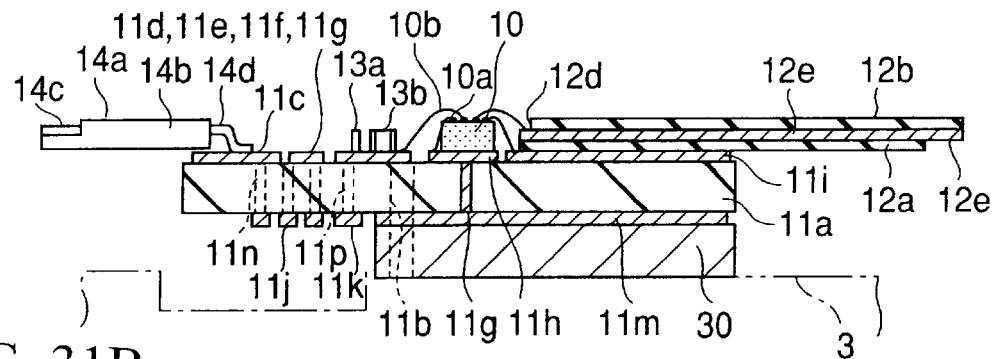
FIGS. 31A to 31E are sectional view showing a driver IC packaging module according to a seventh embodiment of the present invention.
Figure 31B:
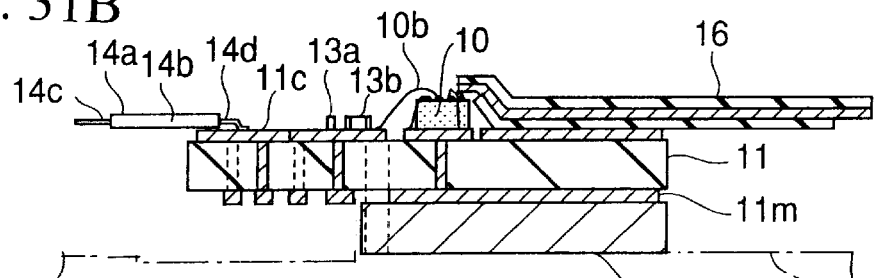
Figure 31C:
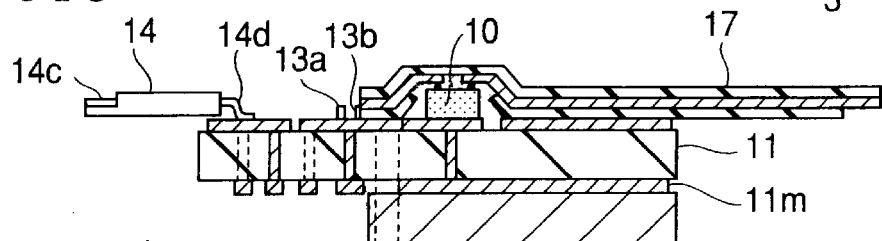
Figure 31D:
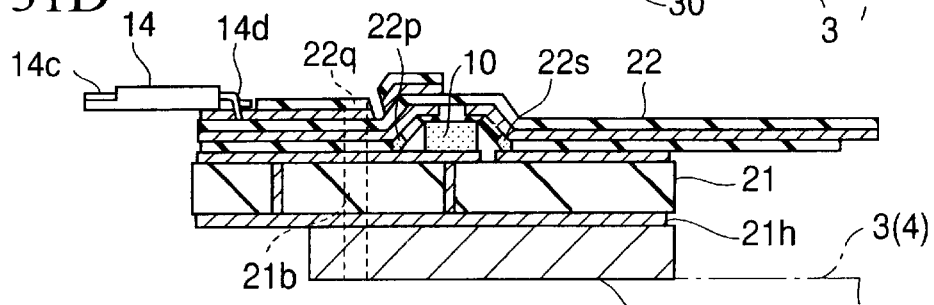
Figure 31E:
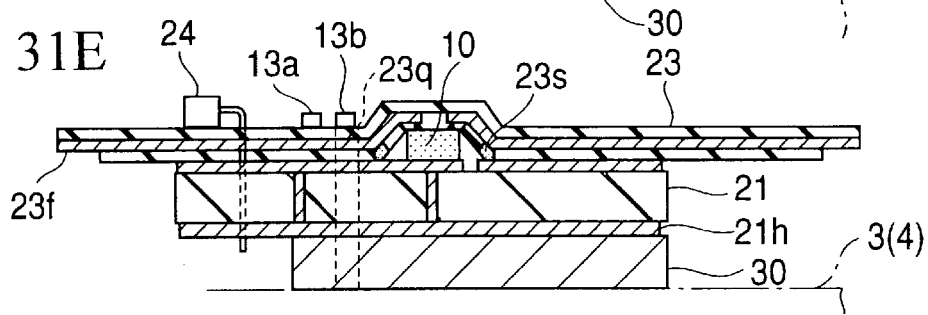

In this case, the module shown in FIG. 31A corresponds to the module shown in FIG. 9B, the module shown in FIG. 31B corresponds to the module shown in FIG. 17C, the module shown in FIG. 31C corresponds to the module shown in FIG. 18C, the module shown in FIG. 31D corresponds to the module shown in FIG. 26C, and the module shown in FIG. 31E corresponds to the module shown in FIG. 29C.

As indicated by a chain double-dashed line in FIGS. 31A to 31E, these metal plates 30 are fitted onto the beam members 3, 3b of the chassis 4 shown in FIGS. 12 and 14 and thus the heat being transmitted to the metal plates 30 can be radiated to the chassis 4.

In the first to seventh embodiments, the connection between the flexible flat cable (FFC) and the bus substrate is carried out via the connector. However, it is possible to adopt a structure in which the flexible flat cable and the bus substrate are connected by the soldering.

In addition, it is possible to adopt a structure in which an insulating protection film, e.g., a resist film for covering various wirings, various planes, etc. is formed on the upper surface and the lower surface of the printed substrate explained in the first, second, fifth to seventh embodiments.

In this case, the insulating protection film is removed partially from the electrical connection portions between various wirings, various planes, etc. on the printed substrate and the flexible substrate, the FFC, the driver IC chip s10, etc. Also, a part or all of the insulating protection film is removed from the contact areas between the printed substrate and the chassis.

In addition, it is possible to adopt a structure in which openings are formed in areas, which are located over the driver IC chips 10, of the flexible substrate in the second to seventh embodiments and then a resin for protecting the pad terminal connecting portions from the moisture, etc. can be supplied via the openings.

Eighth Embodiment

In the above embodiments, a structure to intersect a plurality of beam members is adopted as the chassis structure to which the driver IC packaging module is fitted. However, the present invention is not limited to such structure. For example, a structure shown in FIG. 32 may be employed in place of the above embodiments.

Figure 32:
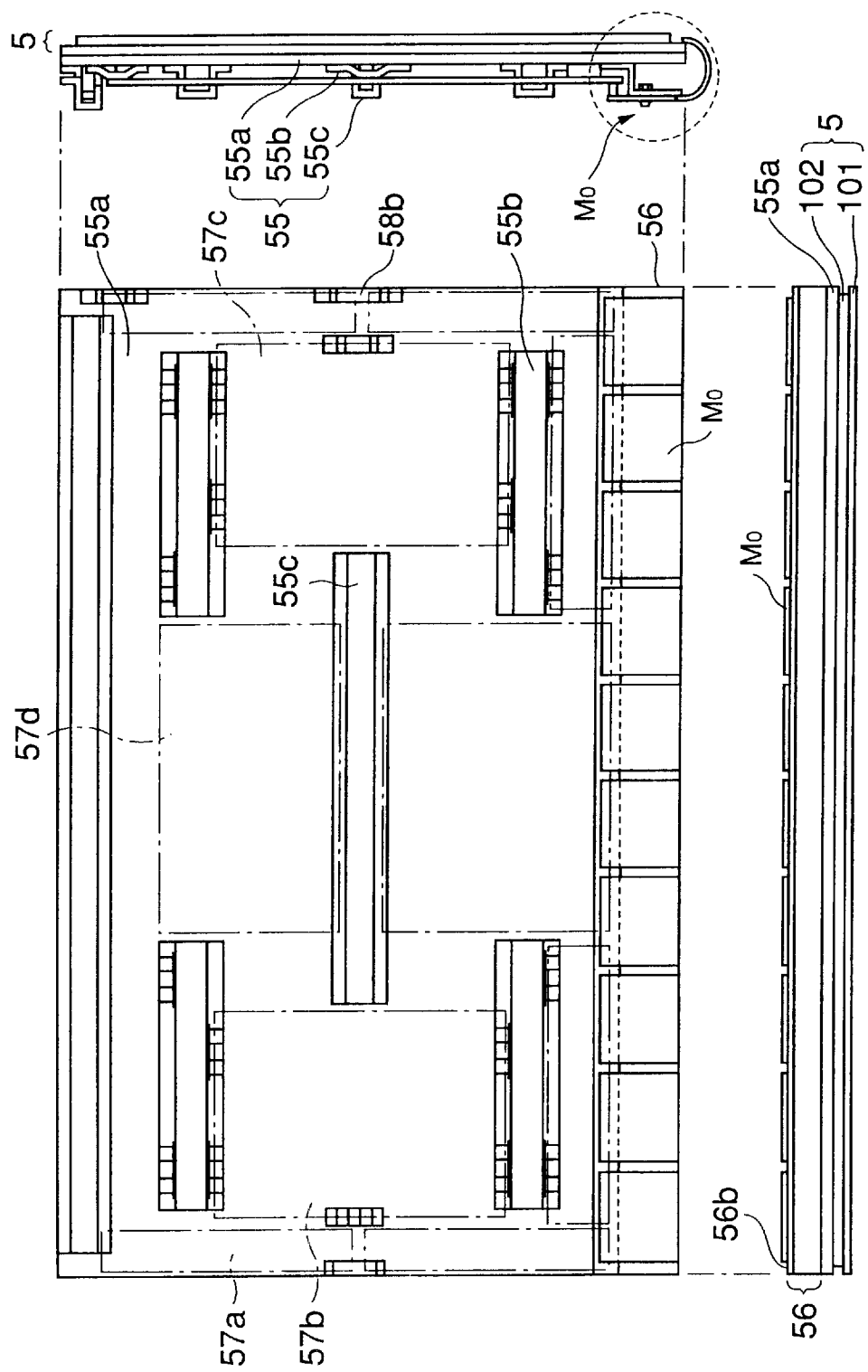
FIG. 32 is a rear view and a side view showing a display device according to an eighth embodiment of the present invention.

A chassis 55 of the PDP device shown in FIG. 32 has a flat metal plate 55a. The display panel is adhered to a front surface of the metal plate 55a, and beam members 55b, 55c having a hat-shaped sectional shape are fitted in parallel to plural locations of a back surface of the metal plate 55a to reinforce the metal plate 55a.

Also, a lower step portion 56a of a metal beam 56 which has a Z-shaped sectional shape (step-like shape) is fixed to one side portion of the back surface of the metal plate 55a by the caulking using TOX, HENROBRIVETS, etc., and the driver IC packaging module M0 is fitted to an upper step portion 56b of the metal beam 56.

A plurality of driver mounting substrates 57a to 57c, power supply substrate 57c, etc. are fitted between the beam members 55b and between the beam member 55b and the beam 56 to cross over them.

Figure 33:
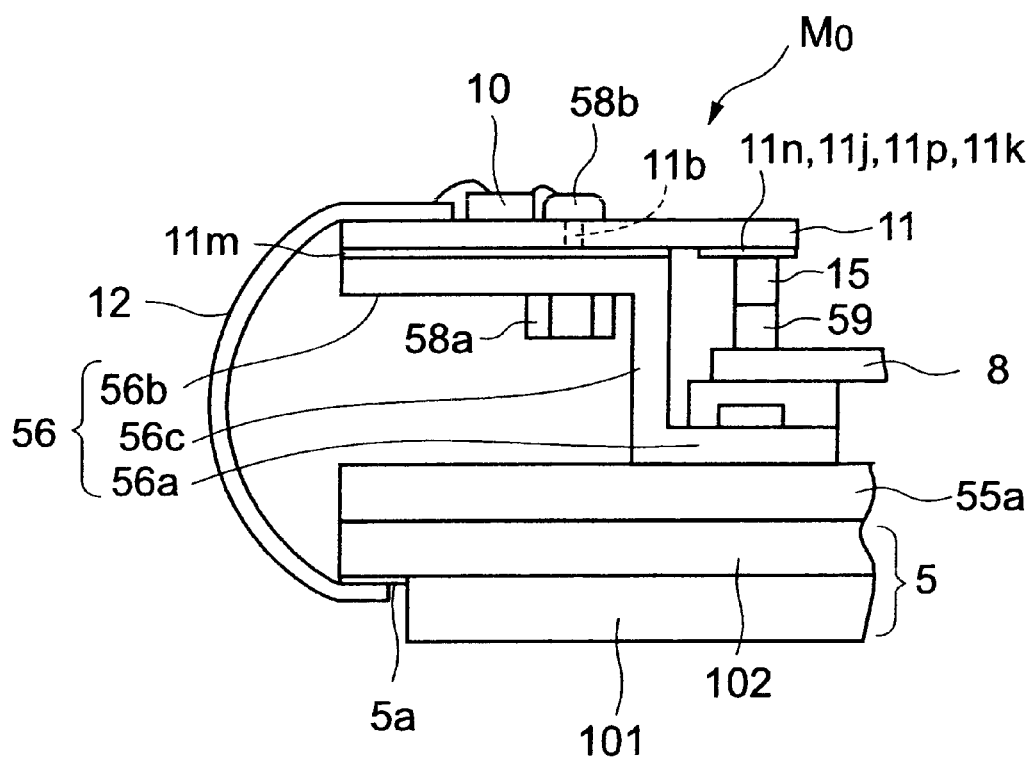
FIG. 33 is a sectional view showing the fitting state of the driver IC packaging module into the display device according to the eighth embodiment of the present invention.

If the structure shown in FIG. 10 is adopted as the driver IC packaging module M0, such driver IC packaging module M0 is fitted onto the upper step portion 56b of the metal beam 56 in the state shown in FIG. 33.

In FIG. 33, the upper step portion 56b of the metal beam 56 which is fitted to the metal plate 55a and has the Z-shaped sectional shape is floated from the metal plate 55a, and then the printed substrate 11 shown in FIG. 10 is mounted on the upper step portion 56b and held by the screws. More particularly, press nuts 58a are press-fitted to the back side of the upper step portion 56b of the metal beam 56, then the fitting holes 11b of the printed substrate 11 are aligned with the press nuts 58a, and then vires 58b are screwed in the press nuts 58a via the fitting holes 11b.

The earth planes 11m on the lower surface of the printed substrate 47 is brought into contact to the upper surface of the upper step portion 56b of the metal beam 56, while signal wirings 50e, power supply wirings 50f on the lower surface are positioned in areas which are out of the metal beam 56 to prevent short-circuit between the earth planes 11m and them.

The wirings 11n, 11j, 11p, 11k of the lower surface of the printed substrate 11 are connected to the bus substrate 8 via the connectors 15. The flexible wirings 12 connected to the printed substrate 11 are curved and then connected to the electrodes 5a on the rear glass substrate 102 of the display panel 5.

In the above-mentioned chassis 55, the heat generated from the driver IC chips 10 can be radiated to the outside via the printed substrate 11, the earth planes 11m, and the metal beam 56. In addition, the earth planes 11m can be held at the earth potential via the metal beam 56.

If the chassis 55 having the above-mentioned structure is employed, such chassis 55 can achieve the effect as the heat radiation and thermal diffusion plane for not only the heat generated from the driver IC chips 10 but also the heat generated from the display panel 5 and other driver circuit substrates. Therefore, since the thermal characteristic of the overall PDP device can be improved and the mechanical strength can be held by the metal beam 56, the thin structure having the sufficient mechanical strength can be accomplished.

It is possible to adopt a structure that the metal beam 56 having the above Z-shaped sectional shape is secured to the first beam member 2 of the chassis 4 shown in FIG. 11 by the caulking.

Ninth Embodiment

In the above eighth embodiment, the structure in which the printed substrate 11 of the driver IC packaging module M0 is fitted onto the chassis 55, 14 via the metal beam 56 having the above Z-shaped sectional shape has been explained.

The sectional shape of the metal beam 56 is not limited to the Z-shape sectional shape, and may have a structure described in the following.

Figure 34:
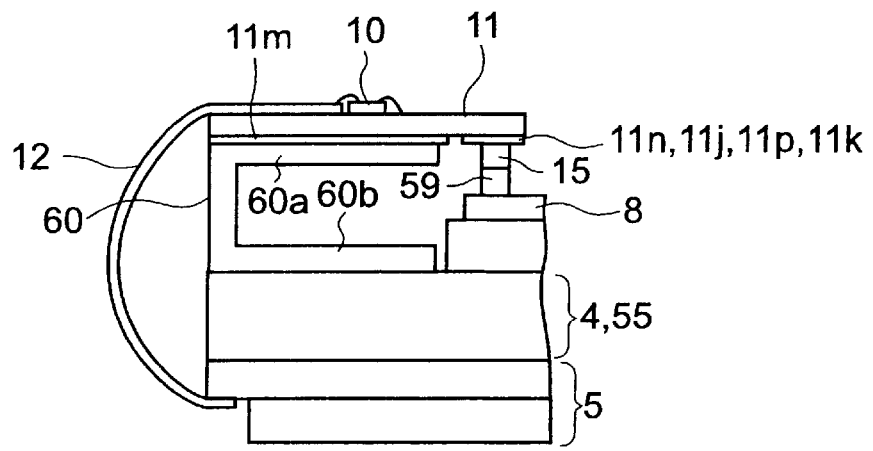
FIG. 34 is a side view showing a first example of a beam which is fitted to a chassis of a display device according to a ninth embodiment of the present invention.

For example, as shown in FIG. 34, a beam 60 has a U-shaped sectional shape (groove shape). The beam 60 has an upper portion 60a and a lower portion 60b which oppose to each other. The lower portion 60b is secured to the chassis 4, 55 side, and the printed substrate 11i s fitted onto the upper portion 60a. In this case, the printed substrate 11 is fixed to the beam 60 by the screws (not shown), etc. such that only the earth planes 11m on the lower surface of the printed substrate 11 can come into contact to the beam 60.

The metal beam 56 having the Z-shaped sectional shape shown in FIG. 33 and the beam 60 having the U-shaped sectional shape shown in FIG. 34 can be formed by folding the flat metal plate respectively.

Figure 35:
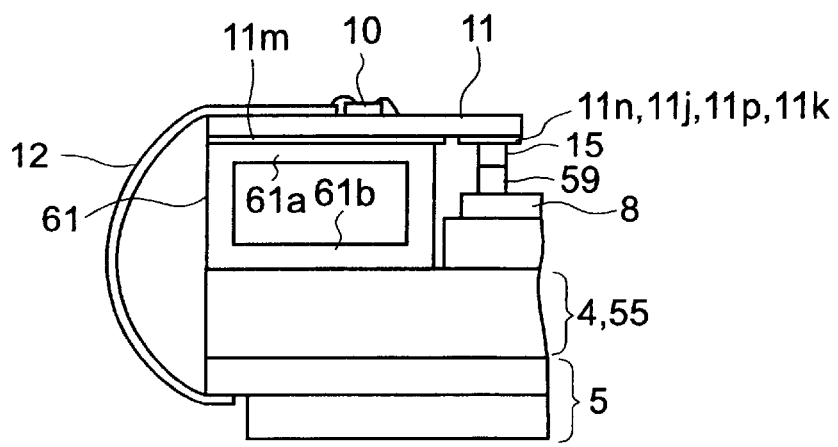
FIG. 35 is a side view showing a second example of the beam which is fitted to the chassis of the display device according to the ninth embodiment of the present invention.
Figure 36:
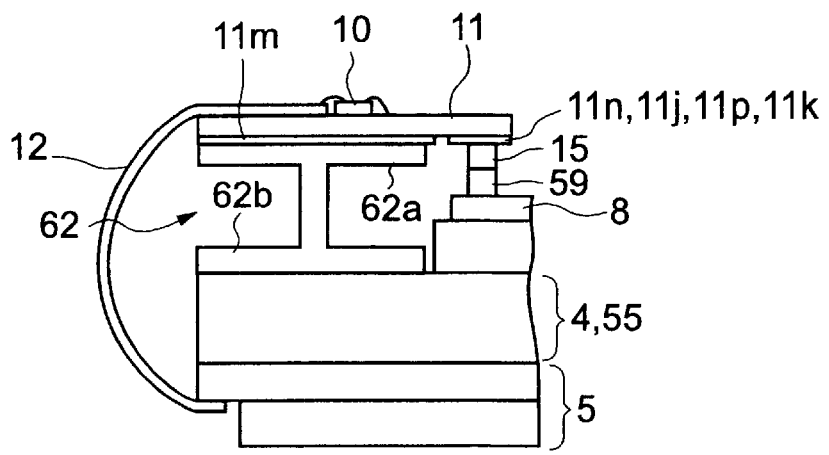
FIG. 36 is a side view showing a third example of the beam which is fitted to the chassis of the display device according to the ninth embodiment of the present invention.
Figure 37:
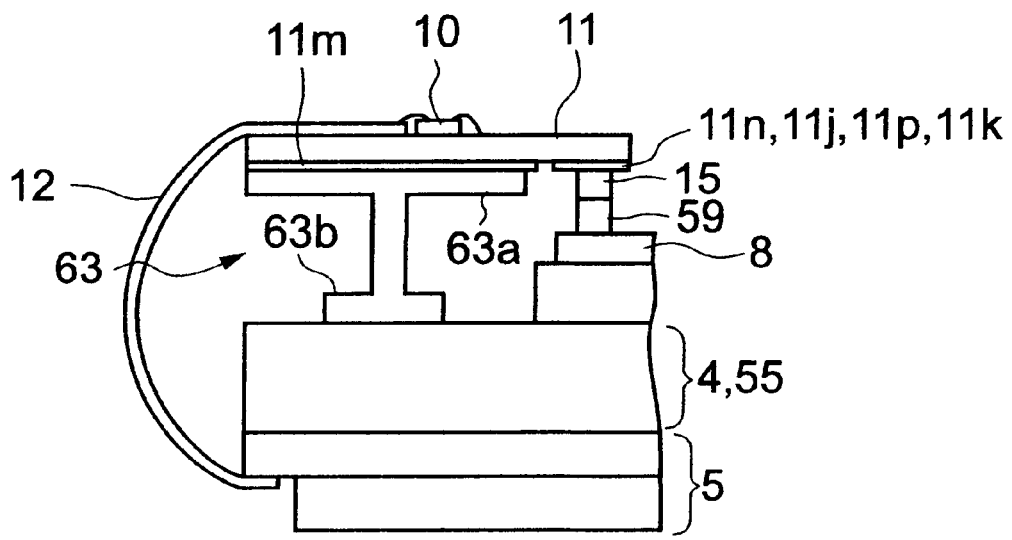
FIG. 37 is a side view showing a fourth example of the beam which is fitted to the chassis of the display device according to the ninth embodiment of the present invention.
Figure 38:
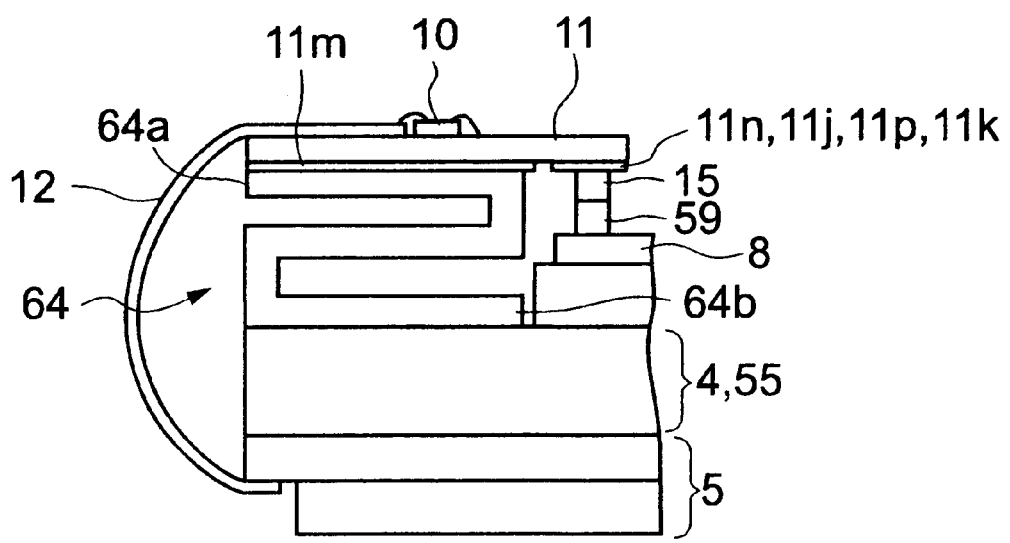
FIG. 38 is a side view showing a fifth example of the beam which is fitted to the chassis of the display device according to the ninth embodiment of the present invention.

As the beam having other structure, there are a beam 61 having a square-pipe sectional shape shown in FIG. 35, a beam 62 having an H-shaped sectional shape shown in FIG. 36, a beam 63 having a T-shaped sectional shape shown in FIG. 37, a beam 64 having a 11p Z-shaped sectional shape shown in FIG. 38, etc.

In these beams 62 to 64, upper portion 62a to 64a to which the printed substrate 47 is fitted and lower portions 62b to 64b which are fitted onto the chassis 14, 55 are present. The upper portion 62a to 64a and the lower portions 62b to 64b are directed in parallel mutually.

The beams 61 to 64 shown FIGS. 35 to 38 are formed by the extrusion. Lower portions 61b to 64b of these beams 61 to 64 are secured to the chassis 4, 55 by the caulking using TOX, HENROBRIVETS, etc. The printed substrate 11 is fixed to upper portions 61a to 64a of the beams 61 to 64 by the press nuts (not shown) and the screws (not shown). The earth planes 11m on the lower surface of the printed substrate 11 come directly into contact to the upper portions 61a to 64a of the beams 61 to 64.

If a space necessary for the caulking or the press fitting of the press nuts cannot be assured because of difference in the shapes of the beams 61 to 64, a method of fixing the printed substrate 11 by ordinary screws and nuts or nuts using SELSTUD may be adopted.

Figure 39:
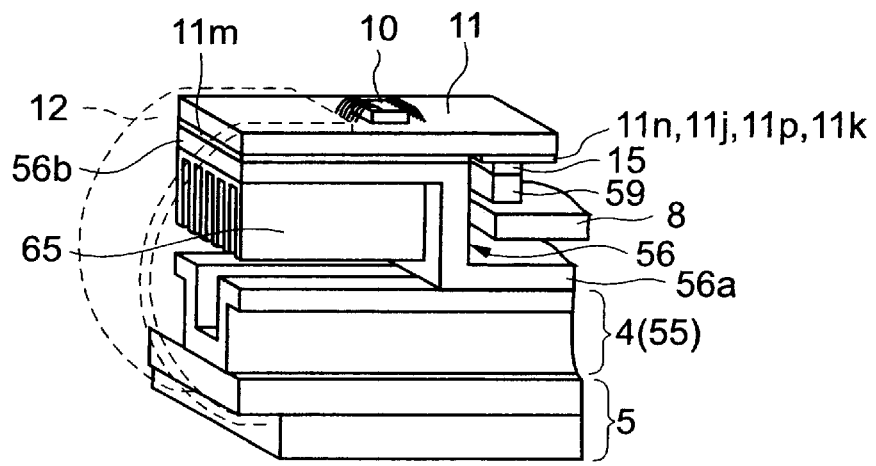
FIG. 39 is a perspective view showing a sixth example of the beam which is fitted to the chassis of the display device according to the ninth embodiment of the present invention.

FIG. 39 shows a structure in which a radiation fin 65 is fitted onto the lower surface of the upper step portion 56b of the beam which has the Z-shaped sectional shape. Countersinks (not shown) for flat countersink machine screws are formed in the upper step portion 56a, and screwed holes (not shown) are formed in the radiation fin 65 at locations corresponding to the countersinks. Then, the screws are fitted into the screwed holes of the radiation fin 65 through the countersinks in the upper step portion 56b of the beam 56. If cross-recessed pan-head machine screws which are widely used normally are used as the screws, head portions are protruded from the upper surface. Therefore, the earth patterns on the printed substrate cannot be brought into contact to the upper surface, and thus it is indispensable to use the pan-head machine screws.

According to the beam 56 to which the radiation fin 65 is attached, since the heat generated from the driver IC chip 10 can be radiated positively into the air by the radiation fin 65, the better heat radiation effect can be achieved rather than the case where only the beam 56 is used.

Figure 40:
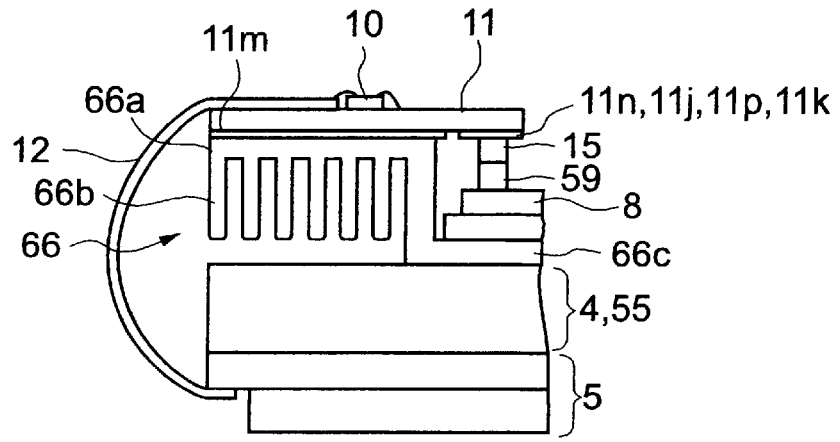
FIG. 40 is a side view showing a seventh example of the beam which is fitted to the chassis of the display device according to the ninth embodiment of the present invention.

FIG. 40 shows a structure in which comb-like projections 66b are formed on the lower surface of the upper portion 66a of the beam 66 which has the Z-shaped sectional shape. The projections 66b and the beam 66 are formed integrally by the extrusion. The comb-like projections 66b has the same heat radiation effect as the radiation fin 65 in FIG. 41, nevertheless the time and labor can be saved in manufacturing because the screw fitting can be omitted. The lower step portion 66c of the beam 66 is secured to the chassis 4, 55.

Figure 41:
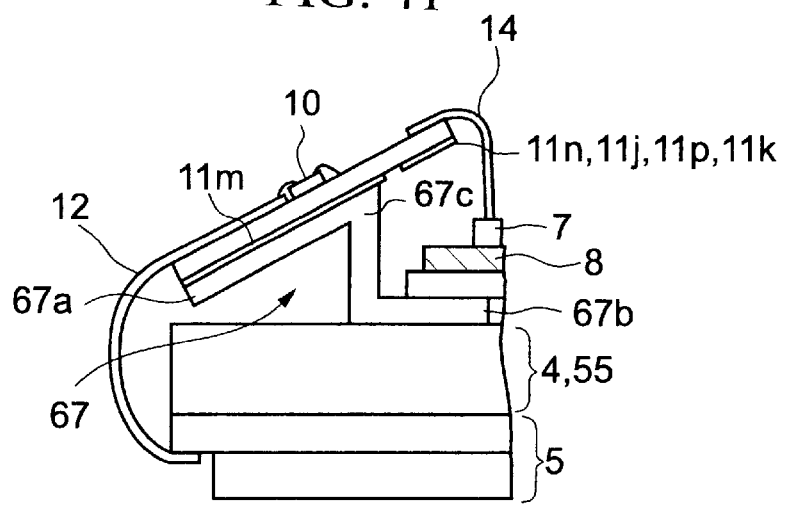
FIG. 41 is a side view showing an eighth example of the beam which is fitted to the chassis of the display device according to the ninth embodiment of the present invention.

FIG. 41 shows a structure in which a part of the beam 67 which has the Z-shaped sectional shape is folded at an acute angle. On intermediate portion 67c for connecting the upper step portion 67a and the lower step portion 67b is set vertically relative to the lower step portion 67b, and the upper step portion 67a is folded to have an acute angle less than 90 degree relative to the intermediate portion 67c. Accordingly, if the printed substrate 11 shown in FIG. 9 is fitted to the upper surface of the upper step portion 67a in the situation that the lower step portion 67b is secured to the chassis 14, 55, the printed substrate 11 is inclined toward the display panel side according to the inclination of the upper step portion 67a such that the flexible substrate 12 on the output side of the driver IC packaging module comes close to the display panel 5.

As a result, since a length of the flexible substrate 12 of the driver IC packaging module may be reduced rather than the fifth embodiment, a cost of the driver IC packaging module per se can be lowered.

In this case, as for the input portion of the driver IC packaging module shown in FIG. 41, a method of connecting the bus substrate 8 acting as a supply source of the electric signals and the power supply voltages by using the cable such as the FFC 14, etc., the connectors 7, the soldering, or the like is adopted.

Tenth Embodiment

In a tenth embodiment, the chassis of the PDP device and the beam on which the driver IC packaging module is mounted are formed integrally.

Figure 42:
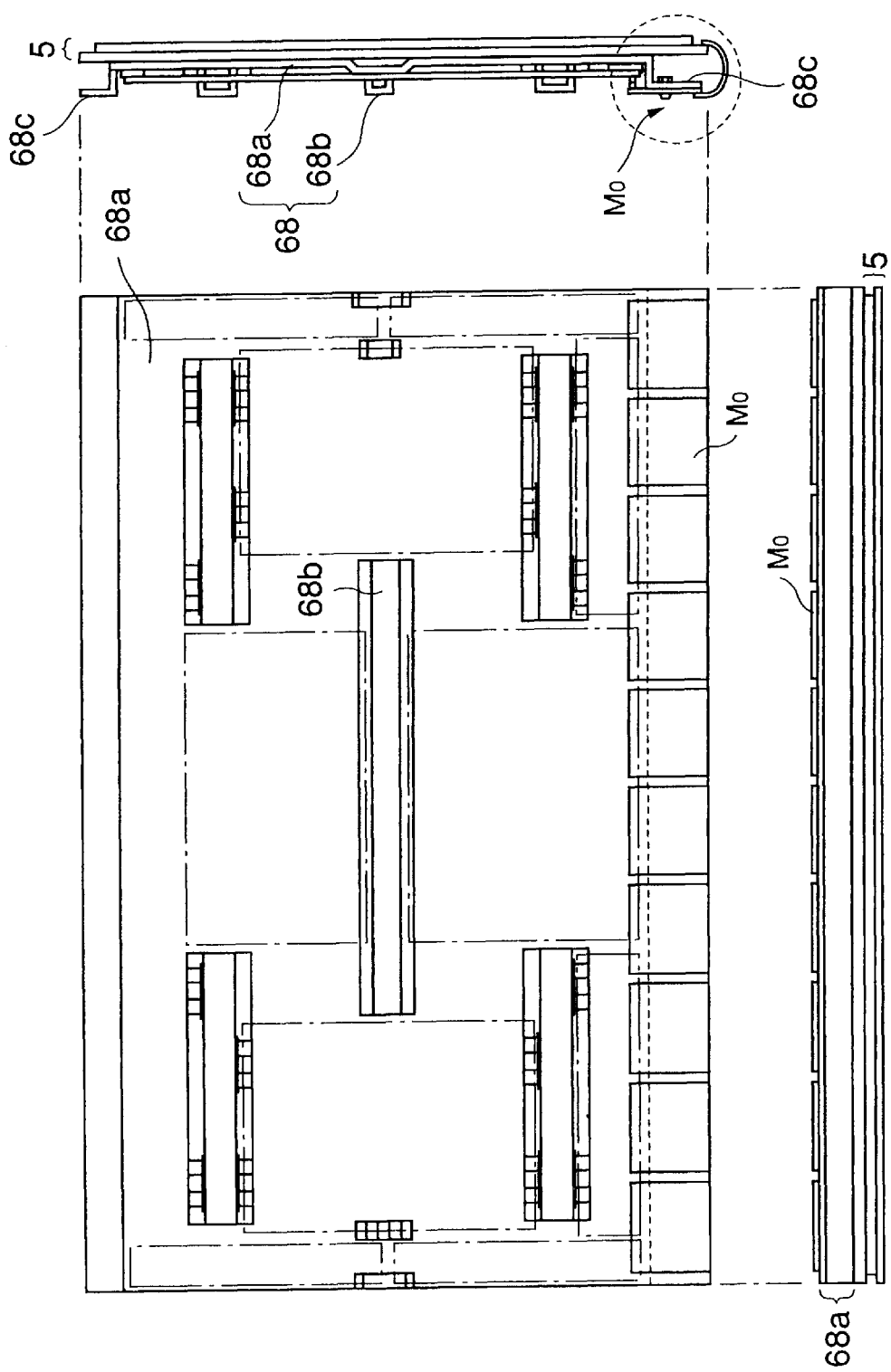
FIG. 42 is a rear view and a side view showing a display device according to a tenth embodiment of the present invention.

FIG. 42 is a rear view and a side view showing the PDP device according to the tenth embodiment of the present invention.

A chassis 68 used in the PDP device has a metal plate 68a which is pasted on the whole back surface of the display panel 5, and a plurality of beam members 68b having the hat-like sectional shape are secured in parallel to the rear surface of the metal plate 68a. Then, both side portions of the metal plate 68a are folded like the Z-shaped sectional shape, and the upper step portion of the Z-shaped sectional shape serves as the module mounting portion 68c to which the printed substrate 11 of the driver IC packaging module shown in FIG. 10, for example, is mounted.

Figure 43:
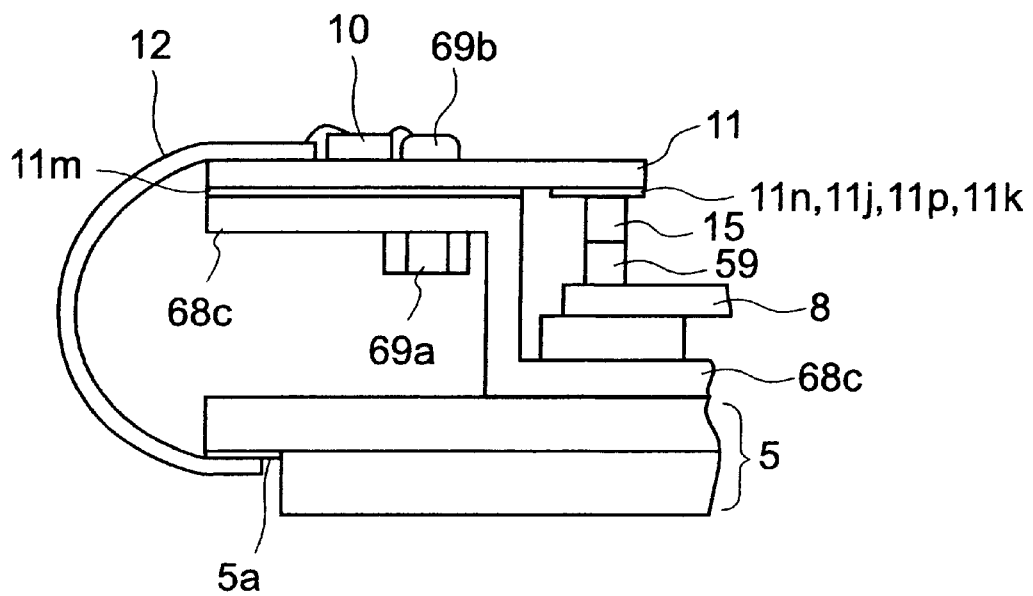
FIG. 43 is sectional view showing the fitting state of the driver IC packaging module into the display device according to the tenth embodiment of the present invention.

As shown in FIG. 43, the printed substrate 47 of the driver IC packaging module M0 is secured onto the top surface of the module mounting portion 68c by the screws.

The press nuts 69a are press-fitted to the module mounting portion 68c from the back side to mate with the fitting holes 11b of the printed substrate 11 of the driver IC packaging module, then the screws 69b are fitted into the press nuts 69a through the fitting holes 11b of the printed substrate 11.

The connection between the flexible substrate 12 of other driver IC packaging modules and the display panel 15 and the connection between the wirings 11n, 11j, 11p, 11k on the input side of the printed substrate 11 and the bus substrate 8 are conducted by the same method as those in the above embodiments.

If the PDP device having the above-mentioned structure is employed, the module mounting portion 68c constituting a part of the chassis 68 can achieve the effect as the heat radiation and thermal diffusion plane for not only the heat generated from the driver IC chips 10 but also the heat generated from the display panel 5 and other driver circuit substrates and therefore the thermal characteristic of the overall PDP device can be improved. In addition, since the metal plate 68a and the module mounting portion 68c are formed integrally while holding the mechanical strength, the thinner structure than those in the above embodiments can be accomplished.

Figure 44:
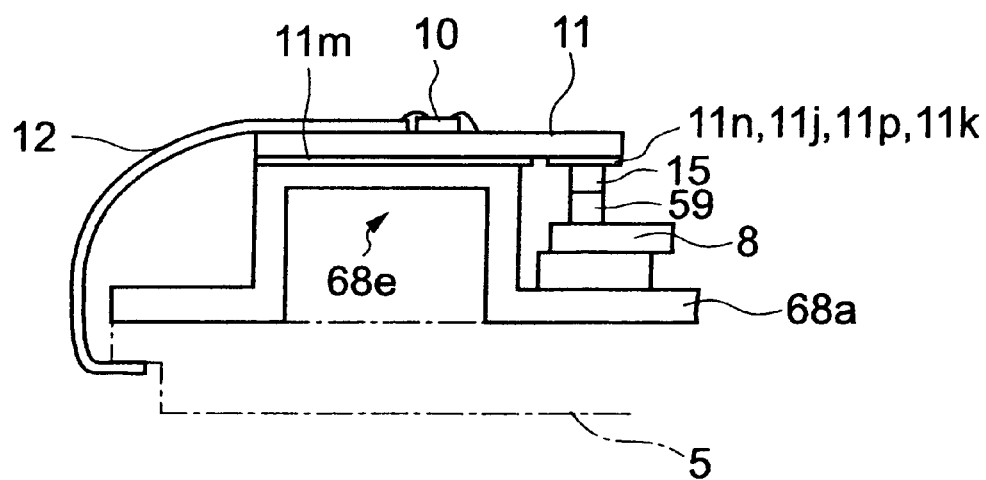
FIG. 44 is a side view showing a first example of a beam which is integrated with a chassis of a display device according to the tenth embodiment of the present invention.
Figure 45:
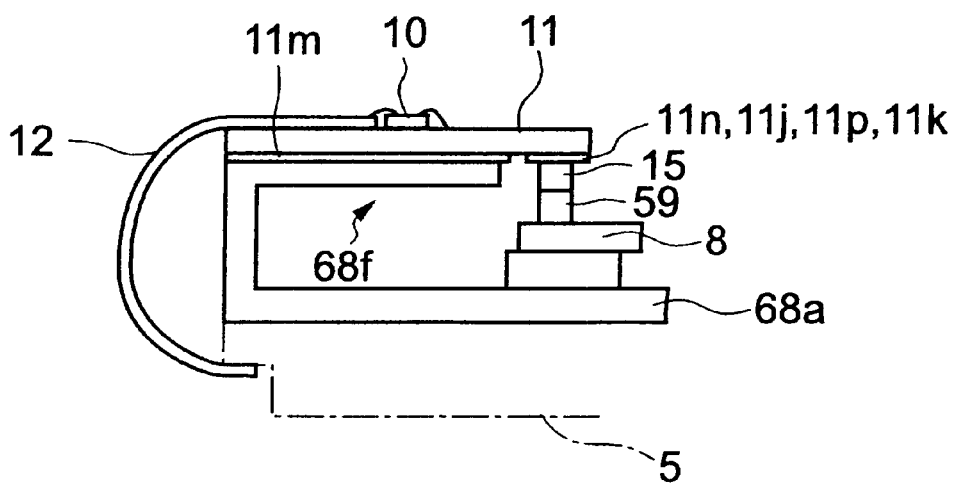
FIG. 45 is a side view showing a second example of the beam which is integrated with the chassis of the display device according to the tenth embodiment of the present invention.
Figure 46:
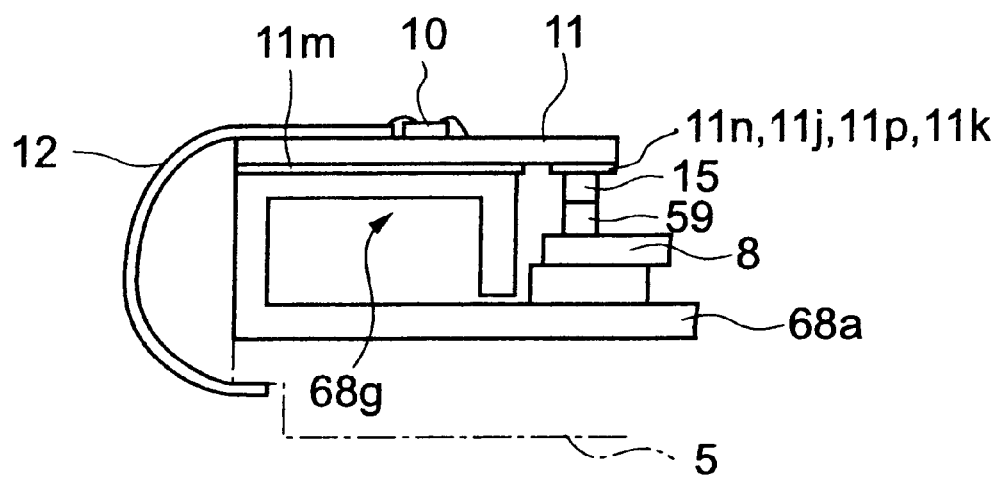
FIG. 46 is a side view showing a third example of the beam which is integrated with the chassis of the display device according to the tenth embodiment of the present invention.
Figure 47:
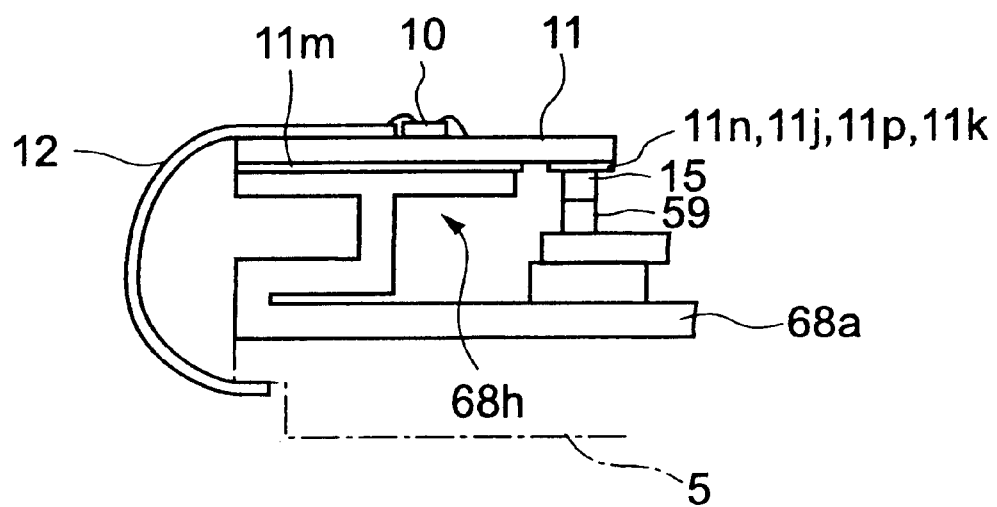
FIG. 47 is a side view showing a fourth example of the beam which is integrated with the chassis of the display device according to the tenth embodiment of the present invention.
Figure 48:
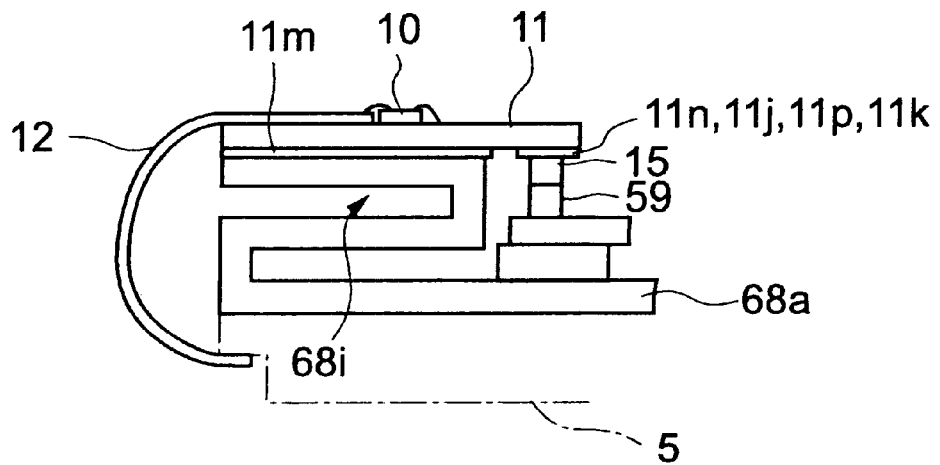
FIG. 48 is a side view showing a fifth example of the beam which is integrated with the chassis of the display device according to the tenth embodiment of the present invention.
Figure 49:
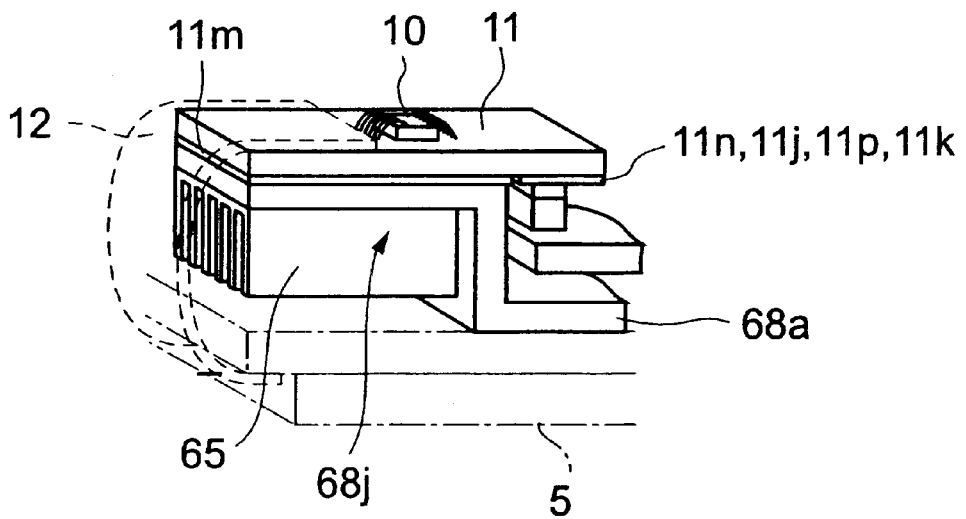
FIG. 49 is a perspective view showing a sixth example of the beam which is integrated with the chassis of the display device according to the tenth embodiment of the present invention.
Figure 50:
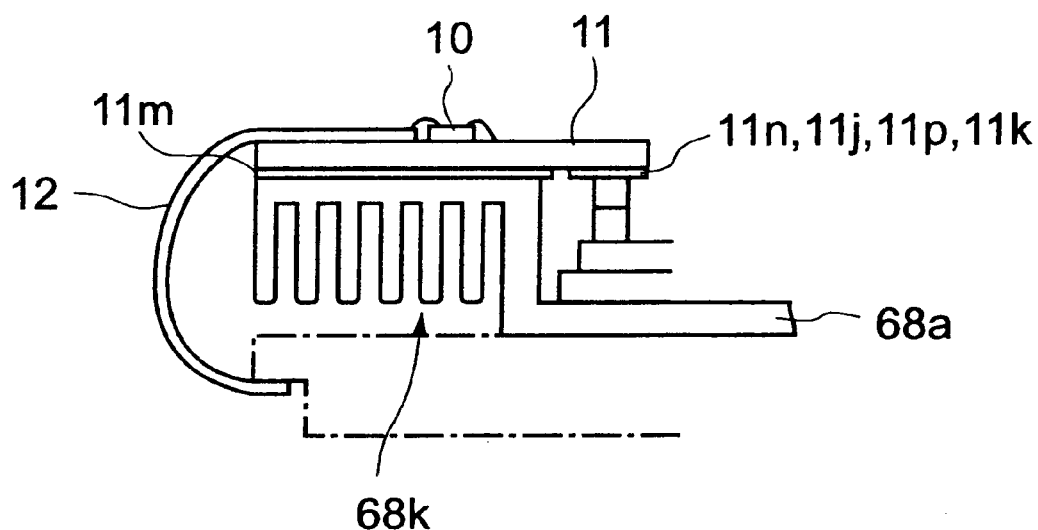
FIG. 50 is a side view showing a seventh example of the beam which is integrated with the chassis of the display device according to the tenth embodiment of the present invention.
Figure 51:
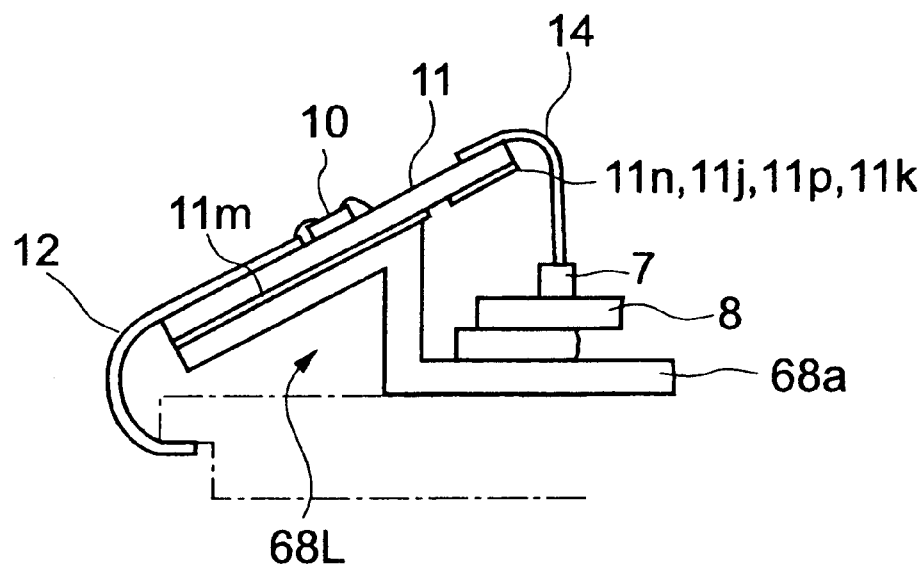
FIG. 51 is a side view showing an eighth example of the beam which is integrated with the chassis of the display device according to the tenth embodiment of the present invention.

Meanwhile, as the folding shape of the metal plate 68a to form the module mounting portion 68c on both sides of the metal plate 68a constituting the chassis 68, various shapes explained in the sixth embodiment may be adopted in addition to the Z-shaped sectional shape. That is, the hat-shaped module mounting portion 68e shown in FIG. 44, the U-shaped module mounting portion 68f shown in FIG. 45, the square-shaped module mounting portion 68g shown in FIG. 46, the H-shaped module mounting portion 68h shown in FIG. 47, the 11p Z-shaped module mounting portion 68i shown in FIG. 48, the Z-shaped module mounting portion 68j shown in FIG. 49 in which the heat radiation fin 65 is arranged on the back surface of the fitting surface of the printed substrate 47, the Z-shaped comb-type module mounting portion 68k having the shown in FIG. 50, and the acute Z-shaped module mounting portion 68l shown in FIG. 51 may be employed. Since the fitting of the driver IC packaging module M0 onto these module mounting portions 68e to 68k is similar to the sixth embodiment, its detailed explanation will be omitted.

Eleventh Embodiment

In the driver IC packaging modules in the above embodiments, the printed substrates having the structure in which various conductive wirings and various conductive planes are formed on the upper surface and the lower surface and are connected via the through holes are employed, or the printed substrates having the multi-layered wiring structure are employed.

Figure 52:
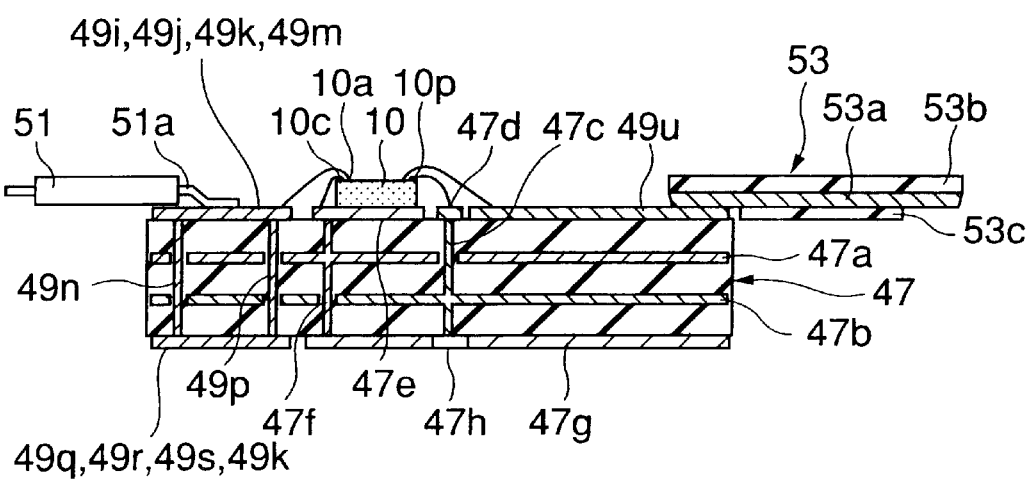
FIG. 52 is a sectional view showing a driver IC packaging module according to an eleventh embodiment of the present invention.

However, besides the driver IC packaging modules having such structures, such a structure may be employed that a driver IC packaging module having a new COB structure, as shown in FIG. 52, is fitted onto the chassis 4 of the display panel.

In FIG. 52, an intermediate earth pattern 47a and an intermediate high voltage power supply pattern 47b are formed in the inside of the printed substrate 47. The intermediate earth pattern 47a is connected to a high voltage power supply pattern 47d on the upper surface via a first through hole 47c in the printed substrate 47. The intermediate high voltage power supply pattern 47b is formed on the output side of a die bonding pattern 47e which is formed in a central area of the upper surface of the printed substrate 47, and is connected to a high voltage pad 10p of the driver IC chip 10 on the die bonding pattern 47e by the wire bonding.

A second through hole 47f is formed in the inside of the printed substrate 47. The die bonding pattern 47e and the earth plane 47g on the lower surface of the printed substrate 47 are connected electrically mutually via the second through hole 47f and the intermediate earth pattern 47a.

The die bonding pattern 47e is connected to the earth pads 10c on the driver IC chip 10 by the wire bonding. The first through hole 47c and an opening 47h are formed in the earth plane 47g, whereby short-circuit between the earth plane 47g and the intermediate high voltage power supply pattern 47b can be prevented.

Also, first signal wirings 49i, first high voltage power supply wirings 49j, first earth wirings 49k, and first low pressure power supply wirings 49m are formed on the input side of the upper surface of the printed substrate 47. These wirings are connected to second signal wirings 49q, second high voltage power supply wirings 49r, second earth wirings 49s, and second low pressure power supply wirings 49t on the lower surface of the printed substrate 47 via through holes 49n, 49p.

Wirings 51a of the FFC 51 are directly connected to respective input terminals of the first signal wirings 49i, the first high voltage power supply wirings 49j, the first earth wirings 49k, and the first low pressure power supply wirings 49m. The pads 10a of the driver IC chip 10 are connected to their output terminals by the wire bonding.

The FFC 51 is connected to the bus substrate 8 via the connectors 7.

In addition, output wirings 49u are provided on the output end side of the printed substrate 47, and input end areas of the wirings 53a of the flexible substrate 53 are connected to the upper surfaces of the output wirings 49u via the conductive adhesive. The wirings 53a of the flexible substrate 53 are put between first and second insulating films 53b, 53c, and input ends and output ends of the wirings 5a are exposed in the same direction. That is, the input ends and the output ends of the wirings 5a are directed oppositely to the driver IC chip 10 mounting surface of the printed substrate 47.

Also, the output wirings 52 and the pads 10a of the driver IC chip 10 are connected by the wire bonding.

The foregoing driver IC packaging module has the new COB structure that the wirings 49q, 49r, 49s, 49t for supplying the input signal, or the power supply voltages, the earth voltage are provided in the input signal portion side of the lower surface of the printed substrate 47, and only the earth plane 49g is provided in the output signal portion.

Figure 53:
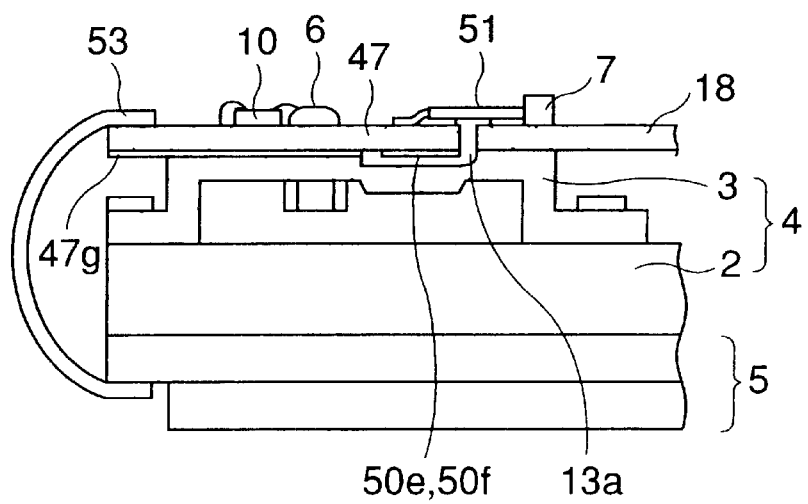
FIG. 53 is a sectional view showing the fitting state of the driver IC packaging module according to the eleventh embodiment of the present invention into the display device.

Accordingly, the fitting of the driver IC packaging module onto the chassis 4 of the PDP device shown in FIG. 11 is performed by fixing the module by the vires 6 as shown in FIG. 53, and then adhering the earth plane 49g to the chassis 4 via the conductive adhesive, etc. so as to face the wirings 49q, 49r, 49s, 49t to the concave portions 3a of the beam member 3 in a non-contact condition.

Therefore, the heat generated by the driver IC chip 10 can be discharged to the chassis 4 via the printed substrate 47 having the high thermal conductivity and the earth plane 47g. In addition, the earth plane 47g on the lower surface of the printed substrate 47 can be kept at the earth potential via the chassis 4.

In the above driver IC packaging module, since the wirings are formed as the three-dimensional wiring structure by using patterns on the upper surface, the lower surface, and the intermediate surface of the printed substrate and the through holes, the printed substrate 47 can be secured stably to the chassis 4 with reducing the wiring area on the input side and increasing the contact area between the printed substrate 47 and the chassis 4.

Twelfth Embodiment

In the above first to eleventh embodiments, the cases have been explained where the driver IC module having the structure in. which the driver IC mounting surface of the printed substrate and the exposed direction of the output wiring ends of the flexible substrate are directed oppositely is employed.

Figure 5A:
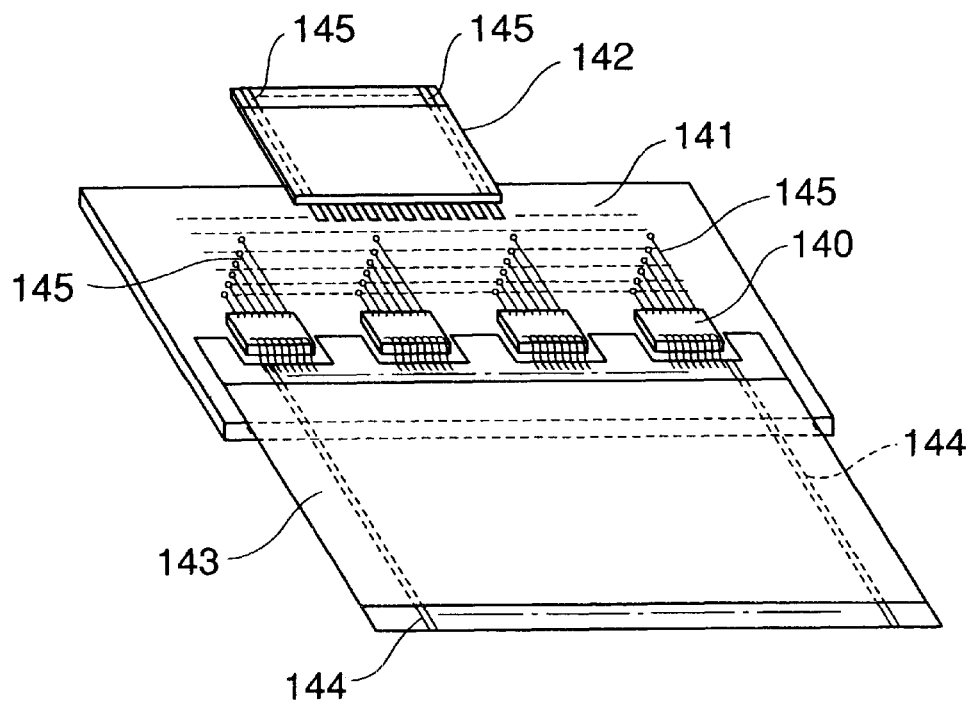
FIG. 5A is a perspective view showing a driver IC packaging module having a COM structure in the prior art.
Figure 5B:
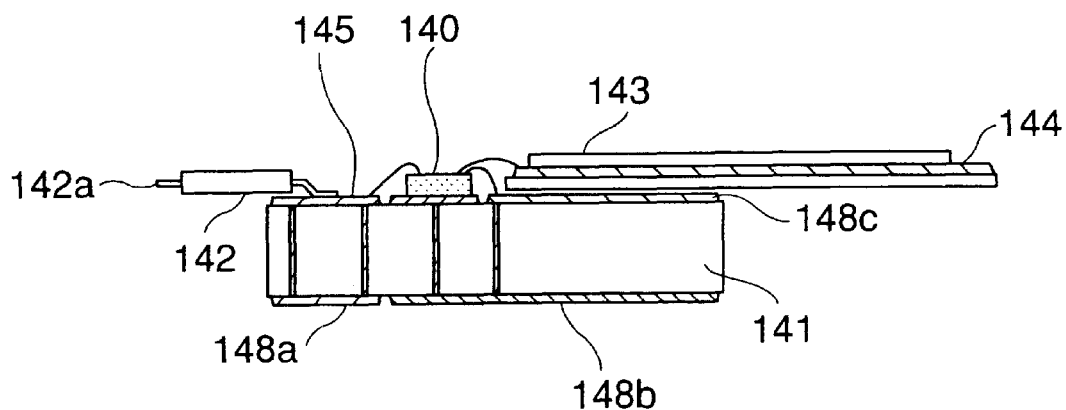
FIG. 5B is a sectional view showing the same.
Figure 6:
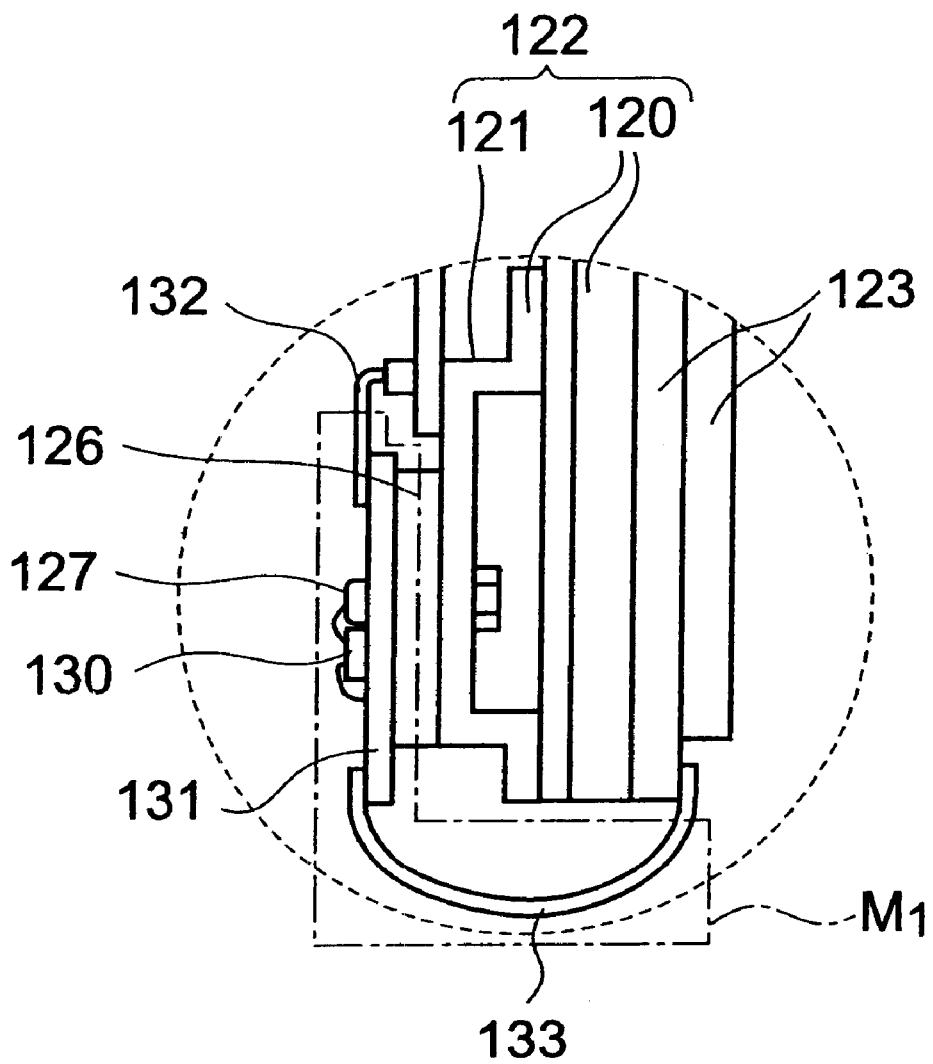
FIG. 6 is a side view showing the fitting state of the driver IC packaging module having the COB structure in the prior art into the flat display device.
Figure 7:
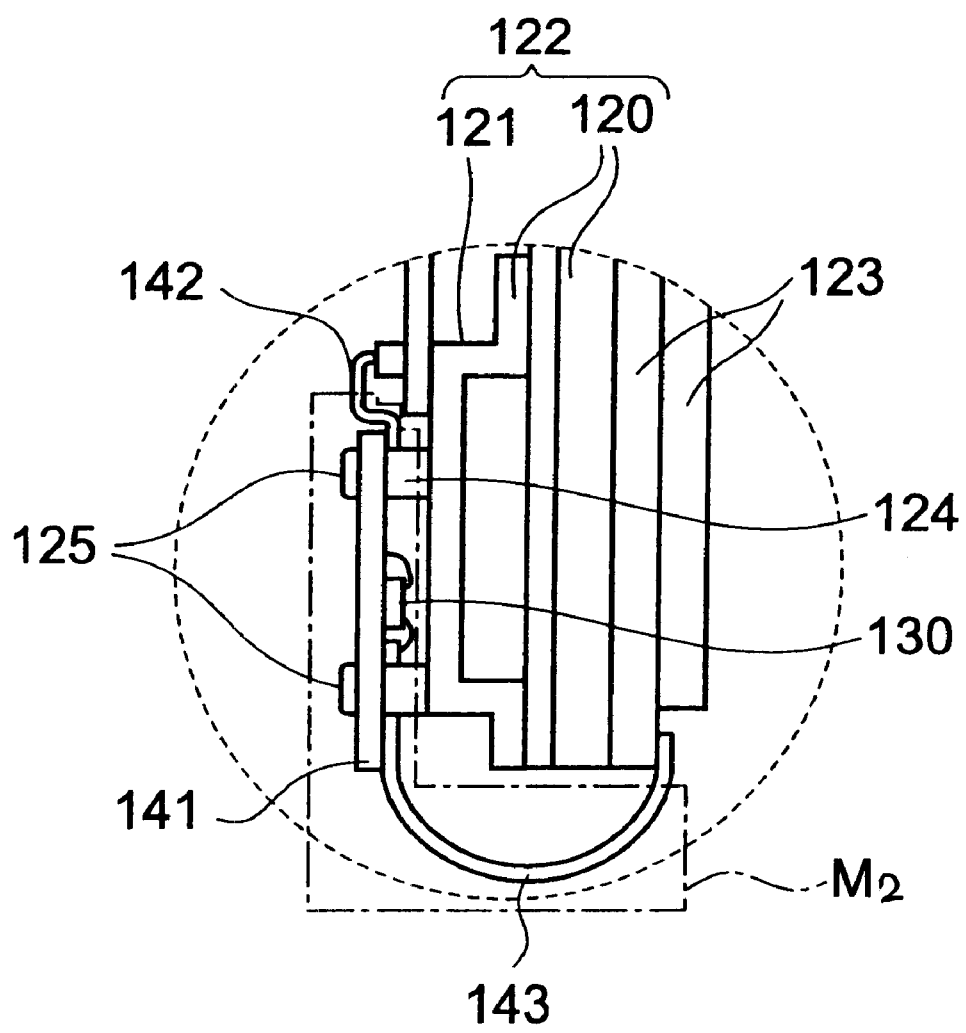
FIG. 7 is a side view showing the fitting state of the driver IC packaging module having the COM structure in the prior art into the flat display device.
Figure 54:
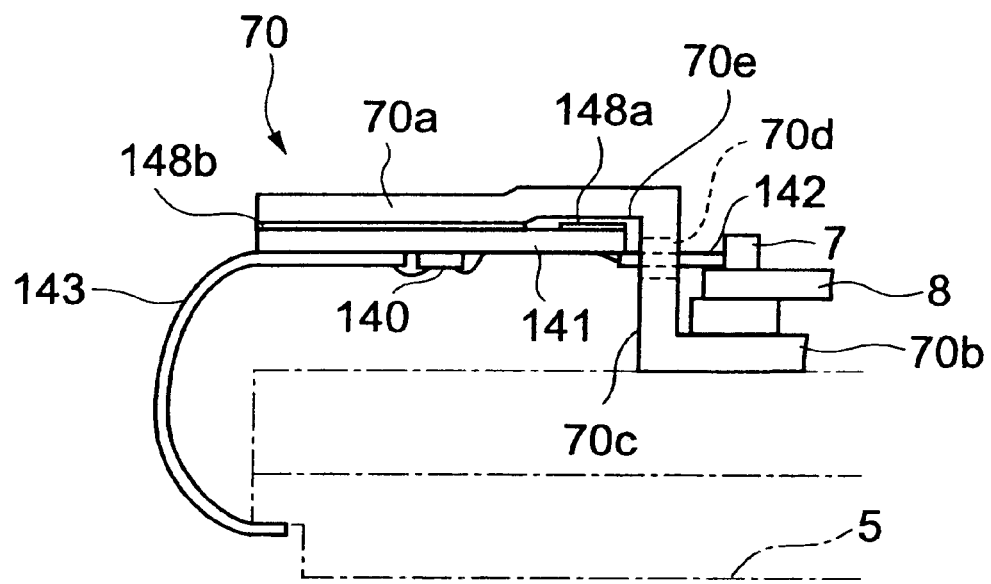
FIG. 54 is a side view showing the fitting state of the driver IC module having the COM structure into a first beam which is fitted onto a chassis of a display device according to a twelfth embodiment of the present invention.
Figure 55:
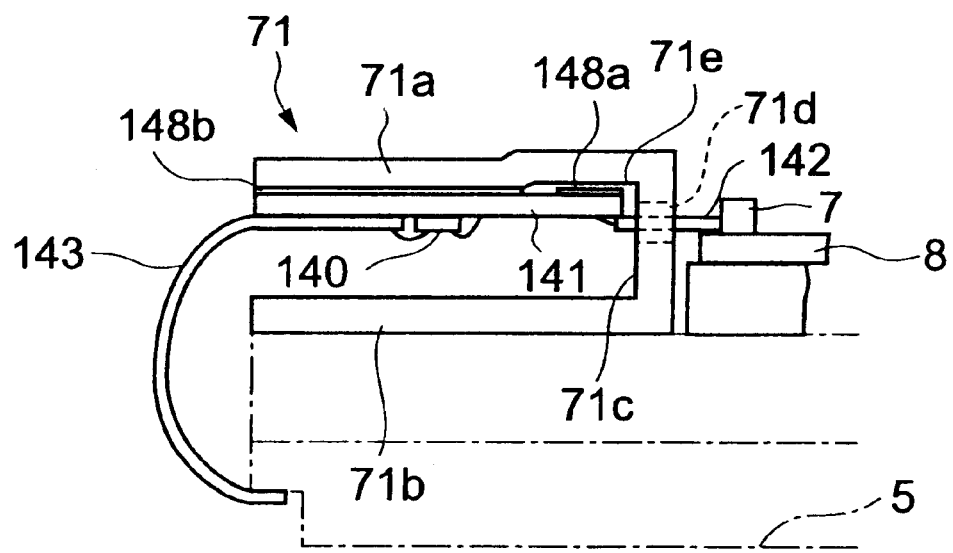
FIG. 55 is a side view showing the fitting state of the driver IC module having the COM structure into a second beam which is fitted onto the chassis of the display device according to the twelfth embodiment of the present invention.
Figure 56:
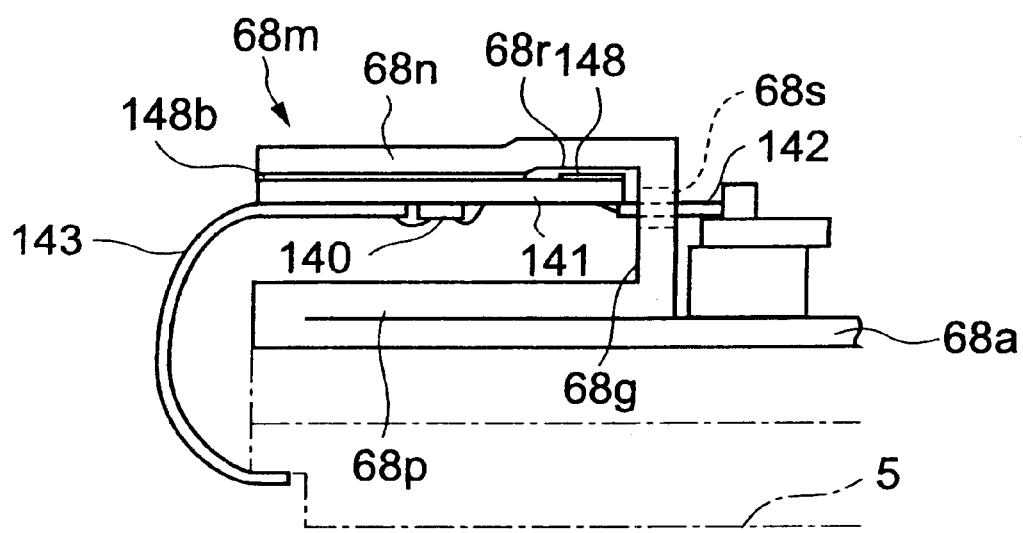
FIG. 56 is a side view showing the fitting state of the driver IC module having the COM structure into a beam which is integrated with the chassis of the display device according to the twelfth embodiment of the present invention.

In contrast, if the driver IC module having the COM structure shown in FIG. 5B is used, either it may be fitted to the back surface of the upper step portion 70a of the Z-shaped beam 70 shown in FIG. 54 or it may be fitted to the back surfaces of the upper surfaces 71a, 72a of the U-shaped beams 71, 72 shown in FIGS. 55 and 56.

The beam 70 shown in FIG. 54 is prepared separately to the chassis 4, 55 shown in FIGS. 10 and 32, and is formed integrally with the chassis 68 by fixing the lower portion 70c to the chassis 4, 55 by the caulking, etc. or by folding side portions of the metal plate 68a constituting the chassis 68 shown in FIG. 42.

In FIG. 54, the beam 70 consists of an upper portion 70a, a lower portion 70b, and a supporting portion 70c for connecting them. Then, the concave portion 70e is formed in the area, which is close to the supporting portion 70c, of the back surface of the upper portion 70a. Then, a printed substrate 141 is fixed to the beam by the screws, etc. in the situation that only an earth pattern 148 shown in FIG. 5B comes into contact to the beam on the back surface of the upper portion 70a. Wirings 148a on the input side of the printed substrate 141 are arranged to face to the concave portions 70e in the non-contact state. Then, the wirings of the FFC 142 are connected to the bus substrate 8 by the connectors 7 via the through holes 70d formed in the supporting portion 70c of the beam 70.

In FIG. 55, the beam 71 consists of an upper portion 71a and a lower portion 71b which oppose to each other at a distance, and a supporting portion 71c for connecting them. Then, the concave portion 71e is formed in the area, which is close to the supporting portion 71c, of the back surface of the upper portion 71a. Then, the printed substrate 141 is fixed to the upper portion 71a of the beam 71 by the screws, etc. in the situation that only an earth pattern 148b shown in FIG. 5B comes into contact to the beam 71 on the back surface of the upper portion 71a. The wirings 148a on the input side of the printed substrate 141 are arranged to face to the concave portions 71e in the non-contact state. Then, the wirings of the FFC 142 are connected to the bus substrate 8 by the connectors 7 via the through holes 71d formed in the supporting portion 71c of the beam 71.

The U-shaped beam 68m shown in FIG. 55 is formed integrally with the chassis 68 by folding side portions of the metal plate 68a constituting the chassis 68 shown in FIG. 42.

The beam 68m consists of an upper portion 68n and a lower portion 68p which oppose to each other at a distance, and a supporting portion 68g for connecting them. Then, the concave portion 68r is formed in the area, which is close to the supporting portion 68g, of the back surface of the upper portion 68n. Then, the printed substrate 141 is fixed to the upper portion 68n of the beam 68m by the screws, etc. in the situation that only the earth pattern 148b shown in FIG. 5B comes into contact to the beam 68m on the back surface of the upper portion 68n. The wirings 148a on the input side of the printed substrate 141 are arranged to face to the concave portions 68r in the non-contact state. Then, the wirings of the FFC 142 are connected to the bus substrate 8 by the connectors 7 via the through holes 68s formed in the supporting portion 68g of the beam 68m.

The heat generated by the driver IC chip 10 mounted on the upper surface of the printed substrate 141 can be radiated to the beam 70, 71 or the beam 68m via the printed substrate 141, the earth pattern 148b, and then the heat transmitted to the beam 70, 71 or the beam 68m can be radiated the chassis 4, 55, 68.

As described above, according to the present invention, in the driver IC packaging module fitted to the flat display device, one end portion, which are connected to the display panel electrodes, of the wirings which are passed through the flexible substrate fitted to an area located in the neighborhood of one end of the driver IC chip mounting surface is exposed in the opposite direction to the driver IC chip mounting surface. Therefore, it is possible to direct the driver IC chip mounting surface to the rear surface side and connect one end portion of the electrodes of the flexible substrate to electrodes on a front surface of the display panel by bending the flexible substrate. As a result, a structure which brings the back surface (surface opposite to the driver IC chip mounting surface) of the module substrate into contact to the surface of the chassis can be achieved easily, the chassis per se can be ready to be utilized as the heat radiation plate for the heat generated by the substrate, and thus a structure of the flat display device which can improve the thermal characteristic of the module and can be installed compactly can be achieved.

Also, according to the present invention, the mechanical strength can be maintained by attaching the beam-like structure to the chassis on the rear surface of the display panel or forming a part of the chassis itself as the beam-like structure, and also the substrate surface of the driver IC packaging module can come into contact into the flat plate surface of this beam-like structure. Therefore, the heat generated from the driver IC chip can be diffused to the chassis via the beam, and thus the built-in packaging structure whose thickness is small and whose thermal characteristic can be improved as a whole can be achieved while holding the original mechanical strength of the chassis as it is.

Particularly, according to the structure in which the chassis is formed of the flat metal plate having a size to cover substantially the overall rear surface side of the panel, because the chassis is formed to have a wide area, such chassis can have the effect as the heat radiation and thermal diffusion plate for not only the heat generated by the driver IC chip but also the heat generated by the display panel and other driver circuit substrates. Therefore, the thermal characteristic of the overall device can be improved and the mechanical strength can be still maintained by attaching the beam. As a result, the thin flat display device having the sufficient mechanical strength can be achieved.

What is claimed is:

1. A driver IC packaging module comprising:
   a driver IC chip for driving of a flat display panel having a display electrode;
   a substrate on which the driver IC chip is mounted;
   a flexible substrate having wirings, on one end of which connection terminals are provided and on other end of which output terminals are provided, to connect electrically at least the display electrode and pads of the driver IC chip; and
   a structure in which the pads of the driver IC chip and the connection terminals of the flexible substrate are connected and both a direction of exposed surfaces of the output terminals of the flexible substrate connected to the display electrode and a direction of mounting surface of a driver IC chip on the substrate are directed oppositely.

2. A driver IC packaging module according to claim 1, wherein the wirings of the flexible substrate have a single layer structure are made of a copper foil sandwiched between insulating films, and respective exposed surfaces of the output terminals and the connection terminals of the wirings are directed mutually in an opposite direction.

3. A driver IC packaging module according to claim 2, wherein at least one of the output terminals and the connection terminals of the flexible substrate is exposed by removing a part of the insulating film by virtue of laser beam machining.

4. A driver IC packaging module according to claim 1, wherein the pads of the driver IC chip and the connection terminals of the flexible substrate are connected by wire bonding.

5. A driver IC packaging module according to claim 1, wherein the wirings of the flexible substrate have a single layer structure in which a copper foil is put between insulating films, respective exposed surfaces of the output terminals and the connection terminals of the wirings are directed mutually in a same direction, and the pads of the driver IC chip are directly connected to the connection terminals of the wirings.

6. A driver IC packaging module according to claim 5, wherein the pads of the driver IC chip and the connection terminals of the wirings are connected by thermocompression bonding via bumps or an anisotropic conductive film, or are connected via conductive adhesive.

7. A driver IC packaging module according to claim 1, wherein the substrate has an insulating substrate formed of insulating material, and at least input signal wirings, low voltage power supply wirings, high voltage power supply wirings or a high voltage -power supply plane, and earth wirings or an earth plane are formed on the insulating substrate.

8. A driver IC packaging module according to claim 7, wherein the input signal wirings, the low voltage power supply wirings, the high voltage power supply wirings or the high voltage power supply plane, and the earth wirings or the earth plane on the insulating substrate are connected to corresponding pads of the driver IC chip by wire bonding respectively.

9. A driver IC packaging module according to claim 7, wherein the input signal wirings, the low voltage power supply wirings, the high voltage power supply wirings or the high voltage power supply plane, and the earth wirings or the earth plane on the insulating substrate are connected to corresponding the pads of the driver IC chip via input wirings formed on an input portion of the flexible substrate respectively.

10. A driver IC packaging module according to claim 1, wherein the substrate is an insulating substrate formed of insulating material, at least high voltage power supply wirings or a high voltage power supply plane, and earth wirings or an earth plane are formed on the insulating substrate, and at least input signal wirings and low voltage power supply wirings are formed on an input side of the flexible substrate.

11. A driver IC packaging module according to claim 10, wherein the flexible substrate have at least one of high voltage terminals for connecting high voltage power supply pads of the driver IC chip to high voltage power supply wirings or a high voltage power supply plane on the insulating substrate, and earth terminals for connecting earth pads of the driver IC chip to earth wirings or an earth plane on the substrate.

12. A driver IC packaging module according to claim 11, wherein high voltage terminals or earth terminals provided on the flexible substrate are connected to high voltage power supply wirings or a high voltage power supply plane or earth wirings or an earth plane on the insulating substrate correspondingly via a thermocompression bonding method using bumps or an anisotropic conductive film, a connecting method using conductive adhesive, soldering, or a pressure welding using a high temperature and a high pressure.

13. A driver IC packaging module according to claim 10, wherein high voltage power supply pads of the driver IC chip and high voltage power supply wirings or a high voltage power supply plane on the insulating substrate, or earth pads of the driver IC chip and earth wirings or an earth plane on the insulating substrate are connected by wire bonding via opening portions provided in the flexible substrate.

14. A driver IC packaging module according to claim 10, wherein the input portion of the flexible substrate has a multi-layered wiring structure, and various wirings are formed as the multi-layered wiring structure.

15. A driver IC packaging module according to claim 1, wherein the substrate is an insulating substrate formed of insulating material, an earth plane having a predetermined size -is formed on a back surface side on which(at least the driver IC chip is mounted.

16. A driver IC packaging module according to claim 1, wherein the back surface side of the insulating substrate in an area containing at least the earth plane is lined with a metal substrate formed of metal material.

17. A driver IC packaging module according to claim 16, wherein the back surface side of the insulating substrate in an area containing at least the earth plane is lined with a metal substrate which is formed of metal material and lines with thermal conductive adhesive or conductive adhesive.

18. A driver IC packaging module according to claim 1, wherein the substrate is a metal substrate formed of metal material, and at least input signal wirings, low voltage power supply wirings, high voltage power supply wirings or a high voltage power supply plane, and earth wirings or an earth plane are formed in an input portion of the flexible substrate.

19. A driver IC packaging module according to claim 18, wherein the input signal wirings, the low voltage power supply wirings, the high voltage power supply wirings or the high voltage power supply plane, and the earth wirings or the earth plane on an input portion of the flexible substrate are connected to corresponding pads of the driver IC chip via a thermocompression bonding method using bumps or an anisotropic conductive film, or a connecting method using conductive adhesive.

20. A driver IC packaging module according to claim 1, wherein the flat display panel is a triple-electrode surface discharge AC plasma display panel.

21. A driver IC packaging module comprising:
   a driver IC chip for driving of a flat display panel having a display electrode;
   a metal substrate on which the driver IC chip is mounted; and
   a flexible substrate for connecting electrically at least output pads of the driver IC chip and the display electrode;
   wherein earth pads of the driver IC chip are electrically connected to a surface of the metal substrate.

22. A driver IC packaging module comprising:
   a driver IC chip for driving of a flat display panel having a display electrode;
   a metal substrate on which the driver IC chip is mounted; and
   a flexible substrate for connecting electrically at least output pads of the driver IC chip and the display electrode;
   wherein earth pads of the driver IC chip are electrically connected to a surface of the metal substrate,
   wherein earth wirings and earth terminals for earth-connecting earth pads of the driver IC chip to a surface of the metal substrate are provided on the flexible substrate, and the earth pads are connected to the surface of the metal substrate via the earth wirings and the earth terminals.

23. A driver IC packaging module comprising:
   a driver IC chip for driving of a flat display panel having a display electrode;
   a metal substrate on which the driver IC chip is mounted; and
   a flexible substrate for connecting electrically at least output pads of the driver IC chip and the display electrode;
   wherein earth pads of the driver IC chip are electrically connected to a surface of the metal substrate,
   wherein the earth pads of the driver IC chip and the surface of the metal substrate are connected by wire bonding via opening portions provided in the flexible substrate.

24. A flat display device comprising:
   a flat display panel on an end surface of which a display electrode is provided;
   a chassis which is fitted onto a back surface of the display panel;
   a beam-like structure provided in parallel with a terminal alignment of the display electrode; and
   a driver IC packaging module having
      a substrate on which a driver IC chip for driving the display electrode is mounted, and
      a flexible substrate extended from the driver IC chip and connected to the display electrode of the display panel;
   wherein a back surface of the substrate of the driver IC package module is brought into contact to the beam-like structure directly or via thermal conductive body.

25. A flat display device according to claim 24, wherein the beam-like structure has a structure which constitutes a part of the chassis.

26. A flat display device according to claim 24, wherein the beam-like structure has a structure which is constructed separately from the chassis.

27. A flat display device according to claim 24, wherein the beam-like structure has a flat end surface at a portion to which the substrate of the driver IC packaging module is fitted and secured.

28. A flat display device according to claim 24, wherein a sectional shape of the beam-like structure has Z-shape, T-shape, hat shape, comb shape, groove shape, square pipe shape, or lip Z-shape.

29. A flat display device according to claim 24, wherein a radiation fin is fitted onto the beam-like structure.

30. A flat display device according to claim 24, wherein the chassis has a metal plate which is adhered to a back surface of the flat display panel.

31. A flat display device according to claim 24, wherein a pattern for earth potential is formed on a back side of the substrate of the driver IC packaging module so as to comes directly into contact to the beam-like structure.

32. A flat display device according to claim 24, wherein the flat display panel is a triple-electrode surface discharge AC plasma display panel, and the driver IC packaging module which is connected to address electrodes of the triple-electrode surface discharge AC plasma display panel has a structure which is secured to the beam-like structure.

\* \* \* \* \*